US010666847B2

(12) United States Patent
Wang et al.

(10) Patent No.: US 10,666,847 B2
(45) Date of Patent: *May 26, 2020

(54) CAMERA MODULE, MOLDED CIRCUIT BOARD ASSEMBLY, MOLDED PHOTOSENSITIVE ASSEMBLY AND MANUFACTURING METHOD THEREOF

(71) Applicant: NINGBO SUNNY OPOTECH CO., LTD., Ningbo, Zhejiang (CN)

(72) Inventors: Mingzhu Wang, Ningbo (CN); Zhenyu Chen, Ningbo (CN); Nan Guo, Ningbo (CN); Takehiko Tanaka, Ningbo (CN); Bojie Zhao, Ningbo (CN); Zilong Deng, Ningbo (CN)

(73) Assignee: Ningbo Sunny Optotech Co., Ltd., Ningbo, Zhejiang (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/157,061

(22) Filed: Oct. 10, 2018

(65) Prior Publication Data
US 2019/0045097 A1 Feb. 7, 2019

Related U.S. Application Data

(63) Continuation of application No. 15/679,151, filed on Aug. 16, 2017, now Pat. No. 10,136,041, which is a
(Continued)

(30) Foreign Application Priority Data

Aug. 1, 2016 (CN) .......................... 2016 1 0622330
Aug. 1, 2016 (CN) .......................... 2016 1 0626667
(Continued)

(51) Int. Cl.
H04N 5/225 (2006.01)
B29C 45/14 (2006.01)
(Continued)

(52) U.S. Cl.
CPC ........... *H04N 5/2257* (2013.01); *B29C 33/44* (2013.01); *B29C 43/18* (2013.01); *B29C 43/36* (2013.01);
(Continued)

(58) Field of Classification Search
CPC ......... B29C 33/44; B29C 43/36; B29C 43/52; B29C 45/0025; B29C 45/14336;
(Continued)

(56) References Cited

U.S. PATENT DOCUMENTS 6,187,243 B1 * 2/2001 Miyajima ......... B29C 45/14655
264/272.15
6,300,169 B1 * 10/2001 Weiblen ................ G01L 19/143
257/E21.504
(Continued)

*Primary Examiner* — Chiawei Chen
(74) *Attorney, Agent, or Firm* — Raymond Y. Chan; David and Raymond Patent Firm

(57) ABSTRACT

A camera module, a molded circuit board assembly, a molded photosensitive assembly and manufacturing method thereof are disclosed. The camera module includes a molded base which is integrally formed with a circuit board through a molding process, wherein a photosensitive element may be electrically connected on the circuit board and at least a portion of a non-photosensitive area portion of the photosensitive element is also connected by the molded base through the molding process. A light window is formed in a central portion of the molded base to provide a light path for the photosensitive element, wherein a cross section of the light window is configured to have a trapezoidal or multi-step trapezoidal shape which has a size increasing from bottom to top to facilitate demoulding and avoiding stray lights.

20 Claims, 36 Drawing Sheets

Related U.S. Application Data continuation of application No. 15/439,909, filed on Feb. 22, 2017, now Pat. No. 10,051,167.

(30) Foreign Application Priority Data

| Aug. 1, 2016 | (CN) | .................. 2016 2 0826033 U |
| Aug. 1, 2016 | (CN) | .................. 2016 2 0826035 U |

(51) Int. Cl.

| B29C 33/44 | (2006.01) |
|---|---|
| G02B 19/00 | (2006.01) |
| G02B 7/10 | (2006.01) |
| B29C 70/72 | (2006.01) |
| B29C 70/88 | (2006.01) |
| G02B 13/00 | (2006.01) |
| H05K 1/02 | (2006.01) |
| H05K 1/18 | (2006.01) |
| H05K 3/28 | (2006.01) |
| B29C 43/18 | (2006.01) |
| B29C 43/36 | (2006.01) |
| B29C 43/52 | (2006.01) |
| G02B 7/02 | (2006.01) |
| B29L 31/34 | (2006.01) |
| B29C 45/40 | (2006.01) |
| B29C 45/00 | (2006.01) |
| B29D 11/00 | (2006.01) |
| B29L 31/00 | (2006.01) |
| B29K 101/12 | (2006.01) |

(52) U.S. Cl.
CPC ........ *B29C 43/52* (2013.01); *B29C 45/14336* (2013.01); *B29C 45/14467* (2013.01); *B29C 45/14655* (2013.01); *B29C 70/72* (2013.01); *B29C 70/88* (2013.01); *G02B 7/022* (2013.01); *G02B 7/10* (2013.01); *G02B 13/0085* (2013.01); *G02B 19/0014* (2013.01); *G02B 19/0076* (2013.01); *H04N 5/2253* (2013.01); *H04N 5/2254* (2013.01); *H05K 1/0274* (2013.01); *H05K 1/181* (2013.01); *H05K 1/185* (2013.01); *H05K 3/284* (2013.01); *B29C 45/0025* (2013.01); *B29C 45/14819* (2013.01); *B29C 45/40* (2013.01); *B29D 11/00807* (2013.01); *B29K 2101/12* (2013.01); *B29K 2995/0003* (2013.01); *B29K 2995/0018* (2013.01); *B29L 2031/3425* (2013.01); *B29L 2031/3437* (2013.01); *B29L 2031/764* (2013.01); *H05K 2201/10121* (2013.01); *H05K 2203/0195* (2013.01); *H05K 2203/1316* (2013.01); *H05K 2203/1327* (2013.01); *Y02P 70/611* (2015.11)

(58) Field of Classification Search
CPC ........ B29C 45/14467; B29C 45/14655; B29C 45/14819; B29C 45/40; B29C 70/72; B29C 70/88; B29D 11/00807; B29K 2101/12; B29K 2995/0003; B29K 2995/0018; B29L 2031/3425; B29L 2031/3437; B29L 2031/764; G02B 13/0085; G02B 19/0014; G02B 19/0076; G02B 7/022; G02B 7/10; H04N 5/2253; H04N 5/2254; H04N 5/2257; H05K 1/0274; H05K 1/181; H05K 1/185; H05K 2201/10121; H05K 2203/0195; H05K 2203/1316; H05K 2203/1327; H05K 3/284; Y02P 70/611

See application file for complete search history.

(56) References Cited

U.S. PATENT DOCUMENTS

| 9,241,097 | B1* | 1/2016 | Tam | .............. H04N 5/2254 |
|---|---|---|---|---|
| 9,998,644 | B1* | 6/2018 | Wang | .............. H05K 5/0073 |
| 10,051,167 | B2* | 8/2018 | Wang | .............. G02B 19/0076 |
| 10,129,451 | B2* | 11/2018 | Wang | .............. G02B 19/0076 |
| 10,136,041 | B2* | 11/2018 | Wang | .............. G02B 19/0076 |
| 10,171,716 | B2* | 1/2019 | Wang | .............. G02B 19/0076 |
| 10,230,879 | B2* | 3/2019 | Wang | .............. G02B 19/0076 |
| 2003/0214021 | A1* | 11/2003 | Zhou | .............. H01L 21/565 |
| | | | | 257/678 |
| 2005/0263312 | A1* | 12/2005 | Bolken | .............. H01L 21/4803 |
| | | | | 174/559 |
| 2006/0024851 | A1* | 2/2006 | Auburger | .............. H01L 31/0203 |
| | | | | 438/15 |
| 2006/0027479 | A1* | 2/2006 | Auburger | .............. H01L 23/3135 |
| | | | | 206/497 |
| 2009/0097139 | A1* | 4/2009 | Minamio | .............. B29C 45/14418 |
| | | | | 359/811 |
| 2009/0243015 | A1* | 10/2009 | Yoneda | .............. H01L 31/0203 |
| | | | | 257/434 |
| 2010/0035373 | A1* | 2/2010 | Hunziker | .............. G01D 3/028 |
| | | | | 438/48 |
| 2011/0194023 | A1* | 8/2011 | Tam | .............. G03B 17/02 |
| | | | | 348/374 |
| 2012/0105713 | A1* | 5/2012 | Luan | .............. H04N 5/2251 |
| | | | | 348/374 |
| 2013/0056257 | A1* | 3/2013 | Chua | .............. H05K 9/0088 |
| | | | | 174/388 |
| 2015/0138436 | A1* | 5/2015 | Wong | .............. H04N 5/2257 |
| | | | | 348/374 |
| 2016/0150133 | A1* | 5/2016 | Suzuki | .............. H04N 5/2252 |
| | | | | 348/376 |
| 2016/0191767 | A1* | 6/2016 | Otani | .............. G02B 7/08 |
| | | | | 348/373 |
| 2016/0368176 | A1* | 12/2016 | Kasai | .............. B29C 33/68 |

* cited by examiner

B

A-A

C-C

C-C

E-E

C-C

A'-A'

B'

A'-A'

C'-C'

D'

C'-C'

E'-E'

CAMERA MODULE, MOLDED CIRCUIT BOARD ASSEMBLY, MOLDED PHOTOSENSITIVE ASSEMBLY AND MANUFACTURING METHOD THEREOF

CROSS REFERENCE OF RELATED APPLICATION

This is a Continuation application that claims the benefit of priority under 35U.S.C. § 120 to a non-provisional application, application Ser. No. 15/679,151, filed Aug. 16, 2017, which is a Continuation application that claims the benefit of priority under 35U.S.C. § 120 to a non-provisional application, application Ser. No. 15/439,909, filed Feb. 22, 2017, that claims priority to China application number CN201610622330.3, filed Aug. 1, 2016, China application number CN201620826033.6, filing date Aug. 1, 2016, China application number CN201610626667.1, filed Aug. 1, 2016, and China application number CN201620826035.5, filed Aug. 1, 2016, which are incorporated herewith by reference in their entities.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to camera modules, and more particularly to a camera module and its molded circuit board assembly and molded photosensitive assembly, and manufacturing method thereof.

Description of Related Arts

A camera module is one of the indispensable components of an intelligent electronic device such as smartphone, camera, computer device, wearable device, and the like. With the continuous development of a variety of intelligent devices and their popularity, the camera module requirements are getting higher and higher.

In recent years, intelligent electronic devices have been developed by leaps and bounds, wherein the growing trend of the intelligent electronic devices is towards thinner and thinner, and the camera modules are required to adapt to such development. The camera module is required to be multi-functional, lightweight and small, so that electronic devices can be thinner while meeting the imaging requirements. Therefore, the camera module manufacturers continuously focus on designing and manufacturing camera modules which meet these requirements.

Molded packaging technology is an emerging packaging technology developed from the conventional COB (Chip on Board) packaging technology. As shown in FIG. 1A of the drawings, the concept of encapsulating a circuit board by a conventional integrated packaging technology is illustrated. In this structure, the encapsulation portion 1 is integrally encapsulated on a circuit board 2 and a photosensitive chip 3, and the electronic components on the circuit board and the lead wires for electrically connecting the chip and the circuit board are covered, so that the occupied space of the electronic components is reduced, the size of the camera module can be reduced, and the problem that the dust attached to the electronic component affecting the image quality of the camera module is solved.

Compared with the conventional holder-type COB packaging technology, this packaging technology has more advantages in theory. However, in a period of time, this packaging technology only stays in the theoretical or manual experimental stages, and fails to achieve very good and practical implement that has not been put into actual production for quantitative production. The reasons are following aspects.

Firstly, although the integral packaging technology in other large industrial areas such as semiconductor is a well-known technology, in the field of camera module, it is a new application. Different industries need to mold different objects with different problems. For example, the body of a smartphone becomes thinner and thinner, so that the thickness of the smartphone becomes thinner and thinner too. As a result, camera modules are also required to have such a relatively thin thickness, so that the overall thickness of the phone will not increase because of the camera modules. It is understandable that components of the camera module are manufactured in a relatively small size, so that the ideal structure of the camera module cannot be produced by conventional methods. In the above-described configuration, it is usually necessary to form a through-hole, which is usually designed to have a square shape extended vertically, in the encapsulation portion 1 to provide a light path for the photosensitive chip 3 on the circuit board 2. Theoretically speaking, this conceptual structure does not have much substantial defects, but it does fail to take various mass production factors into account. In other words, this technology is only in the manual test stage instead of being developed to be applied in actual mass production. More specifically, a molding mould is generally needed in the packaging technology, as shown in FIG. 1B and FIG. 1C of the drawings, wherein when a molding block 4 of an upper mould of the molding mould is in cubic shape, during a molding process, at the contacting position of the upper mould and the encapsulation portion 1, the upper mould may adversely affect the shape of the encapsulation portion 1, as the bottom of the upper mould is in sharp square shape, while the mould is detaching from the molding material and causes deformation of the encapsulation portion 1 such as forming flashes. In addition, when the upper mould is being pulled out and drafted away from the encapsulation portion 1, an outer side surface of the molding block 4 of the upper mould and the encapsulation portion 1 have a large frictional force therebetween that may cause damages to the encapsulation portion 1. The effect is likely to be negligible in an industry of molding a product with relatively large size, but in the camera module field which has a small size in precise configuration, it becomes a critical factor. Therefore, the vertical prismatic column shaped through-hole structure is feasible in theory but is not suitable for mass productions in practice.

Secondly, a camera module is an optical electronic device and light capturing is an important factor to determine the image quality. As shown in FIG. 1D of the drawings, in the conventional holder assembling manner, the holder 5 mounted on the circuit board is required to reserve a mounting space 6 for the electronic components. The mounting space 6 forms an indent space and increases the size of the camera module. However, after the light is captured, very little incident light will directly project to the inner wall of the holder, so that there is less being reflected from the inner wall of the holder that will not affect the imaging quality. As shown in FIG. 1E of the drawings, in comparison with the structure of the holder that no incident light through the lens with an incident angle is reflected by the holder, when the holder is replaced by the conventional cubic shaped encapsulation portion 1, the integral package structure causes the inner wall of the encapsulation portion 1 reflecting the incident light to the photosensitive chip 3 easily, that results in increasing the influence of stray light so that the imaging quality of the camera module is degraded. Accordingly, in the aspect of the optical imaging quality, such rectangular shaped through-hole configuration formed in encapsulation portion 1 is not suitable for utility application.

In addition, in order to assemble the encapsulation portion 1 into a camera module, it is necessary to mount a lens or a motor on the encapsulation portion 1, so that the encapsulation portion 1 is needed to meet a certain structural strength. Therefore, the shape of the encapsulation portion 1 is required to be designed in regard to various factors, including but not limited to the light flux, structural strength, light reflectivity, ease of demoulding, and damage prevention during demoulding. However, the structure of the conventional encapsulation portion 1 apparently failed to encounter all such factors under consideration.

SUMMARY OF THE PRESENT INVENTION

The invention is advantageous in that it provides a camera module and its molded circuit board assembly and manufacturing method thereof, wherein the camera module comprises the molded circuit board assembly made by means of molding technology, wherein the molded circuit board assembly is adapted for large-scale mass production by molding moulds through molding process.

Another advantage of the invention is to provide a camera module and its molded circuit board assembly and manufacturing method thereof, wherein the molded circuit board assembly comprises a circuit board and a molded base integrally formed on the circuit board, wherein the molded base forms a light window, which is not a prismatic column shape of the prior art, so that in a manufacturing process, the damage to the molded base by a light window forming block of a molding mould is reduced, and it is convenient to remove the light window forming block.

Another advantage of the invention is to provide a camera module and its molded circuit board assembly and manufacturing method thereof, wherein at least one portion of the molded base integrally extended from the circuit board and an optical axis direction form a first inclination angle which is an acute angle and is benefit for demoulding of the molded base. In which, after the molded base is formed by the molding process, the light window forming block is able to be smoothly pulled out to reduce friction with the molded base so that said molded base is remained unchanged to reduce the influence of the removal of the light window forming block.

Another advantage of the invention is to provide a camera module and its molded circuit board assembly and manufacturing method thereof, wherein at least one portion of the inner side surface of the molded base integrally extended from the top surface of the circuit board and the optical axis form an angle which is defined as a first inclination angle, so that the light incident on the inner side surface is less likely to reach the photosensitive element, and the influence of the stray light on the image quality is reduced.

Another advantage of the invention is to provide a camera module and its molded circuit board assembly and manufacturing method thereof, wherein at least one outer side surface of the molded base and the optical axis form an angle which is an acute angle and is defined as a second inclination angle, wherein when the molded base is manufactured by the molding mould and the dividing blocks of the molding mould are detached at the outside of the molded base, the friction between the dividing blocks of the molding mould and the outer side surface of the molded base is remained unchanged such that the dividing blocks of the molding mould are easy to demould and remove.

Another advantage of the invention is to provide a camera module and its molded circuit board assembly and manufacturing method thereof, wherein the inner side of the molded base successively has a first portion inner side surface inclined from the circuit board, a second portion inner side surface extending from the first portion inner side surface, and a third portion inner side surface aslant extending from the second portion inner side surface, wherein the third portion inner side surface and the optical axis form an angle which is an acute angle and is defined as a third inclination angle, so that when the light window forming block of the molded base is removed, the friction between the base portion of the light window forming block and the inner side of the top end of the molded base is reduced, and thus the second portion inner side surface of the molded base is remained unchanged such that the dividing blocks of the molding mould are easy to demould and remove.

Another advantage of the invention is to provide a camera module and its molded circuit board assembly and manufacturing method thereof, wherein the first inclination angle is in a predetermined range to facilitate pulling out the molded base without damaging the molded base.

Another advantage of the invention is to provide a camera module and its molded circuit board assembly and manufacturing method thereof, wherein the bottom side of the molding mould is generally provided with an elastic film layer and the inclination angles are not right-angles so as to prevent piercing through the film layer.

Another advantage of the invention is to provide a camera module and its molded circuit board assembly and manufacturing method thereof, wherein the molded base has a top side surface and the first, second and third inclination angles are restricted within predetermined ranges respectively to facilitate the removal of the light window forming block and the dividing blocks, so that the size of the top side surface is not too small to provide a firm mounting area for a lens actuator or a lens of the camera module.

Another advantage of the invention is to provide a camera module and its molded circuit board assembly and manufacturing method thereof, wherein the first, second and third inclination angles are restricted within predetermined ranges respectively to facilitate the removal of the light window forming block and to provide a firm mounting area for an optical filter or an optical filter holder of the camera module.

Another advantage of the invention is to provide a camera module and its molded circuit board assembly and manufacturing method thereof, wherein the molded base forms a sloped light window, which increases light flux and meets the requirements of the field of view and angular incidence of the photosensitive element.

Another advantage of the invention is to provide a camera module and its molded circuit board assembly and manufacturing method thereof, wherein each of the demould angles is provided with a predetermined angular range that secures the structural strength and the light reflectance of the molded base and reduces demould friction.

Another advantage of the invention is to provide a camera module and its molded photosensitive assembly and manufacturing method thereof, wherein the camera module comprises the molded photosensitive assembly which is capable of enabling a large-scale quantity production by a molding mould through a molding process.

Another advantage of the invention is to provide a camera module and its molded photosensitive assembly and manufacturing method thereof, wherein the molded photosensitive assembly comprises a circuit board, a photosensitive element and a molded base integrally formed on the circuit board and the photosensitive element, wherein the molded base forms a light window which is not a prismatic column shape of the prior art, so that in a manufacturing process, the damage to the molded base by a light window forming block of a molding mould is reduced, and it is convenient to draft out the light window forming block.

Another advantage of the invention is to provide a camera module and its molded photosensitive assembly and manufacturing method thereof, wherein at least one portion of the molded base integrally extended from the photosensitive element and an optical axis direction form a first inclination angle which is an acute angle and is benefit for demoulding of the molded base, wherein after the molded base is formed by the molding process, the light window forming block is able to be smoothly pulled out to reduce friction with the molded base so that the molded base is remained unchanged to reduce the influence when detaching the light window forming block.

Another advantage of the invention is to provide a camera module and its molded photosensitive assembly and manufacturing method thereof, wherein at least one inner side surface of the molded base integrally extended from the top surface of the photosensitive element and the optical axis form an angle which is defined as a first inclination angle, so that the light incident on the inner side surface is less likely to reach the photosensitive element, and the influence of the stray light on the image quality is reduced.

Another advantage of the invention is to provide a camera module and its molded photosensitive assembly and manufacturing method thereof, wherein at least one outer side surface of the molded base and the optical axis form an angle which is an acute angle and is defined as a second inclination angle, wherein when the molded base is manufactured by the molding mould and the dividing blocks of the molding mould are detached from on outside of the molded base, the friction between the dividing blocks of the molding mould and the outer side surface of the molded base is remained unchanged such that the dividing blocks of the molding mould are easy to pull out.

Another advantage of the invention is to provide a camera module and its molded photosensitive assembly and manufacturing method thereof, wherein the inner side of the molded base successively has a first portion inner side surface inclined from the photosensitive element, a second portion inner side surface extended from the first portion inner side surface, and a third portion inner side surface inclined from the second portion inner side surface, wherein the third portion inner side surface and the optical axis form an angle which is an acute angle and is defined as a third inclination angle, so that when the light window forming block of the molded base is pulled out, the friction between the base portion of the light window forming block and the inner side of the top portion of the molded base is reduced, so that the second portion inner side surface of the molded base is remained unchanged such that the molding mould is easy for detachment.

Another advantage of the invention is to provide a camera module and its molded photosensitive assembly and manufacturing method thereof, wherein the first inclination angle is in a predetermined range to facilitate pulling out the molded base without damaging the lead wires connecting the photosensitive element and the circuit board.

Another advantage of the invention is to provide a camera module and its molded photosensitive assembly and manufacturing method thereof, wherein the bottom side of the molding mould is generally provided with an elastic film layer and the inclination angles are not right-angles so as to prevent piercing through the film layer.

Another advantage of the invention is to provide a camera module and its molded photosensitive assembly and manufacturing method thereof, wherein the molded base has a top side surface and the first, second and third inclination angles are restricted within predetermined ranges respectively to facilitate the removal of the light window forming block and the dividing blocks, so that the size of the top side surface is not too small to provide a firm mounting area for a lens actuator or a lens of the camera module.

Another advantage of the invention is to provide a camera module and its molded photosensitive assembly and manufacturing method thereof, wherein the first, second and third inclination angles are restricted within predetermined ranges respectively to facilitate removal of the light window forming block and to provide a firm mounting area for an optical filter or an optical filter holder of the camera module.

Another advantage of the invention is to provide a camera module and its molded photosensitive assembly and manufacturing method thereof, wherein the molded base forms a sloped light window which increases the light flux and meets the requirements of the field of view and angular incidence of the photosensitive element.

Another advantage of the invention is to provide a camera module and its molded photosensitive assembly and manufacturing method thereof, wherein each of the draft angles is provided with a predetermined angular range so as to secure a structural strength and a small light reflectance of the molded base and reduce the demoulding friction.

Additional advantages and features of the invention will become apparent from the description which follows, and may be realized by means of the instrumentalities and combinations particularly pointing out in the appended claims.

According to one aspect of the present invention, the present invention provides a molded circuit board assembly, for a camera module, comprising at least one circuit board, and at least one molded base integrally formed with the circuit board through a molding process, wherein the molded base forms at least one light window which provides a light path for a photosensitive element of the camera module, and at least one portion of an inner side surface of the molded base which is integrally extended form the circuit board is aslant extended.

According to another aspect of the present invention, the present invention provides a molded photosensitive assembly, for a camera module, comprising at least one circuit board, at least one photosensitive element, and at least one molded base integrally formed with the circuit board and the photosensitive element through a molding process, wherein the molded base forms at least one light window disposed corresponding to the photosensitive element, and at least one portion of an inner side surface of the molded base integrally extended form the photosensitive element is aslant extended for easy demoulding in the molding process.

According to another aspect of the present invention, the present invention provides a camera module comprising at least one lens, at least one photosensitive element, at least one circuit board, and at least one molded base, wherein the molded base is integrally formed with the circuit board through a molding process, wherein the molded base forms at least one light window which provides a light path for the photosensitive element, wherein the molded base has an inner side surface, and at least one portion of the inner side surface is aslant extended for easy demoulding in the molding process. Accordingly, when the circuit board and the molded base form a molded circuit board assembly, the inner side surface of the molded base is integrally extended from the circuit board, wherein when the molded base is integrally formed with the circuit board and the photosensitive element to form a molded photosensitive assembly, the inner side surface of the molded base is integrally extended from the photosensitive element.

According to another aspect of the present invention, the present invention provides an electronic device comprising one or more camera modules and the electronic device can be, but not limited to, a mobile phone, a computer, a television, an intelligent wearable equipment, a transportation tool, a camera, and a monitoring device.

According to another aspect of the present invention, the present invention provides a molding mould, for manufacturing at least one molded circuit board assembly of a camera module, comprising a first mould and a second mould, wherein when the first mould and the second mould are united to form a molding chamber therebetween, wherein at least one light window forming block and a base forming guide groove disposed around the light window forming block are provided in the molding chamber of the molding mould, wherein when at least one circuit board is mounted in the molding chamber, a molding material filled in the base forming guide groove is solidified from a liquid state to a solid state under temperature control, wherein a molded base is formed at a position corresponding to the base forming guide groove and a light window of the molded base is formed at a position corresponding to the light window forming block, wherein the molded base is integrally molded on the circuit board so as to form the molded circuit board assembly of the camera module. A cross section of the light window forming block is configured to have a trapezoidal or multi-step trapezoidal shape which has diameters increasing from bottom to top to facilitate demoulding.

According to another aspect of the present invention, the present invention provides a molding mould, for manufacturing at least one molded photosensitive assembly of a camera module, comprising a first mould and a second mould, wherein when the first mould and the second mould are united to form a molding chamber therebetween, wherein at least one light window forming block and a base forming guide groove disposed around the light window forming block are provided in the molding chamber of the molding mould, wherein when at least one circuit board electrically connected with at least one photosensitive element is mounted in the molding chamber, a molding material filled in the base forming guide groove is solidified from a liquid state to a solid state under a temperature control, wherein a molded base is formed at a position corresponding to the base forming guide groove and a light window of the molded base is formed at a position corresponding to the light window forming block, wherein the molded base is integrally molded on the circuit board and at least one portion of a non-photosensitive area portion of the photosensitive element so as to form the molded photosensitive assembly of the camera module. A cross section of the light window forming block is configured to have a trapezoidal or multi-step trapezoidal shape which has diameters increasing from bottom to top to facilitate demoulding.

According to another aspect of the present invention, the present invention provides an integral piece of molded circuit board assembly array which comprises an integral piece of circuit board array and an integral piece of molded base array, wherein the integral piece of circuit board array comprises a plurality of circuit boards, wherein the integral piece of molded base array comprises a plurality of molded bases integrally formed with the plurality of the circuit boards respectively through a molding process, wherein each of the molded bases forms at least one light window which provides a light path for a photosensitive element of the camera module, and at least one portion of an inner side surface of the molded base which is integrally extended form the circuit board is aslant extended for facilitating easy demoulding of a molding mould in the molding process.

According to another aspect of the present invention, the present invention provides an integral piece of molded photosensitive assembly array which comprises an integral piece of circuit board array and an integral piece of molded base array, wherein the integral piece of circuit board array comprises a plurality of circuit boards, wherein each of the circuit boards is electrically connected with at least one photosensitive element, wherein the integral piece of molded base array comprises a plurality of molded bases integrally formed with the plurality of the circuit boards and the photosensitive elements respectively through a molding process, wherein each of the molded base forms at least one light window which provides a light path for the corresponding photosensitive element of the camera module, and at least one portion of an inner side surface of the molded base which is integrally extended form the photosensitive element is aslant extended for facilitating easy demoulding of a molding mould in the molding process.

According to another aspect of the present invention, the present invention provides a method for manufacturing a molded circuit board of a camera module, comprising the following steps.

(a) Place at least one circuit board in a second mould of a molding mould.

(b) Fill a liquid molding material into at least one base forming guide groove when the second mould and a first mould are in a closed-mould position, wherein a position corresponding to at least one light window molding block of the first mould is prevented from filling in the liquid material, wherein the base forming groove is disposed around the light window molding block.

(c) Solidify the molding material filled into the base forming guide groove from a liquid state to a solid state.

(d) Demould the first mould from the second mould, wherein a cross section of the light window forming block is configured to have a trapezoidal or multi-step trapezoidal shape which has diameters increasing from bottom to top to facilitate demoulding, wherein a molded base is formed at a position corresponding to said base forming guide groove, wherein a light window of the molded base is formed at a position corresponding to the light window molding block, wherein the molded base is integrally molded on the circuit board so as to form the molded circuit board of the camera module.

According to another aspect of the present invention, the present invention provides a method for manufacturing a molded photosensitive assembly of a camera module, comprising the following steps.

(A) Place at least one circuit board with a photosensitive element electrically provided thereon in a second mould of a molding mould.

(B) Fill a liquid molding material into at least one base forming guide groove when the second mould and a first mould are in a closed-mould position, wherein a position corresponding to at least one light window molding block of the first mould is prevented from filling in the liquid material, wherein the base forming groove is disposed around the light window molding block.

(C) Solidify the molding material filled into the base forming guide groove from a liquid state to a solid state.

(D) Demould the first mould from the second mould, wherein a cross section of the light window forming block is configured to have a trapezoidal or multi-step trapezoidal shape which has diameters increasing from bottom to top to facilitate demoulding, wherein a molded base is formed at a position corresponding to said base forming guide groove, wherein a light window of the molded base is formed at a position corresponding to the light window molding block, wherein the molded base is integrally molded on the circuit board and the photosensitive element, so as to form the molded photosensitive assembly of the camera module.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

Figure 1A:
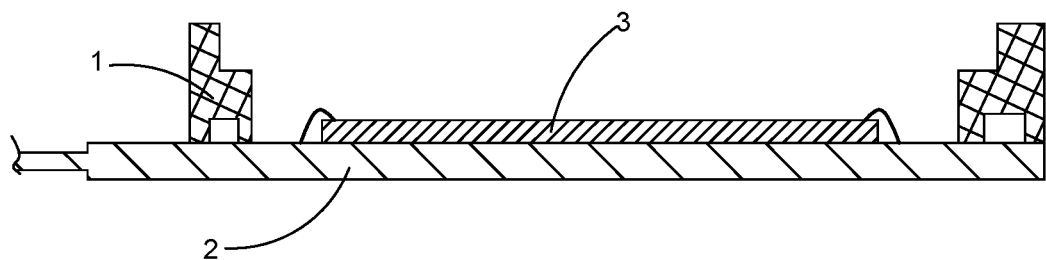
FIG. 1A is a schematic view of a conventional molded photosensitive assembly manufactured by a conventional encapsulation technology.

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Those skilled in the art should understand that, in the disclosure of the present invention, terminologies of "longitudinal," "lateral," "upper," "front," "back," "left," "right," "perpendicular," "horizontal," "top," "bottom," "inner," "outer," and etc. that indicate relations of directions or positions are based on the relations of directions or positions shown in the appended drawings, which are only to facilitate descriptions of the present invention and to simplify the descriptions, rather than to indicate or imply that the referred device or element is limited to the specific direction or to be operated or configured in the specific direction. Therefore, the above-mentioned terminologies shall not be interpreted as confine to the present invention.

It is understandable that the term "a" or "an" should be understood as "at least one" or "one or more". In other words, in some embodiments, the number of an element can be one and in other embodiment the number of the element can be more than one. The term "a" or "an" is not construed as a limitation of quantity.

Referring to FIG. 1 to FIG. 9 of the drawings, a camera module 100 according to a first preferred embodiment of the present invention is illustrated. The camera module 100 can be applied to various electronic devices, such as smart phone, wearable device, computer equipment, television, vehicle, camera, monitoring device, and etc., wherein the electronic devices disclosed above are exemplary only and not intended to be limiting. The camera module 100 is equipped with an electronic device to perform image acquisition and reproduction of a target object.

More specifically, a molded circuit board assembly 10 of the camera module 100 and a manufacturing equipment 200 for the camera module 100 are illustrated according to the first preferred embodiment of the present invention. The molded circuit board assembly 10 comprises a circuit board 11 and a molded base 12. Wherein the molded base 12 of the present invention is integrally packaged and molded on the circuit board 11 by the manufacturing equipment 200, wherein the molded base 12 is capable of substitute the conventional holder or support of the conventional camera module which is generally adhered to the circuit board by the conventional packaging process by means of glue.

The camera module 100 further comprises a lens 30 and a photosensitive element 13. Wherein the molded base 12 comprises an annular molding body 121 and has a light window 122 defined in a middle of the molding body 121 to provide a light path between the lens 30 and the photosensitive element 13. The photosensitive element 13 is operatively and electrically connected to the circuit board 11. For example, the photosensitive element 13 is connected to the circuit board 11 by lead wires through a COB process, and the photosensitive element 13 is positioned on a top side of the circuit board 11. The photosensitive element 13 and the lens 30 are respectively assembled on two sides of the molded base 12 and are optical aligned in such a manner that the light passing through the lens 30 is able to reach the photosensitive element 13 via the light window 122, so that the camera module 100 is able to produce an optical image through a photoelectric conversion process.

Figure 3A:
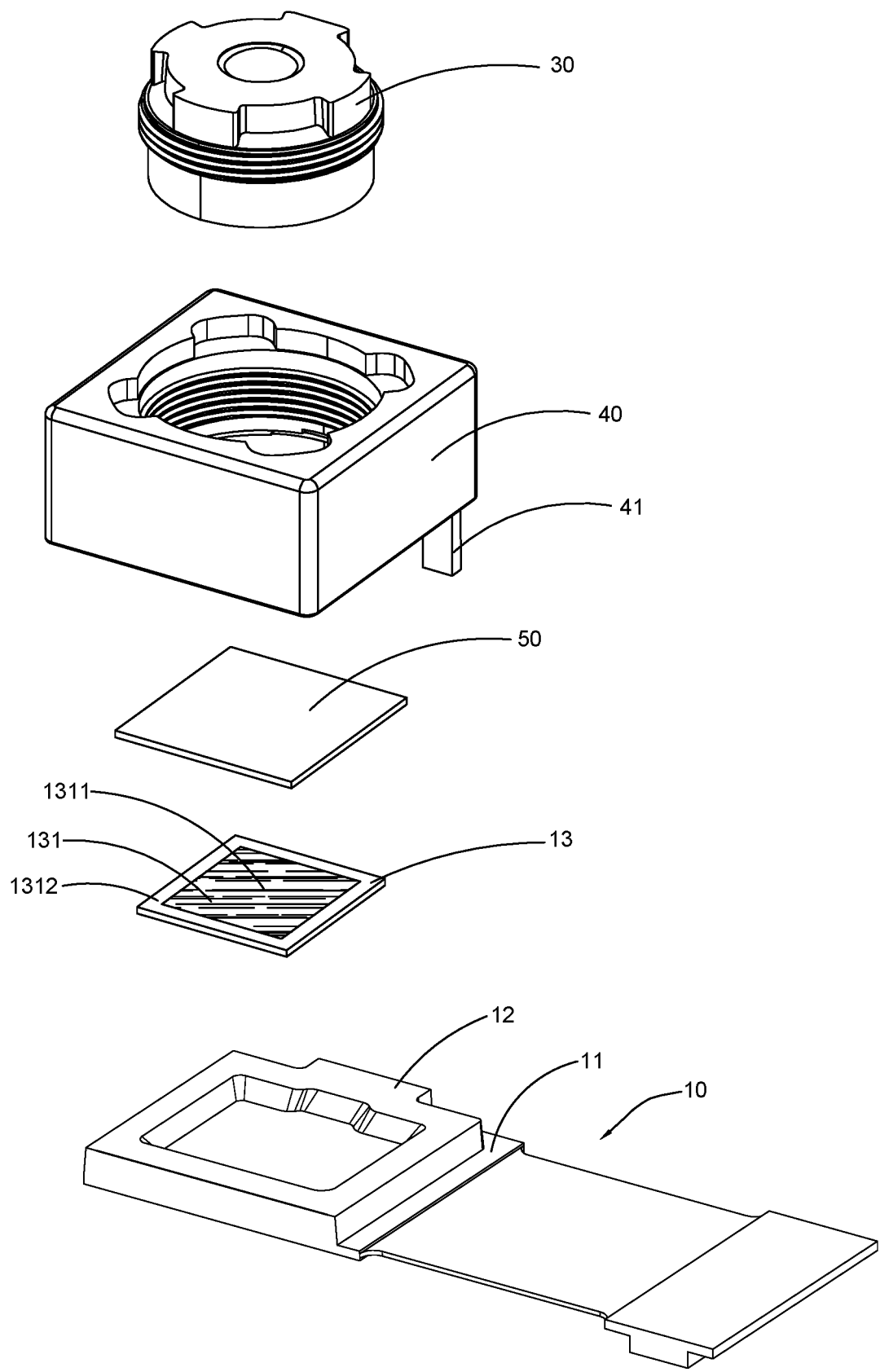
FIG. 3A is an exploded perspective view of the camera module according to the above first preferred embodiment of the present invention.
Figure 3B:
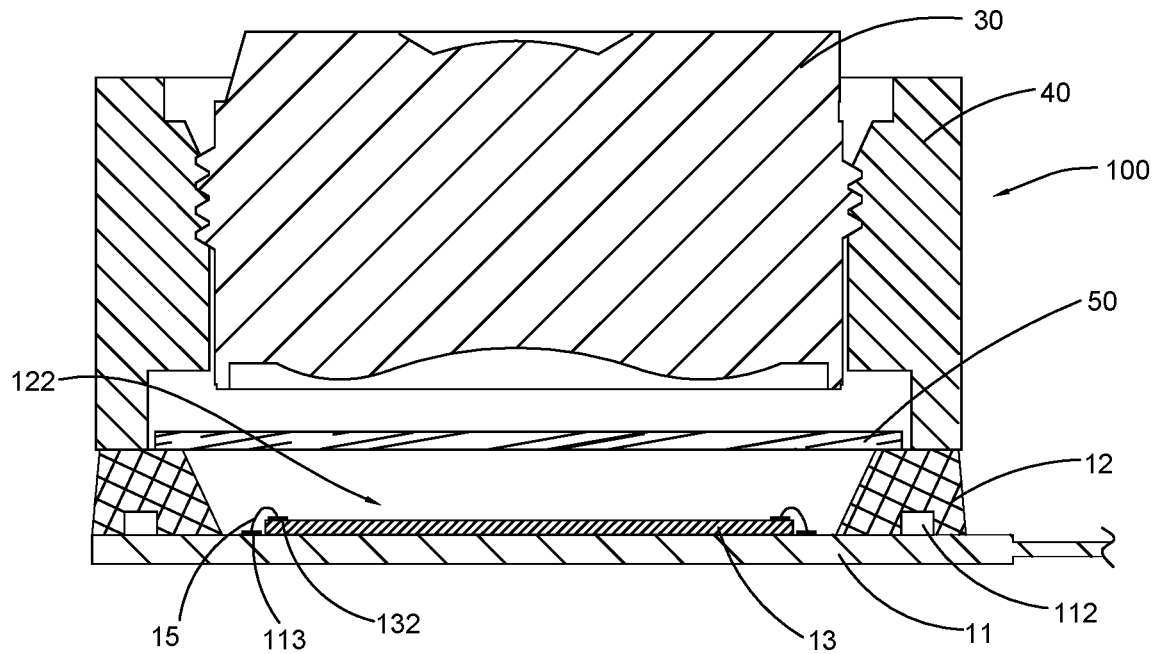
FIG. 3B is a cross-sectional view of the camera module along an axial direction according to the above first preferred embodiment of the present invention.
Figure 4:
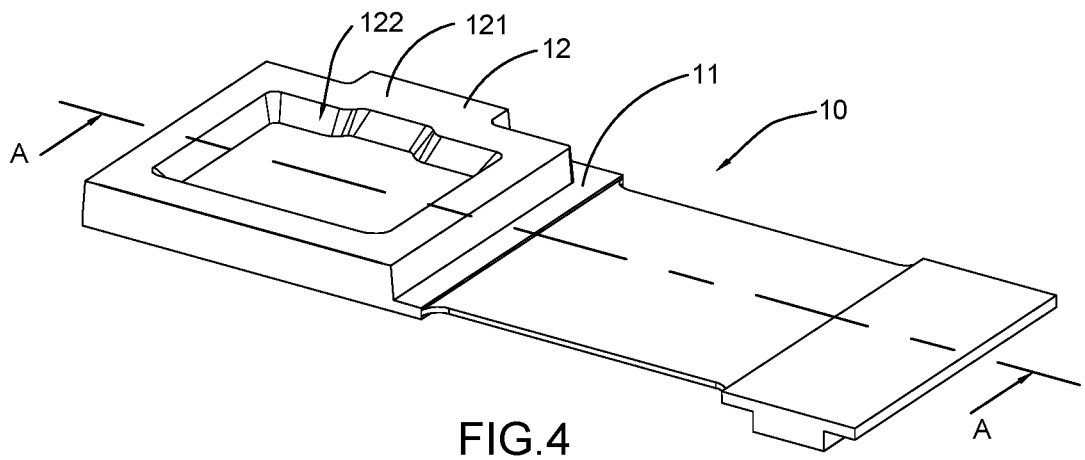
FIG. 4 is a perspective view of the molded circuit board assembly according to the above first preferred embodiment of the present invention.

As shown in FIG. 3A and FIG. 3B of the drawings, the camera module 100 which is embodied as an automatic-focus camera module further comprises a lens actuator 40 such as voice coil motor and piezoelectric motor, wherein the lens 30 is mounted in the lens actuator 40. The molded base 12 supports the lens actuator 40. An optical filter 50 which can be an infrared cut-off filter is provided on a top side of the molded base 12 to filter lights which pass through the lens 30. The automatic-focus camera module in this embodiment of the present invention as shown in the drawings and described above is exemplary only and not intended to be limiting. In other embodiment of the present invention, the lens 30 can be mounted on the molded circuit board assembly 10 without the lens actuator 40. In other words, the camera module 100 can be a fixed focus camera module, one skilled in the art will understand that the type of the camera module is not intended to be limiting and the camera module 100 can be a fixed focus camera module or an automatic-focus camera module.

The circuit board 11 comprises a base board 111 and a plurality of electronic components 112. The plurality of electronic components 112 is formed on the base board 111 using a technology such as the surface mount technology. The electronic components 112 include but are not limited to resistors, capacitors, and other device drivers. In this embodiment of the invention, the molded base 12 is integrally coated on the electronic components 112 to further prevent objects such as dusts and debris of a conventional camera module from adhering to the electronic components 112 to further pollute the photosensitive element 13 that affects the imaging results. It is understandable that, in an alternative mode of the embodiment, the electronic components 112 are buried in the base board 111 that, in other words, the electronic components 112 are not exposed to outside. The base board 111 of the circuit board 11 can be a rigid PCB, a flexible PCB, a rigid-flex PCB or a ceramic substrate. It is worth mentioning that in this preferred embodiment of the present invention, since the molded base 12 is integrally molded on the electronic components 112, the electronic components 112 are able to be not buried in the base board 111. The base board 111 is used to form electric conductive lines, so that the finally obtained molded circuit board assembly 10 has a smaller thickness.

In this preferred embodiment of the present invention, the photosensitive element 13 is overlapped on a flat overlapping region of the circuit board 11 which is at an inner side of the electronic components 112. The photosensitive element 13 has a top surface 131. The top surface 131 has a photosensitive area portion 1311 in the center thereof and a non-photosensitive area portion 1312 positioned around the photosensitive area portion 1311. The photosensitive element 13 is electrically conducted to the circuit board 11 by lead wires 15. More specifically, the photosensitive element 13 has a photosensitive element connecting pad 132 and the circuit board 11 has a circuit board connecting pad 113. Two ends of the lead wires 15 are electrically connected to the photosensitive element connecting pad 132 and the circuit board connecting pad 113 respectively.

Figure 2:
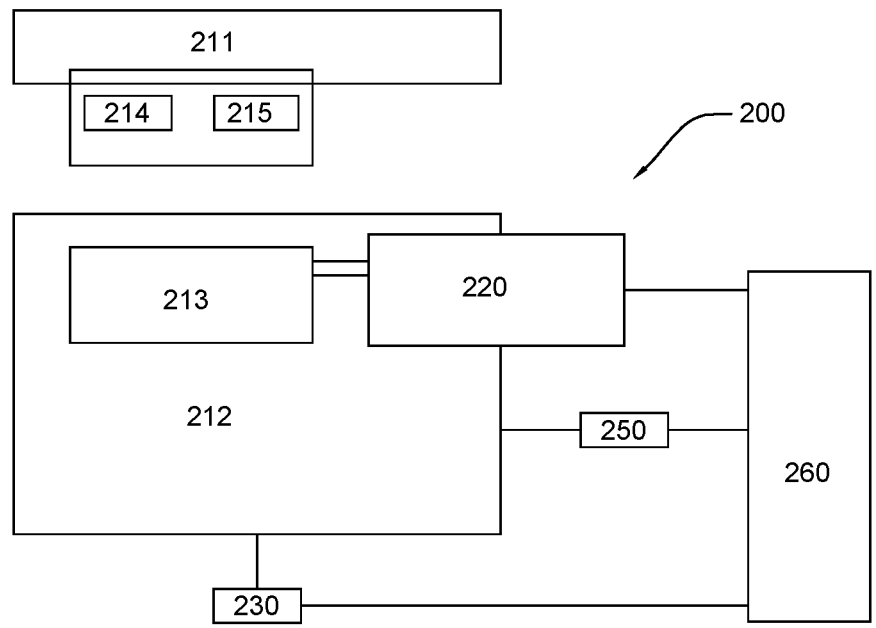
FIG. 2 is a schematic diagram illustrating a molded circuit board assembly of a camera module according to a first preferred embodiment of the present invention.

Furthermore, as shown in FIG. 2 of the drawing, the manufacturing equipment 200 for the molded circuit board assembly 10 of the camera module 100 comprises a molding mould 210, a molding material feeding mechanism 220, a mould fixing unit 230, a temperature control unit 250, and a controller 260. The molding material feeding mechanism 220 supplies a molding material 14 to a base forming guide groove 215 of the molding mould 210. The mould fixing unit 230 is operated to control an opened-mould position and a closed-mould position of the molding mould 210. The temperature control unit 250 is operated to heat or cool the molding material 14. The controller 260 automatically controls operations of the molding material feeding mechanism 220, the mould fixing unit 230 and the temperature control unit 250 in the molding process.

The molding mould 210 comprises a first mould 211 and a second mould 212. The first mould 211 and the second mould 212 are able to be operated between an opened-mould position and a closed-mould position under control of the mould fixing unit 2°. In other words, the mould fixing unit 230 enables to separate the first mould 211 and the second mould 212 to open the molding mould 210 and to close the first mould 211 and the second mould 212 to define a molding chamber 213 between the first mould 211 and the second mould 212. When the molding mould 210 is in the closed-mould position, the circuit board 11 is placed and fixed within the molding chamber 213 and the liquid molding material 14 enters into the molding chamber 213 and is integrally molded on the circuit board 11 to from the molded base 12 which is integrally molded on the circuit board 11 after solidifications.

More specifically, the molding mould 210 further comprises a light window forming block 214 and the base forming guide groove 215 formed around the light window forming block 214. When the first mould 211 and the second mould 212 are in the closed-mould position, the light window forming block 214 and the base forming guide groove 215 are extended inside of the molding chamber 213 and the liquid molding material 14 is filled into the base forming guide groove 215, as the position corresponding to the light window forming block 214 cannot be filled with the liquid molding material 14. Accordingly, the liquid molding material 14 forms the annular molding body 121 of the molded base 12 at the position of the base forming guide groove 215 and the light window 122 of the molded base 12 is formed at the position of the light window forming block 214 after solidification. The material of the molding material 14 is selected from the nylon, LCP (Liquid Crystal Polymer), PP (Polypropylene), epoxy resin, and the like. One skilled in the art will understand that the material of the molding material 14 described above are exemplary only and not intended to be limiting the scope of the present invention.

The first mould 211 and the second mould 212 can be two moulds which have a relative movement. For example, one of the two moulds is arranged stationary and the other of the two moulds is arranged in moveable manner. Alternatively, both of the two mounds are arranged in moveable manner, the present invention in this aspect described above is exemplary only and not intended to be limiting the present invention. In the embodiment of the present invention, the first mould 211 is specifically embodied as a stationary upper mould and the second mould 212 is specifically embodied as a moveable lower mould with respect to the upper mould. The stationary upper mould 211 and the moveable lower mould 212 are provided coaxially so that the lower mould 212 can be operated to move axially towards or away from the upper mould 211. For example, the moveable lower mould 212 can slide upwardly along a plurality of positioning shafts to the closed-mould position to form the closed molding chamber 213 between the stationary upper mould 211 and the moveable lower mould 212.

The second mould 212 which is embodied as the lower mould has a circuit board positioning groove 2121. The circuit board positioning groove 2121 has a groove shape or is formed by a positioning post for mounting and holding the circuit board 11 in position inside the closed molding chamber 213. The light window forming block 214 and the base forming guide groove 215 can be formed in the first mould 211 which is embodied as the upper mould. When the first mould 211 and the second mould 212 are in the closed-mould position, the molding chamber 213 is defined therebetween, and the liquid molding material 14 is filled into the base forming guide groove 215 at a top side of the circuit board 11, so that the molded base 12 can be formed on the circuit board 11 and the non-photosensitive area portion 1312 on the top side of the photosensitive element 13.

It is understandable that, alternatively, the circuit board positioning groove 2121 can also be provided in the first mould 211 which is embodied as the upper mould adapted for mounting and holding the circuit board 11 in position. The light window forming block 214 and the base forming guide groove 215 can be formed in the second mould 212. When the first mould 211 and the second mould 212 are in the closed-mould position, the molding chamber 213 is formed therebetween. The circuit board 11 in the upper mound is arranged toward an obverse side and the liquid molding material 14 is filled into the base forming guide groove 215 which is on a bottom side of the inverted circuit board 11, so that the molded base 12 is formed on the bottom side of the inverted circuit board 11.

More specifically, when the first mould 211 and the second mould 212 are in the closed-mould position and perform the molding step, the light window forming block 214 is overlapped on the circuit board 11, so that the light window 122 of the molded base 12 is formed corresponding to the position of the light window forming block 214.

It is understandable that, a molding surface of the first mould 211 forming the base forming guide groove 215 can be configured as a flat surface and in the same plane. Thus, when the molded base 12 is formed after solidification, a top surface of the molded base 12 is able to be made absolutely flat, so that the molded base 12 provides a flat mounting condition for the lens 30 or other supporting components of the lens 30, thereby reducing a tilt error of the assembled camera module 100.

It is worth mentioning that the base forming guide groove 215 and the light window forming block 214 can be provided on the first mould 211 in a replaceable manner. In other words, the first mould 211 further comprises a detachable molding configuration, which is formed with the base forming guide groove 215 and the light window forming block 214. Thus, different shapes and sizes of the base forming guide groove 215 and the light window forming block 214 are designed according to different shapes and sizes of the molded circuit board assembly 10 such as with different diameters and thickness of the molded base. Thus, by replacing different molding configurations, the manufacturing equipment is adapted to be applied on different specification requirements for different molded circuit board assemblies 10. It is understandable that the second mould 212 can correspondingly comprise a detachable fixed block to provide different shapes and sizes of the circuit board positioning groove 2121 so as to facilitate the replacement of different shapes and sizes of the circuit board 11.

It is understandable that the molding material 14 is a thermal fusible material such as a thermoplastic material. A melting and heating device turns the solid-state heat fusible material into the liquid molding material 14 by heating. During the molding process, the hot and melted molding material 14 is solidified by a cooling process. The molding material 14 can also be a thermosetting material. The thermosetting material is heated and melted to turn into the liquid molding material 14 by the melting and heating device. During the molding process, the thermosetting molding material 14 is solidified by a further heating process, and the molding material 14 cannot be melted again after solidification, thereby forming the molded base 12.

It is understandable that in the molding process of the present invention, the molding material 14 can be in form of block, pellet, or powder, which becomes liquid in the molding mould 210 after heating and is then cured to form the molded base 12 after solidification.

It is understandable that, in the embodiment, a molding process of the circuit board 11 is illustrated, wherein, in the application of the manufacturing equipment 200, a plurality of separated circuit boards 11 can be molded at the same time. Alternatively, a joint board array operation mentioned in the following embodiment is also adapted.

Figure 8A:
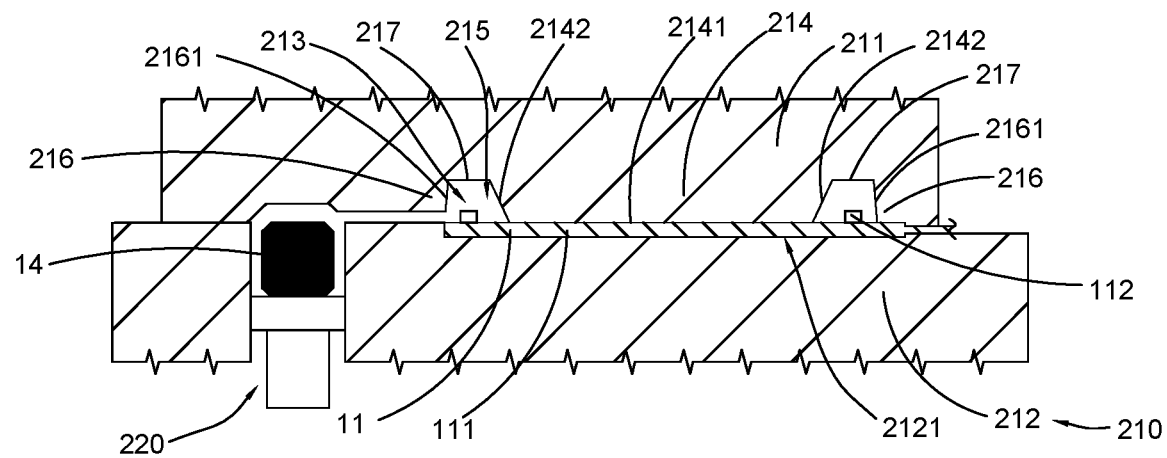
FIG. 8A is a cross-sectional view of the molded circuit board assembly, along an A-A line of the FIG. 4, according to the above first preferred embodiment of the present invention, illustrating that a liquid molding material is pushed into a base forming guide groove by a molding mould.
Figure 8B:
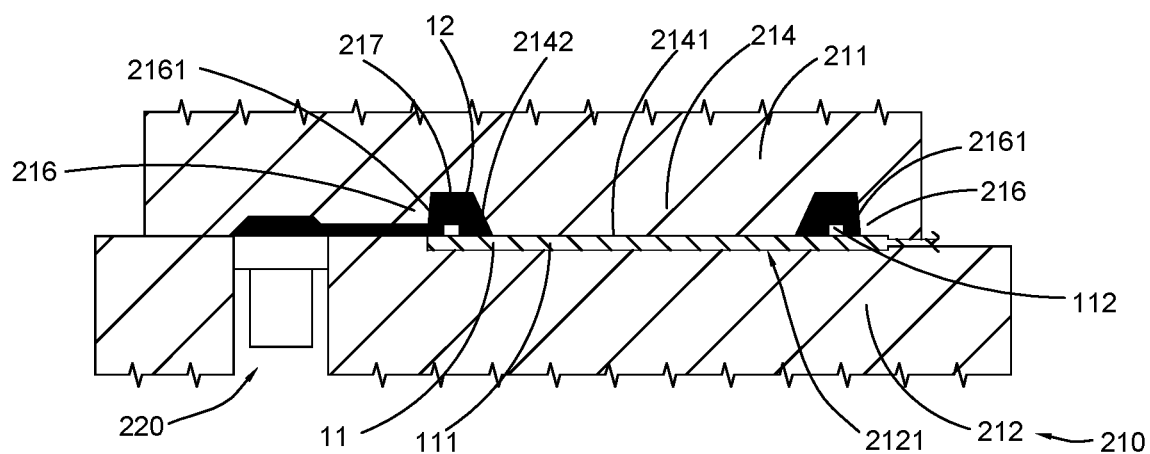
FIG. 8B is a cross-sectional view of the molded circuit board assembly, along the A-A line of the FIG. 4, according to the above first preferred embodiment of the present invention, illustrating that the molding mould of a manufacturing equipment performs the molding process to form a molded base.
Figure 9:
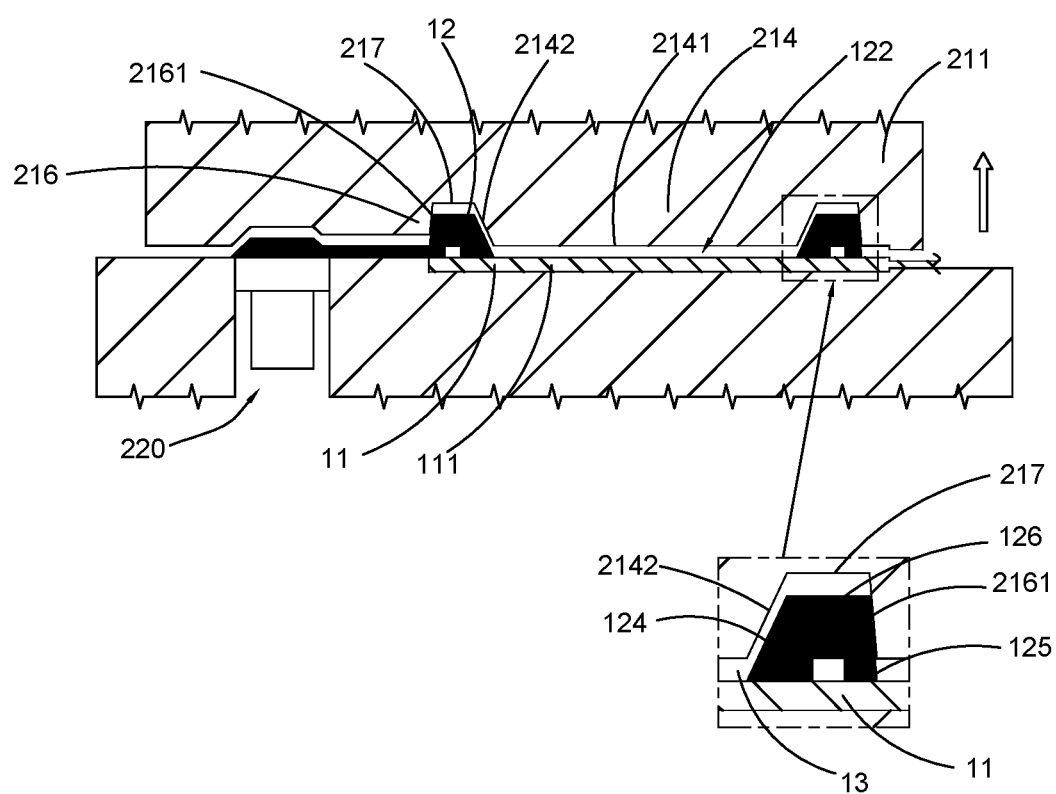
FIG. 9 is a cross-sectional view illustrating a demoulding process of the molded circuit board assembly according to the above first preferred embodiment of the present invention.
Figure 10:
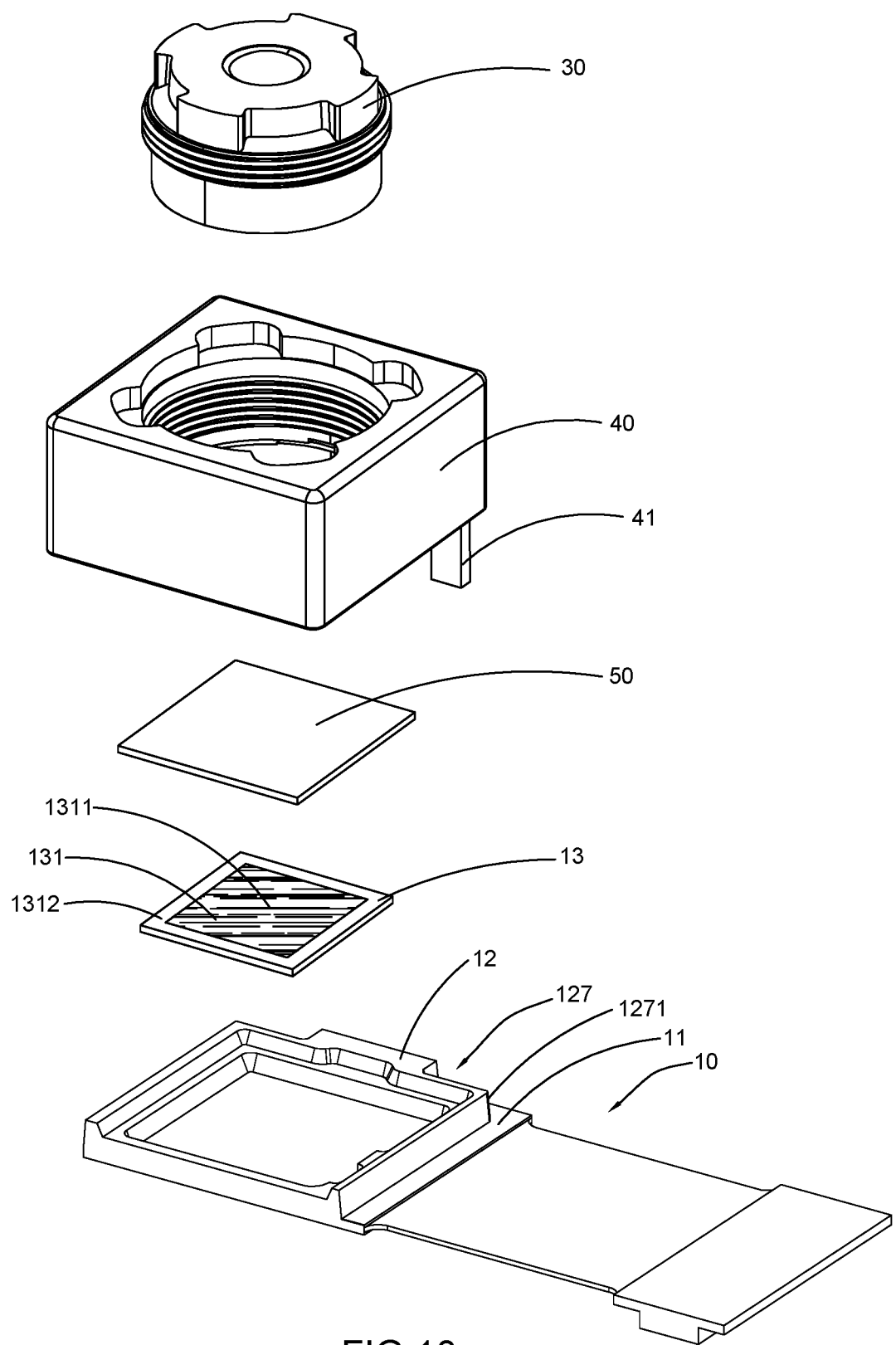
FIG. 10 is an exploded perspective view of the molded circuit board assembly according to a second preferred embodiment of the present invention.
Figure 11:
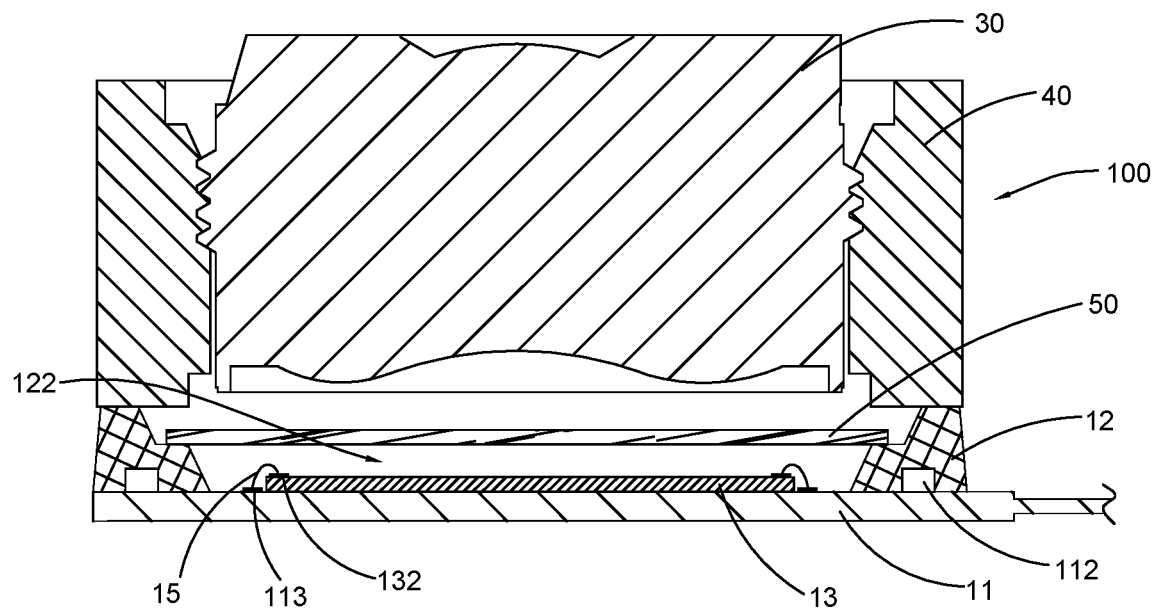
FIG. 11 is a cross-sectional view of the camera module along an axial direction according to the above second preferred embodiment of the present invention.

Referring to FIG. 8A to FIG. 9 of the drawings, a manufacturing process of the molded circuit board assembly 10 of the camera module 100 according to the preferred embodiment of the present invention is illustrated. As shown in FIG. 8A of the drawings, the molding mould 210 is in the closed-mould position, the circuit board 11 which is prepared to be molded and the solid molding material 14 are placed in position therein. The solid molding material 14 is heated and melted into a liquid state or into a semi-solid state, which is pressured to fill into the base forming guide groove 215 until reaching around the light window forming block 214.

As shown in FIG. 8B of the drawings, when the base forming guide groove 215 is filled with the liquid molding material 14, the liquid molding material 14 is solidified to form the molded base 12 which is integrally formed on the circuit board 11. Take the molding material 14 being embodied as a thermosetting material as an example, in the embodiment of the present invention, the heated and melted liquid molding material 14 is solidified after being heated.

As shown in FIG. 9 of the drawings, after the molding material 14 is cured to form the molded base 12, a demoulding process is performed. In the demoulding process, the mould fixing unit 230 moves the first mould 211 and the second mould 212 away from each other to the opened-mould position, thus the light window forming block 214 is departed from the molded base 12 and the light window 122 is formed in the molded base 12.

Figure 1B:
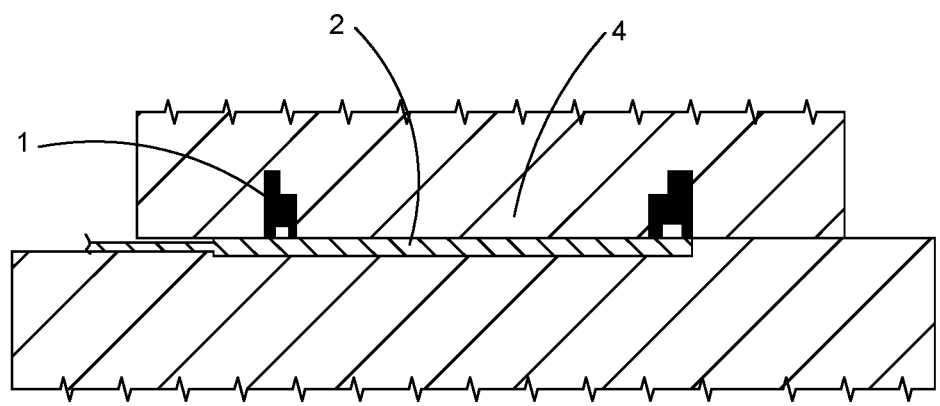
FIG. 1B is a schematic view of a conventional forming process for manufacturing the conventional encapsulated photosensitive assembly.

In the prior art as shown in FIG. 1B of the drawings, it is generally a non-practical concept for mass production because a bottom of the square-shaped molding block 4 has a sharp edge. During the demoulding process, the sharp edge produces a large friction with the inner surface of an encapsulation portion 1 that results in damaging the inner surface of the encapsulation portion 1. However, according to the present invention, the light window forming block 214 of the present invention is configured that the molded base 12 will not be damaged during demoulding process.

More specifically, according to the above embodiment of the present invention, as shown in FIG. 8A to FIG. 9 of the drawings, the light window forming block 214 has a trapezoid cross section. In other words, the light window forming block 214 has a pyramidal cross section with a transversal size gradually reduced along a longitudinal axis, and the light window forming block 214 is a solid body or is constructed as a hollow body covered on the circuit board 11 or a circuit board 11 electrically connected with the photosensitive element 13 in order to facilitate the subsequent molding process.

Figure 1C:
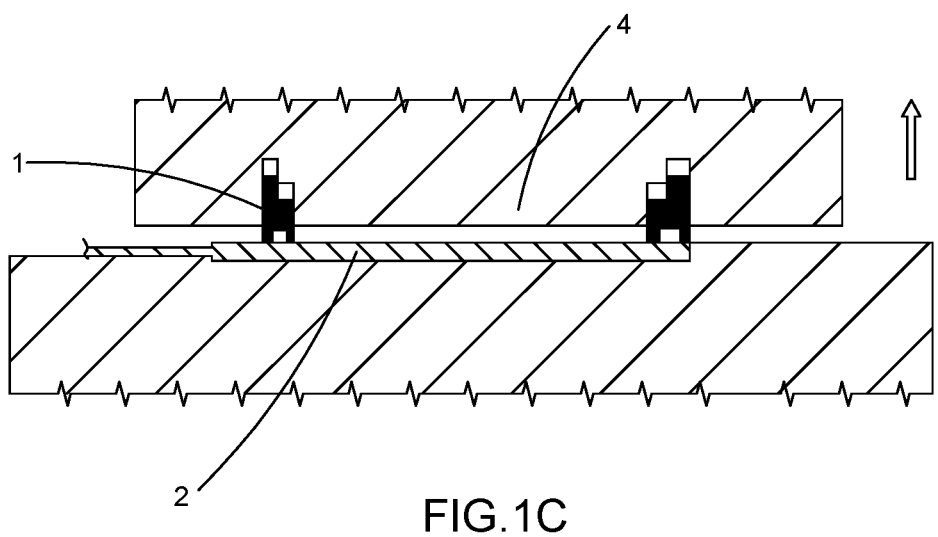
FIG. 1C is a schematic view of a demoulding process in the conventional encapsulating process for manufacturing the conventional encapsulated photosensitive assembly.
Figure 1D:
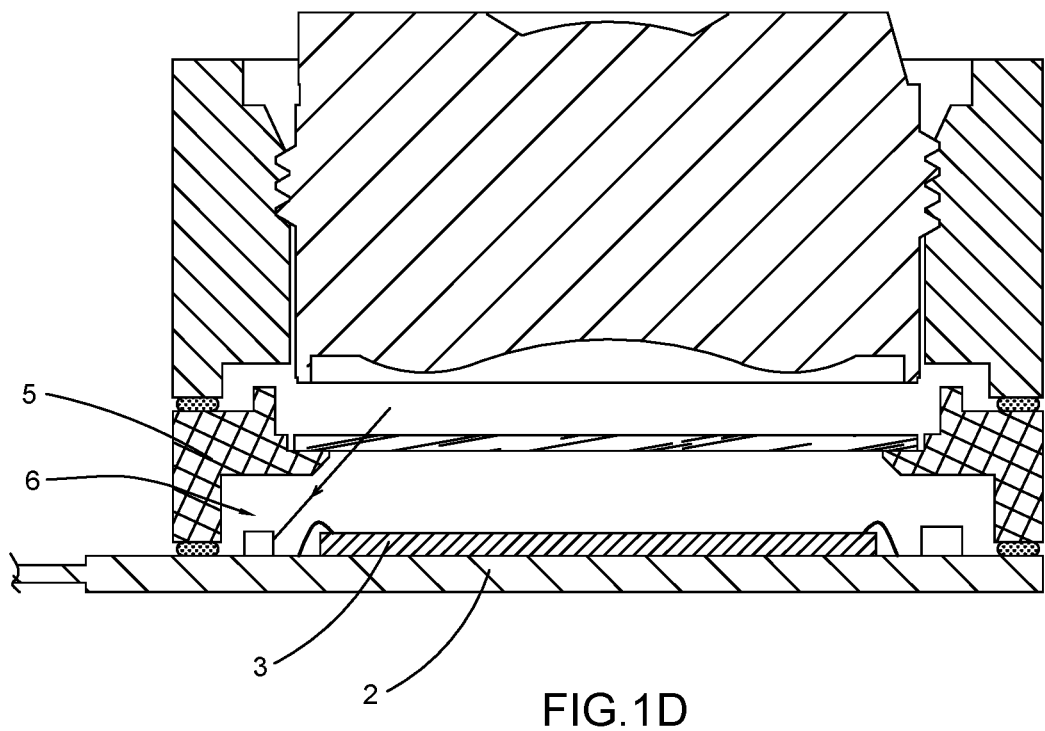
FIG. 1D is a schematic view illustrating a light path of a camera module packaged by a conventional COB technology.

In the embodiment of the present invention, the light window forming block 214 is a solid structure. The light window forming block 214 has a press-fit surface 2141 on its bottom side and a peripheral molding surface linearly extended along the circumferential direction to form a base inner side surface forming surface 2142. The included angle between the base inner side surface forming surface 2142 and a vertical (longitudinal) line is defined as a first included angle, which is an acute angle, while the conventional included angle as shown in FIGS. 1B and 1C is 0 degree. More specifically, the angular range of the first included angle is preferably 10° to 80°, and more preferably 30° to 55°.

Figure 5:
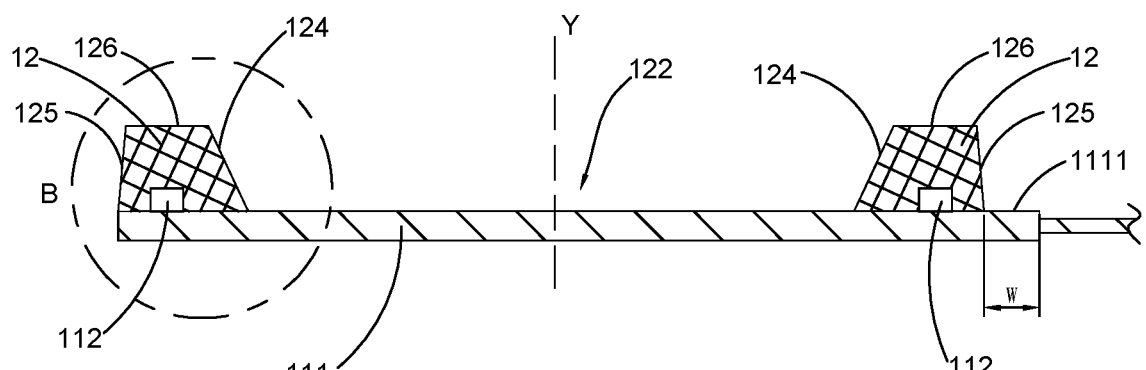
FIG. 5 is a cross-sectional view illustrating the molding mould of the camera module according to the above first preferred embodiment of the present invention along an A-A line of FIG. 4.
Figure 6:
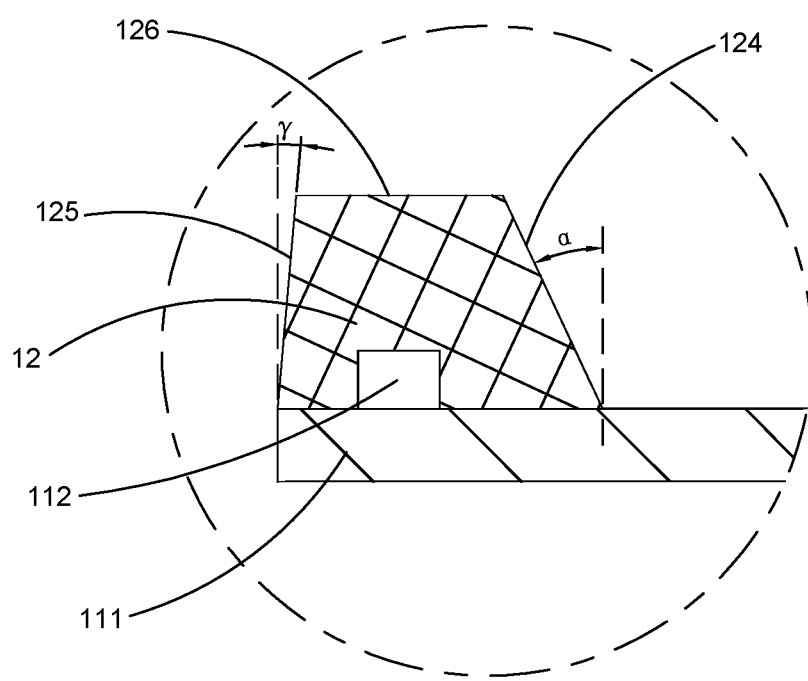
FIG. 6 is a partially enlarged sectional view illustrating an inclination angle, which is convenient for demoulding of the camera module according to the above first preferred embodiment of the present invention.

Accordingly, as shown in FIG. 5 and FIG. 6 of the drawings, the annular molding body 121 of the molded base 12 of the molded circuit board assembly 10 of the camera module 100 has a linearly extended inner side surface 124. A first inclination angle α is defined between the inner side surface 124 and a longitudinal line direction of the optical axis Y of the photosensitive element 13 of the molded circuit board assembly 10, wherein the first inclination angle α is the same as the first included angle correspondingly, which angular range is preferably 10° to 80°, and more preferably 30° to 55°.

As shown in FIG. 8A of the drawings, the light window forming block 214 has a trapezoidal cross section that gradually reduces its transverse size from the bottom to the top thereof. Correspondingly, the light window 122 formed in the molded base 12 also has a trapezoidal cross section that gradually increases its transverse size from the bottom to the top thereof. The angular range of the first inclination angle α is preferably to 10° to 80°, more preferably 30° to 55°, so as to facilitate the demoulding process without damaging the lead wires 15. In addition, the light window 122 of the molded base 12 having a trapezoidal cross section can save molding material while ensuring desired strength of the molded base 12.

Figure 1E:
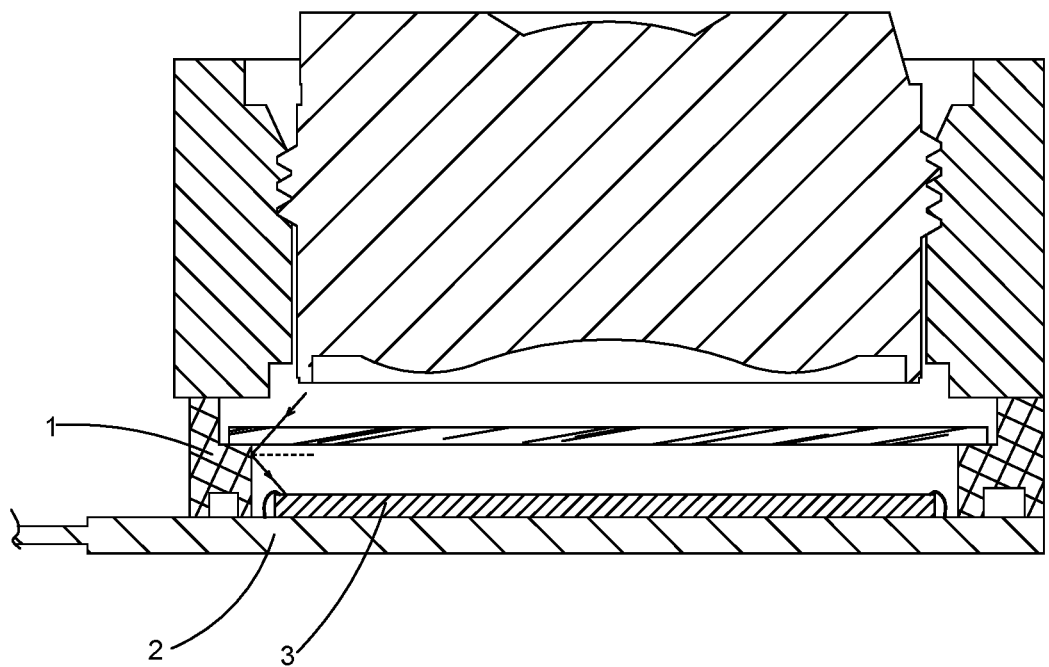
FIG. 1E is a schematic view illustrating a light path of a camera module by a conventional integrally packaging technology.
Figure 7:
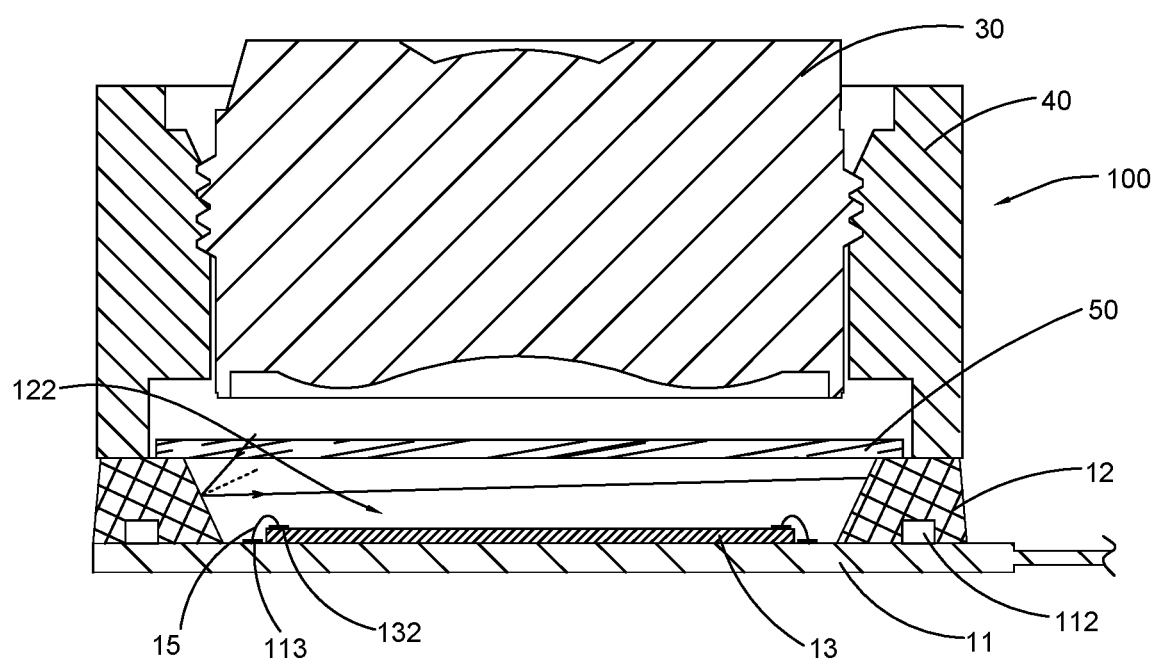
FIG. 7 is a cross-sectional view illustrating the avoiding stray lights of the camera module according to the above first preferred embodiment of the present invention.

It is worth mentioning that it is also possible to effectively avoid the stray light by selecting the right angular range of the first inclination angle α according to the present invention. As shown in FIG. 1E of the drawings according to the conventional molded and packaged camera module, the incident light through a lens has a portion reaching a photosensitive chip for light-receiving process while other portion of the incident light, such as the light beam as shown in FIG. 1E, is projected onto the longitudinal inner walls of the encapsulation portion 1, which is easily reflected by the inner wall of the encapsulation portion 1 to reach the photosensitive chip 3 for photoelectric conversion process, thereby adversely affecting imaging quality of the conventional camera module with reflected stray light. However, according to the preferred embodiment of the present invention, as shown in FIG. 7 of the drawings, incident light through the lens 30 has a major portion reaches the photosensitive element 13. Other portion of the incident light, such as light beam in the same direction and angle of the light beam in FIG. 1E, is projected onto the inner side surface 124 of the molded base 12 and is reflected out by the inner side surface 124 of the molded base 12 to the other side of the inner side surface 124, wherein the reflected light is distant from the photosensitive element 13 without reaching the photosensitive element 13 to prevent any photoelectric conversion process therefor by the photosensitive element 13, thereby reducing the influence of reflected stray light on the imaging quality of the camera module 100.

It is appreciated that the material surface of the molded base 12 according to the preferred embodiment of the present invention has a reflectivity of less than 5% in the wavelength range of 435-660 nm. In other words, most of the incident light projecting on the surface of the molded base 12 cannot be reflected to form the interference stray light reaching the photosensitive element 13, thereby remarkably reducing the influence of reflected stray light according to the present invention.

In addition, as shown in FIGS. 4 to 7 the drawings, the molded base 12 has the inner side surface 124 extended along an inner circumferential direction thereof, an outer side surface 125 extended along an outer circumferential direction thereof, and an annular top side surface 126. The inner side surface 124 is extended outwardly and integrally from the base board 111 of the circuit board 11. The outer side surface 125 is also extended inwardly and integrally from the base board 111 of the circuit board 11.

As shown in FIGS. 8A and 8B, the first mould 211 of the molding mould 210 is further provided with one or more dividing blocks 216 for forming the outer side surface 125 of the molded base 12 during the molding process. More specifically, the dividing blocks 216 has a base outer side surface forming surface 2161 to determine a position and shape of the outer side surface 125 of the molded base 12 which is formed by the molding material 14 after solidification in the molding process. A top-side molding surface 217 is formed between the dividing blocks 216 and the light window forming block 214 to determine a position and shape of the top side surface 126 of the molded base 12 which is formed by the molding material 14 after solidification in the molding process.

In the prior art, as shown in FIGS. 1A to 1E, the outer surface of the encapsulation portion 1 is perpendicular to the circuit board. In other words, a base outer surface molding surface of a partition block of the conventional mould is vertically oriented so that during the demoulding process, the base outer surface molding surface of the partition block of the conventional mould is always rubbed against the encapsulation portion 1, so that the demoulding process is inconvenient to operate, especially in mass production, and the outer side surface of the encapsulation portion 1 is easily damaged that results in great amount of defective products.

However, according to the preferred embodiment of the present invention, the base outer side surface forming surface 2161 further has a second included angle with respect to a longitudinal direction. Correspondingly, a second inclination angle γ is defined between the outer side surface 125 of the molded base 12 and the optical axis Y direction, having the same angle of the second included angle, as shown in FIG. 6. In other words, when the molded base 12 is horizontally arranged, the outer side surface 125 of the molded base 12 has the second inclination angle γ with respect to the vertical (longitudinal) line. For ease of demoulding, the second inclination angle γ is an acute angle and the second inclination angle γ cannot be too large as the top side surface 126 of the molded base 12 is needed to have a sufficient size to facilitate the subsequent installment of the lens 30 or the lens actuator 40. In other words, if the second inclination angle γ is too large and the inner side surface 124 and the outer side surface 125 of the molded base 12 are both inclinedly extended upwardly, the size of the top side surface 126 will be too small to securely install the lens 30 or the lens actuator 40. In addition, in this embodiment, the bottom portion of the lens actuator 40 has a mating surface which fits to the top side surface 126 of the molded base 12. When the top side surface 126 of the molded base 12 has a dimension, for example, less than the mating surface, it is inconvenient for the alignment of the lens actuator 40 that, when the lens actuator 40 is mounted on the top side surface 126 of the molded base 12, the lens actuator 40 may be shaken and not stable, and the lens actuator 40 is unable to prevent from crashing and anti-collision. Accordingly, according to a preferred embodiment of the present invention, the numerical maximum of the first inclination angle α is preferably not more than 30° and the numerical maximum of the second inclination angle γ is preferably not more than 45°. In addition, with a numerical minimum of the second inclination angle γ, the demoulding operation of the molding process can be facilitated and the manufacturing of the molding mould 210 can also be facilitated. Therefore, the numerical minimum of the first inclination angle α and the second inclination angle γ is preferably not smaller than 3°. Therefore, the angular range of the first inclination angle α of the present invention is 3° to 30°, more preferably 3° to 15°. The angular range of the second inclination angle γ of the present invention is 3° to 45°, more preferably 3° to 15°. It is worth mentioning that, as shown in FIG. 5 of the drawings, a press-fit distance W is formed on an outer edge of the base board 111 of the circuit board 11 and the outer side surface 125 of the formed molded base 12, so that it facilitates the demoulding and to press-fit the base board 111 of the circuit board 11. In other words, in the molding process, the dividing blocks 216 are suitable to press-fit on the region of the base board 111 of the circuit board 11, the press-fit distance W is a distance from a position which is the outer side surface 125 of the molded base 12 extended from the base board 111 of the circuit board 11 to the outer edge of the base board 111 of the circuit board 11. For example, the press-fit distance W has a range of 0.1 to 10 mm, preferably 0.1 to 0.6 mm. In a specific example, the press-fit distance W is 0.5 mm.

It is understandable that, because of the first inclination angle α and the second inclination angle γ and, in other words, as the inner side surface 124 and the outer side surface 125 of the molded base 12 having inclinations, during the demoulding process, the friction between the molded base 12 and the first mould 211 is reduced and the molded base 12 is much easier to be drafted out, such that the molded base 12 has a better molding state. More specifically, when the molded base 12 is cured and formed in the molding process and, in the demoulding process, the light window forming block 214 and the dividing blocks 216 begin to move vertically and upwardly with respect to the molded base 12, the base inner side surface forming surface 2142 of the light window forming block 214 and the base outer side surface forming surface 2161 of the dividing blocks 216 are respectively separated with the inner side surface 124 of the molded base 12 and the outer side surface 125 of the molded base 12, so that the base inner side surface forming surface 2142 of the light window forming block 214 and the base outer side surface forming surface 2161 of the dividing blocks 216 are not respectively in friction contact with the inner side surface 124 of the molded base 12 and the outer side surface 125 of the molded base 12, thereby avoiding damages to the inner side surface 124 and the outer side surface 125 of the molded base 12 and at the same time facilitating a smooth drafting of the molded base 12.

At the same time, the shape of the base forming guide groove 215 formed by the molding mould 210 is at an appropriate gradient without a right-angled corner, such that the fluid form molding material 14 entering into the base forming guide groove 215 has a better liquidity. Furthermore, the first inclination angle α and the second inclination angle γ are acute angles, unlike the prior art right-angle configuration, so that the angle between the top surface 131 of the photosensitive element 13 of the molded circuit board assembly 10 and the inner side surface 124 of the molded base 12 becomes a relatively rounded obtuse angle. The light window forming block 214 and the dividing blocks 216 do not form sharp edges and corners to scratch the inner side surface 124 and the outer side surface 125 of the molded base 12. Furthermore, the angular range of the first inclination angle α enables the molded base 12 to prevent the stray light from adversely affecting the image quality of the camera module 100.

Referring to FIG. 10 to FIG. 21 of the drawings, the molded circuit board assembly 10 of the camera module 100 and the manufacturing process thereof according to a second preferred embodiment of the present invention are illustrated. According to the second preferred embodiment of the present invention, an integral piece of molded circuit board assembly array 1000 can be manufactured by a joint board array operation, and the molded circuit board assembly 10 is obtained by cutting the integral piece of molded circuit board assembly array 1000.

Accordingly, more specifically, the molding chamber 213 is formed when the molding mould 210 is in the closed-mould position, and a plurality of the light window forming blocks 214 and one or more integral base array forming guide grooves 2150 are provided. In other words, a plurality of the base forming guide grooves 215 communicated with each other is provided and these base forming guide grooves 215 form an overall guiding groove.

Before the molding process, an integral piece of circuit board array 1100 is manufactured in advance. The integral piece of circuit board array 1100 comprises a plurality of circuit boards 11 integrally connected with each other.

When the integral piece of circuit board array 1100 is put in the molding chamber 213 and the molding mould 210 is in the closed-mould position, the solid molding material 14 is heated to melt and is pressured to enter the integral base array forming guide grooves 2150, thereby the liquid molding material 14 is filled around each of the light window forming blocks 214. Finally, during a solidifying process, the liquid molding material 14 in each of the integral base array forming guide grooves 2150 is solidified and hardened to form the molded base 12 which is integrally molded on each of the circuit boards 11 of the integral piece of circuit board array 1100. These molded bases 12 form an overall integral piece of molded base array 1200.

Figure 16:
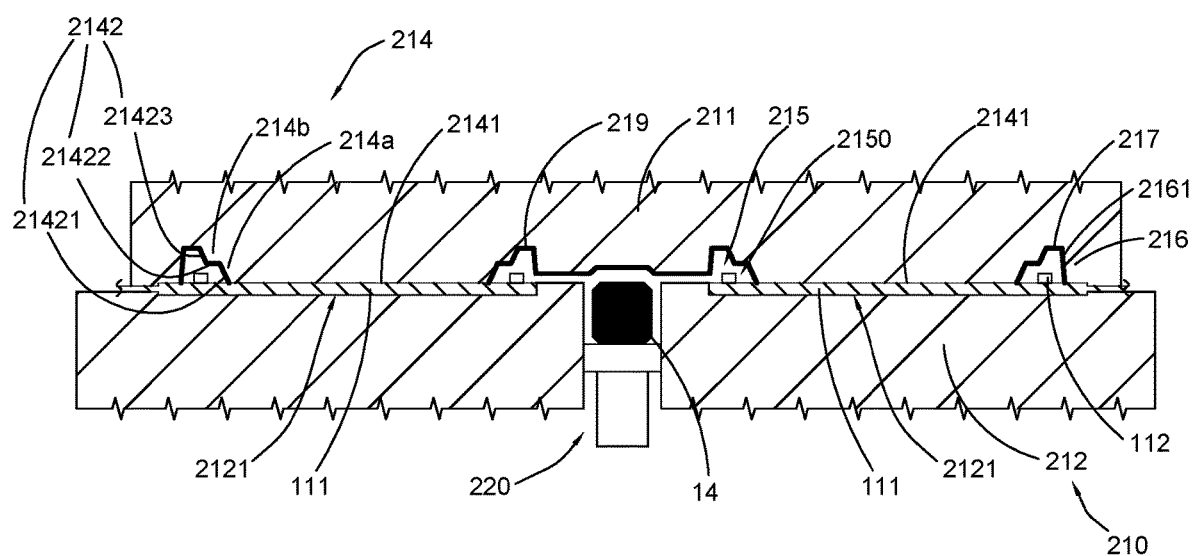
FIG. 16 is a cross-sectional view of the molded circuit board assembly, along a C-C line of the FIG. 13, according to the above second preferred embodiment of the present invention, illustrating that a liquid molding material is pushed into a base forming guide groove by a molding mould.
Figure 17:
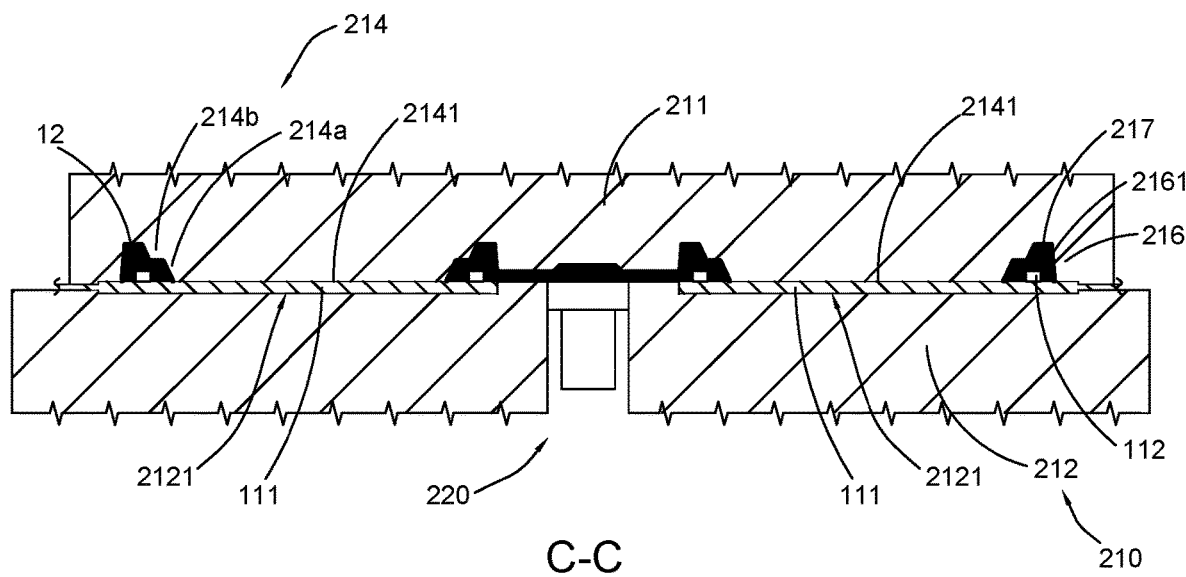
FIG. 17 is a cross-sectional view of the molded circuit board assembly, along the C-C line of the FIG. 13, according to the above second preferred embodiment of the present invention, illustrating that a liquid molding material is pushed into the base forming guide groove by the molding mould.

The molding surface of the first mould 211 contacted with the circuit board 11 is also provided with an elastic film layer 219, as shown in FIG. 16, so that the molding surface of the first mould 211 is firmly contacted with the circuit board 11 that is convenient for demoulding.

It is worth mentioning that when each of the separated molded circuit board assemblies 10 is manufactured by cutting the integral piece of molded circuit board assembly array 1000 to manufacture the auto-focus camera module, the molding mould 210 further comprises a plurality of lens actuator pin groove forming blocks 218. Each of the lens actuator pin groove forming blocks 218 is extended in the respective integral base array forming guide groove 2150, so that in the molding process, the liquid molding material 14 is not filled at the positions corresponding to the lens actuator pin groove forming blocks 218, and thus after a solidifying step, a plurality of the light windows 122 and a plurality of the lens actuator pin grooves 127 are formed in the integral piece of molded base array 1200 of the integral piece of molded circuit board assembly array 1000, wherein the molded base 12 of each of the separated molded circuit board assembly 10 manufactured through a cutting step is provided with the lens actuator pin grooves 127. Therefore, during the camera module 100 is manufactured, a lens actuator pin 41 of the lens actuator 40 is electrically connected to the circuit board 11 of the molded circuit board assembly 10 by welding or by attaching through a conducting resin.

It is understandable that, in comparison with the manufacturing process of the separated molded circuit board assembly 10 in the above first embodiment of the present invention, in the joint board array operation, two adjacent base forming guide grooves 215 forming two molded bases 12 are jointed together while the light window forming blocks 214 are spaced with each other, so that the molding material 14 eventually forms the integral piece of molded base array 1200 with an overall configuration.

In the step of manufacturing the separated molded circuit board assembly 10, the integral piece of molded circuit board assembly array 1000 is cut into a plurality of molded circuit board assemblies 10 to manufacture a plurality of camera modules respectively. Alternatively, two or more molded circuit board assemblies 10 which are combined with each other from the integral piece of molded circuit board assembly array 1000 can be separated and manufactured by cutting so as to manufacture a split type camera module array. In other words, each of the camera modules of the camera module array has an individual molded circuit board assembly 10, wherein two or more molded circuit board assemblies 10 are electrically connected to a controlling mainboard of the same electric device. Thus, the camera module array manufactured by two or more molded circuit board assemblies 10 transmits the images captured by the camera modules to the controlling mainboard for graphic information processing.

Figure 22:
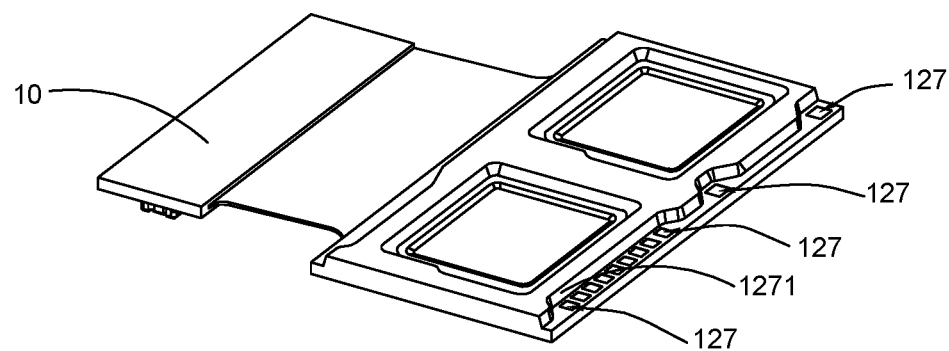
FIG. 22 is a perspective view of a molded circuit board assembly according to an alternative mode of the above second preferred embodiment of the present invention.

As shown in FIG. 22 of the drawings, the molding process of the joint board array operation also can be used to make a molded circuit board assembly 10 with two or more light windows 122, wherein the molded circuit board assembly 10 can be used to make a camera module array sharing a same base. In other words, taking the molded circuit board assembly 10 of an array of double camera modules as an example, for each of the circuit boards 11 of the integral piece of circuit board array 1100 in the molding process, one base board 111 is correspondingly provided with two light window forming blocks 214. The light window forming blocks 214 are spaced with each other and two base forming guide grooves communicated with each other are disposed around the light window forming blocks 214. Therefore, after the molding process, the circuit board 11 together form an integral molded base which shares one base board 111 and has two light windows 122, wherein two photosensitive elements 13 and two lens 30 are then correspondingly mounted thereon respectively. Furthermore, the base board 111 of the circuit board 11 can be connected to a controlling board of an electric board, and thus camera module array manufactured in this embodiment transmits the images captured by the camera modules to the controlling mainboard for graphic information processing.

It is worth mentioning that a press-fit distance W is formed on an outer edge of the base board 111 of the circuit board 11 and the outer side surface 125 of the formed molded base 12, so that it facilitates demoulding and press-fitting the base board 111 of the circuit board 11. The press-fit distance W has a range of 0.1 to 10 mm, preferably 0.1 to 0.6 mm. In a specific example, the press-fit distance W is 0.5 mm.

Figure 23:
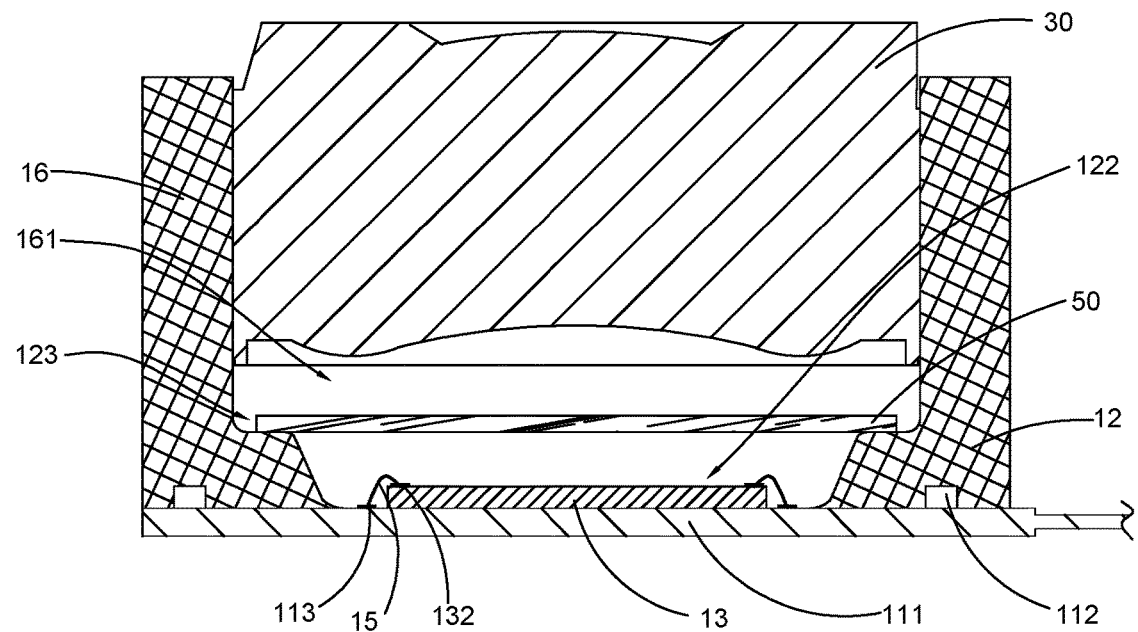
FIG. 23 is a cross-sectional view of a molded circuit board assembly according to an alternative mode of the above second preferred embodiment of the present invention.

As shown in FIG. 23 of the drawings, according to an alternative mode of the above preferred embodiments of the present invention, the molded base 12 is extended integrally and upwardly to form a lens mounting portion 16. The lens mounting portion 16 has a through hole 161 for mounting one or more lenses 30. It is worth mentioning that one of the light window forming block 214 and the dividing blocks 216 may have an arc-shaped chamfering transition in each of the corner or edge positions, so that according to the above-described embodiment, both the light window forming block 214 and the dividing blocks 216 are configured to have arc-shaped chamfered transitions so as to form an arc-shaped corner edge between the lens mounting portion 16 and the molded base 12 as well as an arc-shaped inner bottom edge of the molded base 12, as shown in FIG. 23, to further prevent damage to the formed molded base 12 during demoulding.

Figure 24:
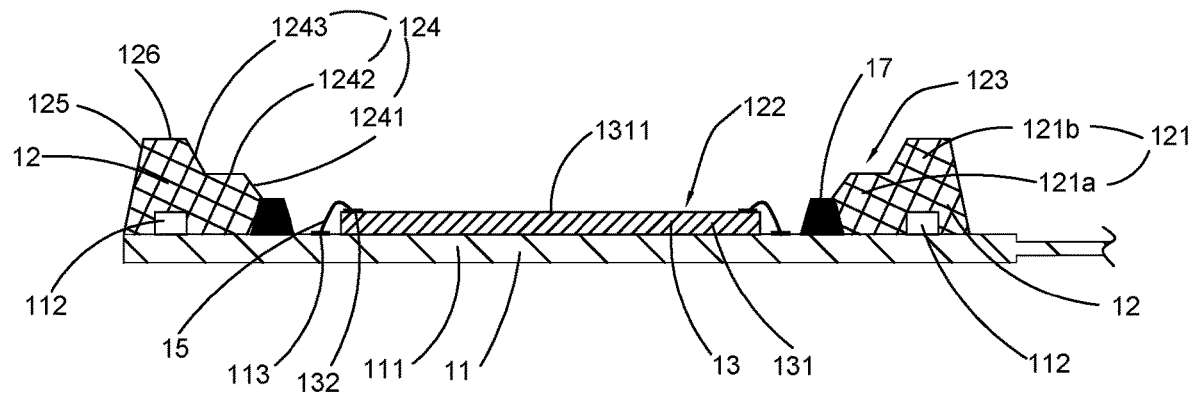
FIG. 24 is a cross-sectional view of a molded circuit board assembly according to an alternative mode of the above second preferred embodiment of the present invention.

As shown in FIG. 24 of the drawings, according to another alternative mode of the above preferred embodiments of the present invention, before the molding process, the photosensitive element 13 is connected to the circuit board 11 by the lead wires 15 and an annular blocking element 17 is provided on the circuit board 11 and positioned around the photosensitive element 13. The blocking element 17 is mounted or coated on the circuit board 11. The blocking element 17 is elastic and has a height higher than the highest point of the lead wires 15 electrically connected between the circuit board 11 and the photosensitive element 13, so that in the molding process, the light window forming block 214 is press-fit onto the blocking element 17 to prevent the light window forming block 214 from direct contacting with and damaging the circuit board 11, the lead wires 15 and the photosensitive element 13. In some embodiments, the blocking element 17 has a square ring-shape and is implemented as an adhesive step form positioned surrounding the photosensitive element 13 on the circuit board 11, as shown in FIG. 24, and the molded base 12 is formed adjacent to the blocking element 17 after the molding process such that the blocking element 17 not only prevents any molding material flowing to the photosensitive element 13 during the molding process but also forms an intermediate element between the molded base 12 and the photosensitive element 13 on the circuit board 11.

Figure 25:
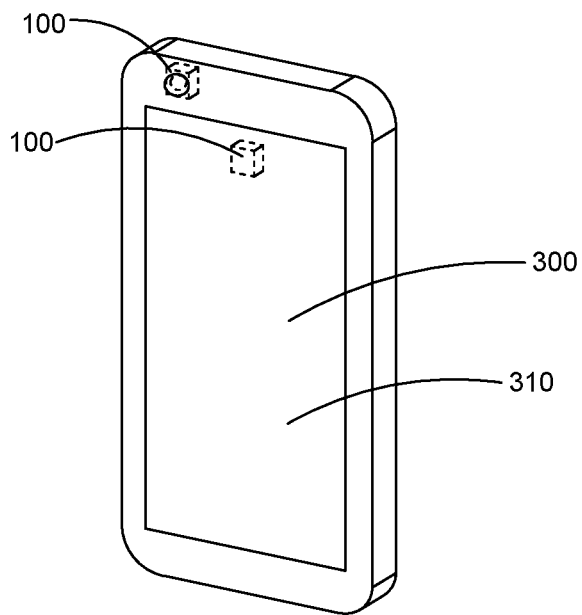
FIG. 25 is a schematic view illustrating the above camera module applied on a mobile phone according to the above embodiments of the present invention.

Referring to FIG. 11 to FIG. 15 of the drawings, the camera module 100, according to the second preferred embodiment of the present invention, comprises a molded circuit board assembly 10. The molded circuit board assembly 10 comprises the circuit board 11 and the molded base 12. The camera module 100 further comprises a lens 30. The molded base 12 comprises the annular molding body 121 and has the light window 122 formed in a middle thereof to provide a light path for the lens 30 and the photosensitive element 13. The photosensitive element 13 is operatively connected to the circuit board 11. For example, the photosensitive element 13 is electrically connected to the circuit board 11 by leading wires by a COB process, and the photosensitive element 13 is positioned on a top side of the circuit board 11. The photosensitive element 13 and the lens 30 are respectively assembled on two sides of the molded base 12 and are optically aligned in such a manner that the light passing through the lens 30 is able to reach the photosensitive element 13 via the light window 122, so that the camera module 100 is able to produce an optical image through a photoelectric conversion process. As shown in FIG. 25 of the drawings, the camera module 100 applied on a device body 310 of an intelligent electronic device 300 is illustrated. For example, the camera module 100 is applied on a mobile phone and is arranged along a thickness direction of the mobile phone. In addition, one or more camera module 100 can be assembled in the front and the back of the mobile phone.

Figure 12:
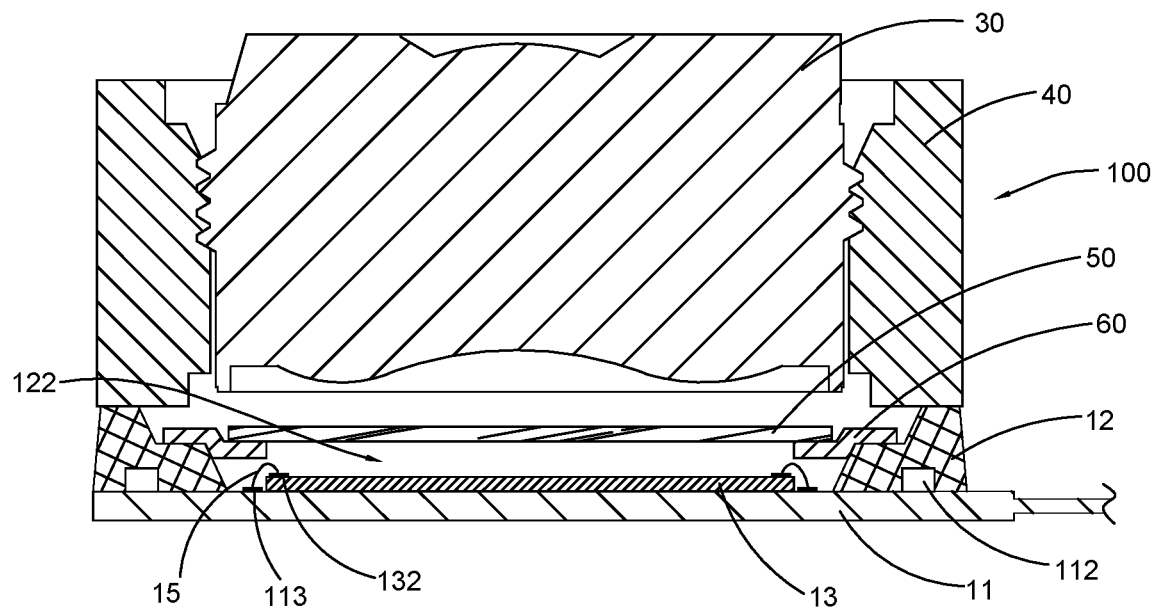
FIG. 12 is a cross-sectional view of the camera module according to an alternative mode of the above second preferred embodiment of the present invention.
Figure 13:
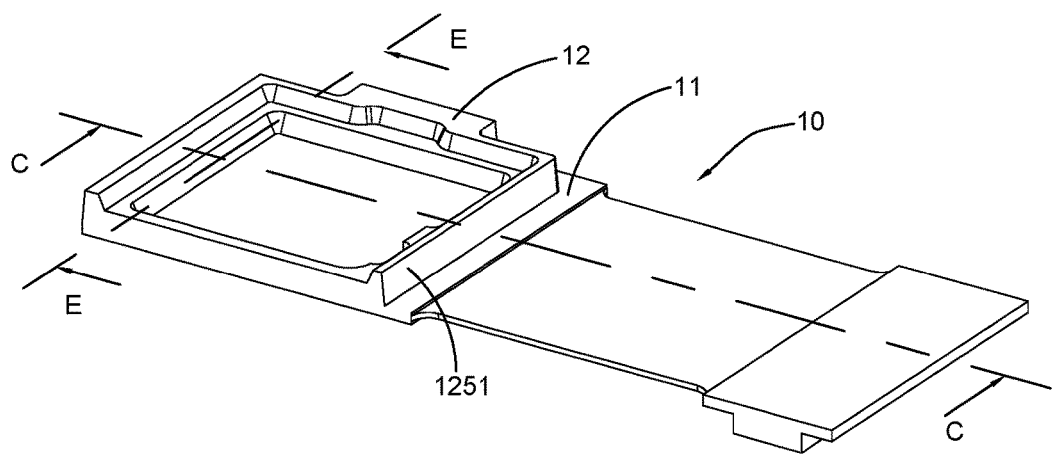
FIG. 13 is a perspective view of molded circuit board assembly of the camera module according to the above second preferred embodiment of the present invention.
Figure 14:
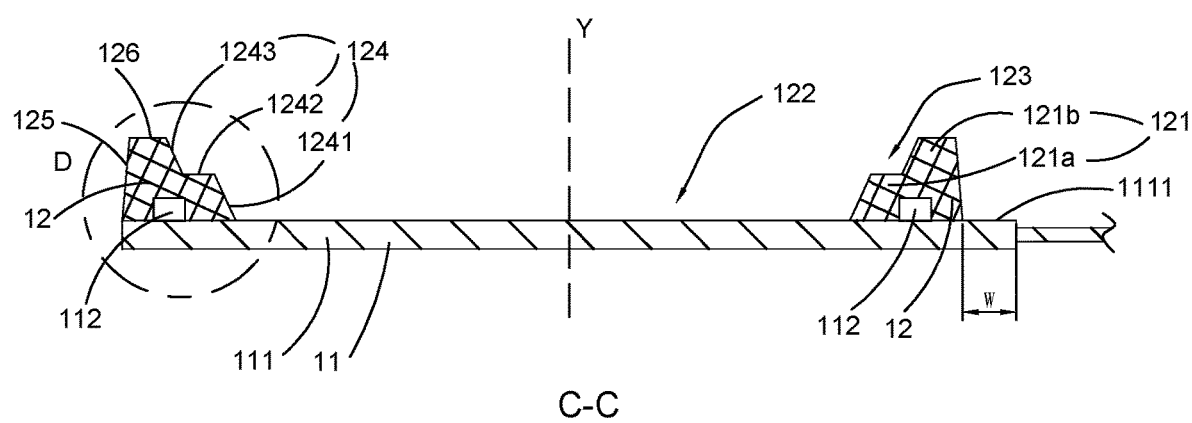
FIG. 14 is a cross-sectional view of the molding mould of the camera module according to the above second preferred embodiment of the present invention along a C-C line of FIG. 13.

The difference between the first embodiment of the present invention and the second preferred embodiment is that a top groove 123 is formed on a top side of the molded base 12 for mounting the optical filter 50, as shown in FIGS. 14 and 24. Alternatively, as shown in FIG. 12 of the drawings, the top groove 123 may also be used to support an additional optical filter holder 60 for mounting the optical filter 50.

Accordingly, the circuit board 11 comprises the base board 111 and a plurality of electronic components 112. The plurality of electronic components 112 is formed on the base board 111 using a technology such as the surface mount technology. The molded base 12 is molded and coated on the electronic components 112.

The molded base 12 has an inner side surface 124, an outer side surface 125 and a top side surface 126, as shown in FIGS. 14 and 24. In other words, the inner side surface 124 is formed along the inner circumferential direction of the molded base 12 and the outer side surface 125 is formed along the outer circumferential direction of the molded base 12 while the annular top side surface 126 defines a shape of the annular molding body 121.

In this embodiment, the cross section of the light window 12 is multi-step-shaped such as two-step-shaped. The inner side surface 124 of the molded base 12 is not a linearly extended flat inner surface, but a curved extending inner surface. More specifically, as shown in FIGS. 14 to 15, 24 and 26 to 29, the inner side surface 124 has a first portion inner side surface 1241, a second portion inner side surface 1242 and a third portion inner side surface 1243 integrally extended. As shown in the drawings, taking the arrangement which is in a longitudinal direction of the camera module 100 as an example, the first portion inner side surface 1241 is integrally and inclinedly extended from a top surface 1111 of the base board 111 of the circuit board 11, the second portion inner side surface 1242 is basically extended from the first portion inner side surface 1241 along a horizontal (transversal) direction, the third portion inner side surface 1243 is integrally and inclinedly extended from the second portion inner side surface 1242. The annular molding body 121 of the molded base 12 is correspondingly formed with a base station portion 121a on a bottom side, and a step portion 121b which is integrally extended from the base station portion 121a. The step portion 121b forms an overall annular step, or the step portion 121b is a multi-section type such as three-section type and one side of the molded base 12 may not have a step protrusion. The step portion 121b has a relative larger width than the base station portion 121a. The inner surface of the base station portion 121a is the first portion inner side surface 1241 of the inner side surface 124 of the molded base 12, the inner surface of the stair portion 121b is the third portion inner side surface 1243 of the inner side surface 124 of the molded base 12 and the top surface of the stair portion 121b is the top side surface 126 of the molded base 12.

It is understandable that the first portion inner side surface 1241 and a longitudinal line direction of the optical axis Y of the camera module 100 define the first inclination angle α therebetween, as shown in FIGS. 14-15 and 26-29. In other words, when the camera module 100 is aligned along the vertical (longitudinal) direction, the first portion inner side surface 1241 and the vertical (longitudinal) line define the first inclination angle α therebetween. The extending direction of the second portion inner side surface 1242 is substantially perpendicular to a longitudinal line direction of the optical axis Y of the camera module 100. The third portion inner side surface 1243 and the longitudinal line direction of the optical axis Y of the camera module 100 define a third inclination angle β therebetween. That is, when the camera module 100 is aligned in the vertical (longitudinal) direction, the third portion inner side surface 1243 and the vertical (longitudinal) line define the third inclination angle β therebetween.

Figure 15:
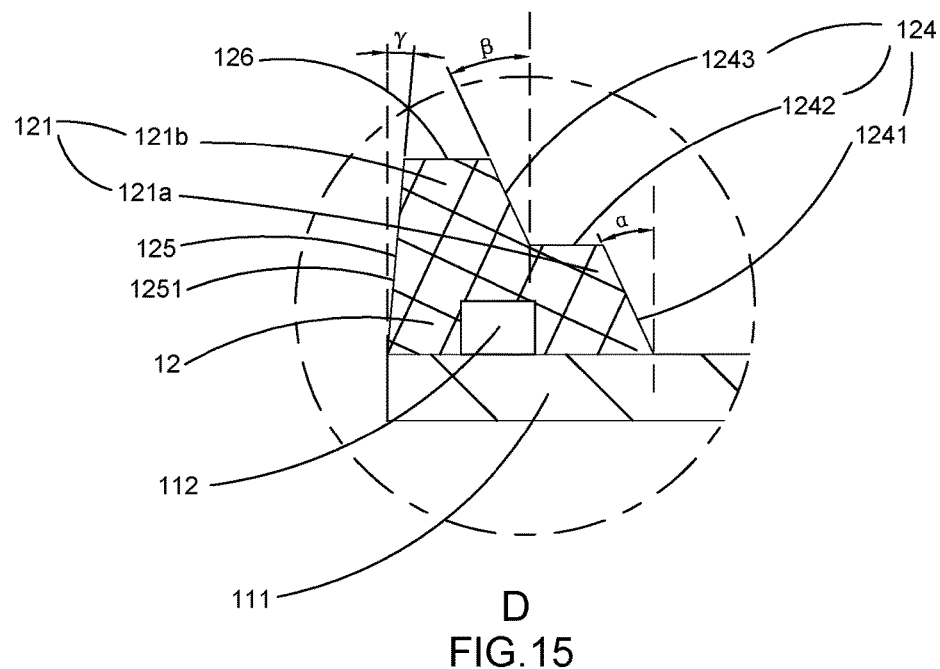
FIG. 15 is a partially enlarged sectional view illustrating an inclination angle, which is convenient for demoulding of the camera module according to the above second preferred embodiment of the present invention.
Figure 18:
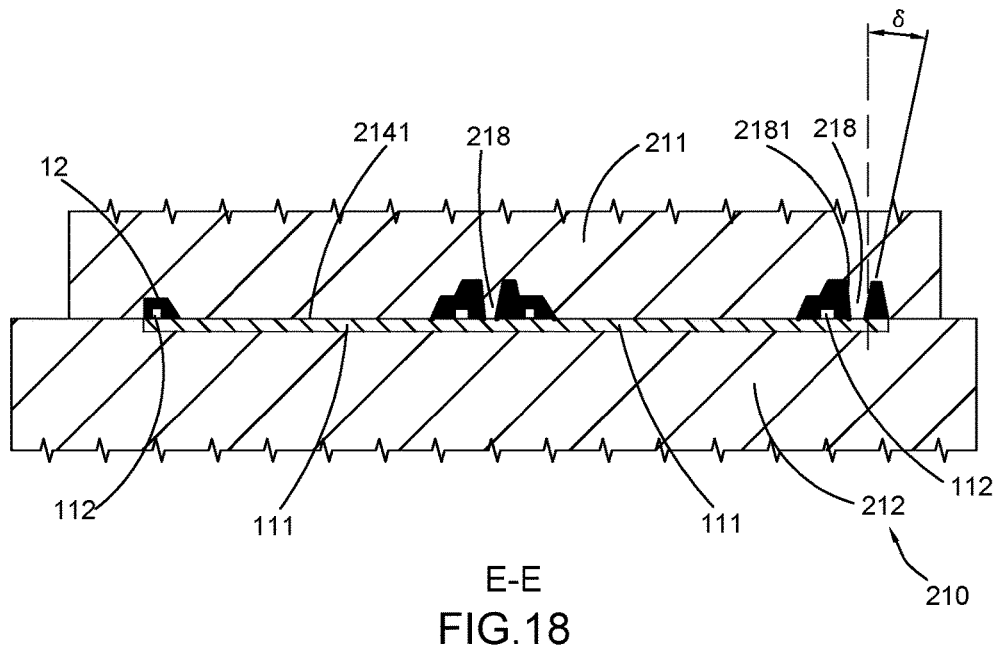
FIG. 18 is a cross-sectional view of the molded circuit board assembly, along an E-E line of the FIG. 13, according to the above second preferred embodiment of the present invention, illustrating that the molding mould performs the molding process to form an integral piece of molded bases array.
Figure 21:
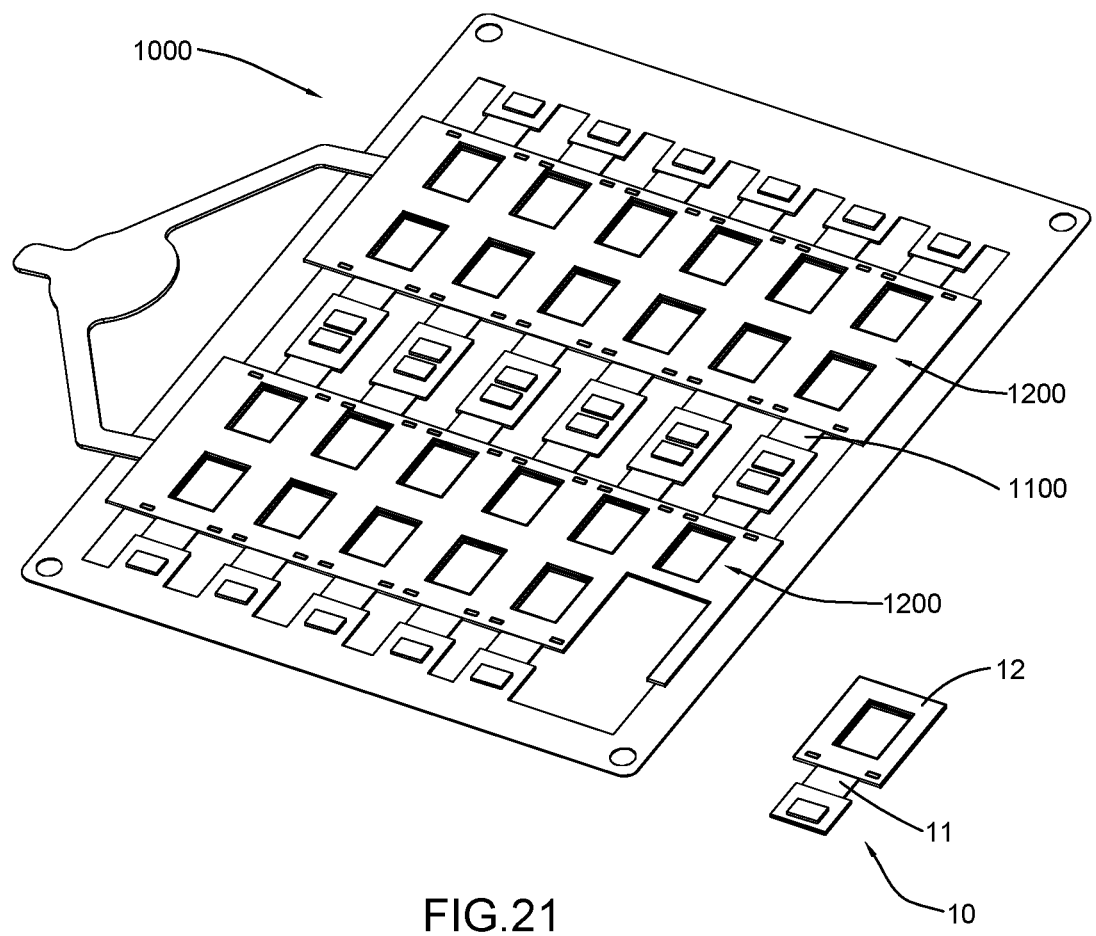
FIG. 21 is a perspective view of a separated molded circuit board assembly being cut down from the integral piece of molded circuit board assembly array in the molding process according to the above second preferred embodiment of the present invention.

The outer side surface 125 of the molded base 12 which is extended from the top surface 1111 of the base board 111 of the circuit board 11 comprises one or more outer peripheral surfaces 1251, as shown in FIG. 15. In the second preferred embodiment of the present invention, as the integrally connected integral piece of molded circuit board assembly array 1000 is manufactured and is cut into independent molded circuit board assemblies 10, some outer peripheral surfaces 1251 of the outer side surface 125 of the molded base 12 of the molded circuit board assembly 10 are formed by cutting, so that the outer peripheral surfaces 1251 can be vertical flat surfaces. While at least one outer peripheral surfaces 1251 is defined by the base outer side surface forming surface 2161 of the dividing blocks 216 of the molding mould 210 in the molding process. As shown in FIG. 21 of the drawings, the front outer peripheral surfaces 1251 of the molded circuit board assembly 10 obtained by cutting is formed by the base outer side surface forming surface 2161 of the dividing blocks 216 of the molding mould 210. The front outer peripheral surfaces 1251 and the longitudinal line direction of the optical axis Y of the camera module 100 define a second inclination angle γ therebetween. In other words, when the camera module 100 is aligned in the vertical (longitudinal) direction, the front outer peripheral surfaces 1251 and the vertical (longitudinal) line define the second inclination angle γ therebetween. In addition, the molded base 12 is also formed with one or more lens actuator pin grooves 127. Each of the lens actuator pin grooves 127 has a pin groove wall 1271. The pin groove wall 1271 and the longitudinal line direction of the optical axis Y of the camera module 100 define a fourth inclination angle δ therebetween, as shown in FIG. 18. In other words, when the camera module 100 is aligned in the vertical (longitudinal) direction, the pin groove wall 1271 and the vertical (longitudinal) line define the fourth inclination angle δ therebetween.

According to the embodiments of the present invention, as shown in FIGS. 14-15 and 26-29, the angular range of the first inclination angle α is 3° to 30°, while in other embodiments, the angular range of the first inclination angle α is 3° to 15°, 15° to 20° or 20° to 30°. The angular range of the second angle γ is 3° to 45°, while in other embodiments, the angular range of the second angle γ is 3° to 15°, 15° to 30° or 30° to 45°. The angular range of the third angle β is 3° to 30°, while in other embodiments, the angular range of the third angle β is 3° to 15°, 15° to 20° or 20° to 30°. The angular range of the fourth angle δ is 3° to 45°, while in other embodiments, the angular range of the third angle β is 3° to 15°, 15° to 30° or 30° to 45°.

The light window forming block 214 and the dividing blocks 216 are formed in a frustum-pyramidal shape, and edges and corners of the light window forming block 214 and the dividing blocks 216 are linearly transitioned or smoothly transitioned in an arc shape. However, the extending angles ranges of the surfaces are substantially within the above-mentioned specific range.

Correspondingly, the first mould 211 of the molding mould 210 is configured with an overall molding surface to form the molded base 12 with the above structure. More specifically, as shown in FIGS. 16 to 19 of the drawings, the light window forming block 214 comprises a press head portion 214a in a bottom side and a groove forming portion 214b on a top side. The press head portion 214a and the groove forming portion 214b together are used to form the light window 122 of the molded base 12. The groove forming portion 214b is used to form the top groove 123 on the top side of the molded base 12.

It is understandable that the light window forming block 214 comprises a press-fit surface 2141 on a bottom side and a base inner side surface forming surface 2142 along an outer circumferential direction. Furthermore, in this embodiment, the base inner side surface forming surface 2142 of the light window forming block 214 comprises a first portion forming surface 21421, a second portion forming surface 21422 and a third portion forming surface 21423 which are integrally extended. The first portion forming surface 21421, the second portion forming surface 21422 and the third portion forming surface 21423 are respectively and correspondingly used for forming the first portion inner side surface 1241, the second portion inner side surface 1242 and the third portion inner side surface 1243 which are integrally extended in an inner side of the molded base 12.

According to the embodiments of the present invention, as shown in the drawings, the camera module 100 is vertically aligned, the longitudinal direction of the optical axis Y of the photosensitive element 13 of the camera module 100 is parallel to the vertical (longitudinal) line. Correspondingly, the first portion forming surface 21421 and the vertical (longitudinal) line define the first inclination angle α in the range of 3° to 30°. The third portion forming surface 21423 and the vertical (longitudinal) line define the third inclination angle β in the range of 3° to 30°.

Correspondingly, the bottom side surface of the press head portion 214a forms the press-fit surface 2141 of the light window forming block 214. The outer side surface of the press head portion 214a forms the first portion forming surface 21421 of the light window forming block 214. The bottom side surface of the groove forming portion 214b forms the second portion forming surface 21422 of the light window forming block 214. The outer side surface of the groove forming portion 214b forms the third portion forming surface 21423 of the base forming guide groove 215. The press head portion 214a and the groove forming portion 214b are configured to be a frustum-pyramidal shape. The press head portion 214a and the groove forming portion 214b both have trapezoid cross sections, thereby preventing damages to the elastic film layer 219. More specifically, taking the groove forming portion 214b as an example, the molding block in the prior art has sharp edges and corners, and during the demoulding process, the film layer 219 is easy to be pierced at the position where the second portion forming surface 21422 is connected to the third portion forming surface 21423. While the second portion forming surface 21422 on the bottom side of the groove forming portion 214b and the third portion forming surface 21423 on the outer peripheral side of the groove forming portion 214b have an obtuse angle therebetween so as to provide convenience for the demoulding of the groove forming portion 214b.

In correspondence to that the outer side surface 125 of the molded circuit board assembly 10 has at least one outer peripheral surface 1251, each of the dividing blocks 216 has a base outer side surface forming surface 2161. The base outer side surface forming surface 2161 and the vertical line define the second inclination angle γ therebetween, ranging 3° to 45°.

The molding mould 210 is further provided with a plurality of the lens actuator pin groove forming blocks 218 each having a pin groove side surface forming surface 2181.

The pin groove side surface forming surface 2181 and the vertical (longitudinal) line define the fourth inclination angle δ therebetween, ranging 3° to 30°.

Correspondingly, the above structure of the first mould 211 of the molding mould 210 and the molded base 12 have the following advantages.

Figure 19:
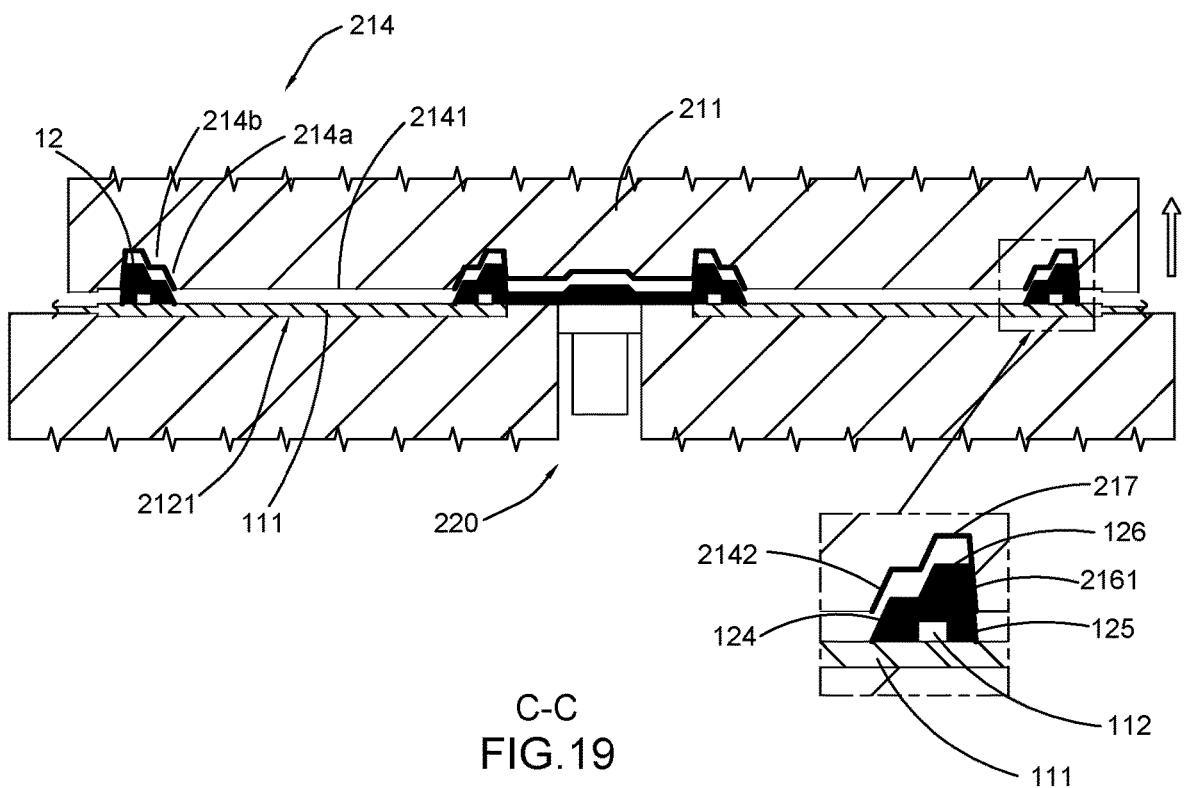
FIG. 19 is a cross-sectional view illustrating a demoulding process of the molded circuit board assembly according to the above second preferred embodiment of the present invention.
Figure 20:
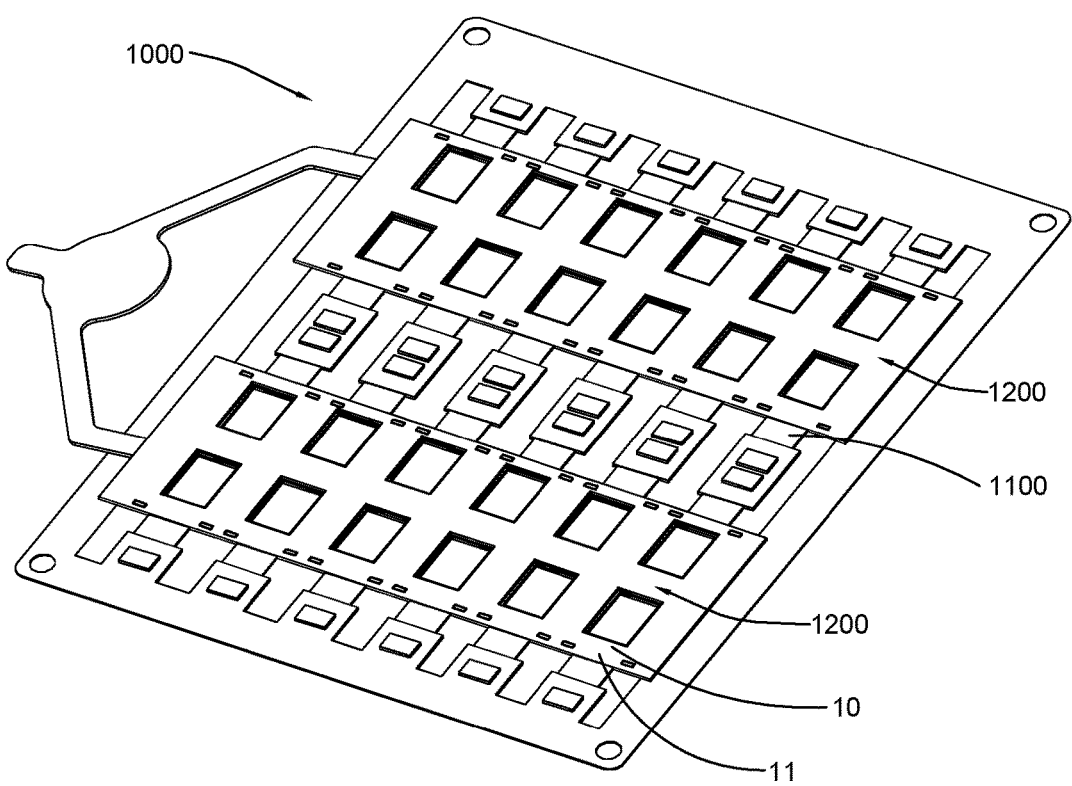
FIG. 20 is a perspective view of an integral piece of molded circuit board assembly array manufactured by the molding process according to the above second preferred embodiment of the present invention.

Firstly, it is convenient for drafting out the dividing blocks 216 and the light window forming block 214 of the first mould 211 during demoulding. In other words, as the first inclination angle α, the second inclination angle γ, the third inclination angle β, and the fourth inclination angle δ which are acute angles are provided to facilitate demoulding, the light window forming block 214 and the dividing blocks 216 have reduced frictions with the molded base 12 and the molded base 12 is easy to be detached to obtain a better molded state. As shown in FIG. 19 of the drawings, as along as the light window forming block 214 and the dividing blocks 216 are departed from the molded base 12 and have upward and downward relative displacements, friction is avoided between the light window forming block 214 and the dividing blocks 216 with the molded base 12. In other words, the first portion forming surface 21421, the second portion forming surface 21422 and the third portion forming surface 21423 of the light window forming block 214 are respectively separated with the first portion inner side surface 1241, the second portion inner side surface 1242 and the third portion inner side surface 1243 of the molded base 12. The base outer side surface forming surface 2161 of the dividing blocks 216 and the outer side surface 125 of the molded base 12 are separated, and thus the light window forming block 214 and the dividing blocks 216 are capable of being easily drafted from the molded base 12, thereby reducing the adverse influence to the molding condition and effect of the molded base 12.

Secondly, the shape of the integral base array forming guide groove 2150 formed by the molding mould 210 has no right-angled corners and has an appropriate gradient such that the liquid molding material 14 has a better liquidity entering the base forming guide groove 215. In other words, as the molding material 14 is generally in a liquid state during the molding process and is needed to flow in the molding chamber 213, the size of flowing area influences the filling effect of the molding material 14. The structure of the integral base array forming guide groove 2150 according to the embodiment of the present invention increases the flowing rate of the molding material 14, so that the molded base 12 is molded in a shorter time and is benefit for the molding of the molded base 12.

Thirdly, the first inclination angle α, the second inclination angle γ, the third inclination angle β, and the fourth inclination angle δ are acute angles, other than the right angle configuration in the prior art. The light window forming block 214 and the dividing blocks 216 do not form any sharp edge and corner that would damage the inner side surface 124 and the outer side surface 125 of the molded base 12.

Fourthly, as the first inclination angle α, the second inclination angle γ, the third inclination angle β, and the fourth inclination angle δ are acute angles, the inner side surface 124 of the molded base 12, at least one portion of the outer side surface 125 and the pin groove wall 1271 are in slant shape, so that the size of the molded base 12 is relatively smaller and the overall molding material 14 needed to be filled is decreased.

Fifthly, the acute angle range of the first inclination angle α and the third inclination angle β are capable of avoiding the stray light affecting the imaging quality of the camera module 100. More specifically, it reduces the possibility of stray light reaching the photosensitive element 13. That is, when the incident stray light in the camera module 100 is projected on the curved extending inner side surface 124 of the molded base 12, the aslant first portion inner side surface 1241, the third portion inner side surface 1243 and the second portion inner side surface 1242 which is extended along the horizontal (transversal) direction reflect the incident stray light away from the photosensitive element 13, preventing the incident stray light from easily reaching the photosensitive element 13 to affect the image quality of the camera module 100.

In addition, the ranges of the first inclination angle α, the second inclination angle γ, and the third inclination angle β enable the molded base 12 having a better supporting function. For example, the top side surface 126 has an enough size facilitating the mounting of the lens 30 or the lens actuator 40 thereto, and it is ensured that the second portion inner side surface 1242 has a sufficient size to facilitate mounting of the optical filter 50 or the optical filter holder 60. In other words, the first inclination angle α, the second inclination angle γ, and the third inclination angle β are not preferred to be too large to avoid the length of the top side surface 126 being too small in order to provide a secure mounting position for the lens 30 or the lens actuator 40.

Referring to FIG. 26 to FIG. 29 of the drawings, four examples of the range of the first inclination angle α, the second inclination angle γ, and the third inclination angle β according to the second preferred embodiment of the present invention are illustrated. In the four examples, the first portion inner side surface 1241 of the molded base 12 and the vertical (longitudinal) line define the first inclination angle α, at least one outer peripheral surfaces 1251 of the outer side surface 125 along the outer peripheral direction of the molded base 12 and the vertical (longitudinal) line define the second inclination angle γ, and the third portion inner side surface 1243 of the inner side surface 124 of the molded base 12 and the vertical (longitudinal) line define the third inclination angle β. L1 denotes a distance between the edge of photosensitive element 13 and the connecting position of the first portion inner side surface 1241 of the molded base 12 and the circuit board 11. L2 denotes a distance between the connecting position of the first portion inner side surface 1241 and the circuit board and the connecting position of the second portion inner side surface 1242 and the third portion inner side surface 1243. L3 denotes a distance between the connecting position of the second portion inner side surface 1242 and the third portion inner side surface 1243 and the connecting position of the outer side surface 125 of the molded base 12 and the circuit board 11. L4 denotes a length of the top side surface 126 of the molded base 12. The distance from the second portion inner side surface 1242 to the top surface of the base board 111 of the circuit board 11 is H1. The distance from the top side surface 126 of the molded base 12 to the top surface of the base board 111 of the circuit board 11 is H2.

In addition, the second inclination angle γ and the third inclination angle β should not be too large and are ranged in such a manner that the second portion inner side surface 1242 and the top side surface 126 have enough sizes to facilitate demoulding and to avoid stray lights. In other words, the ranges of the second inclination angle γ and the third inclination angle β have restrictive relations with the above parameters L1, L2, L3, L4, H1 and H2.

Figure 26:
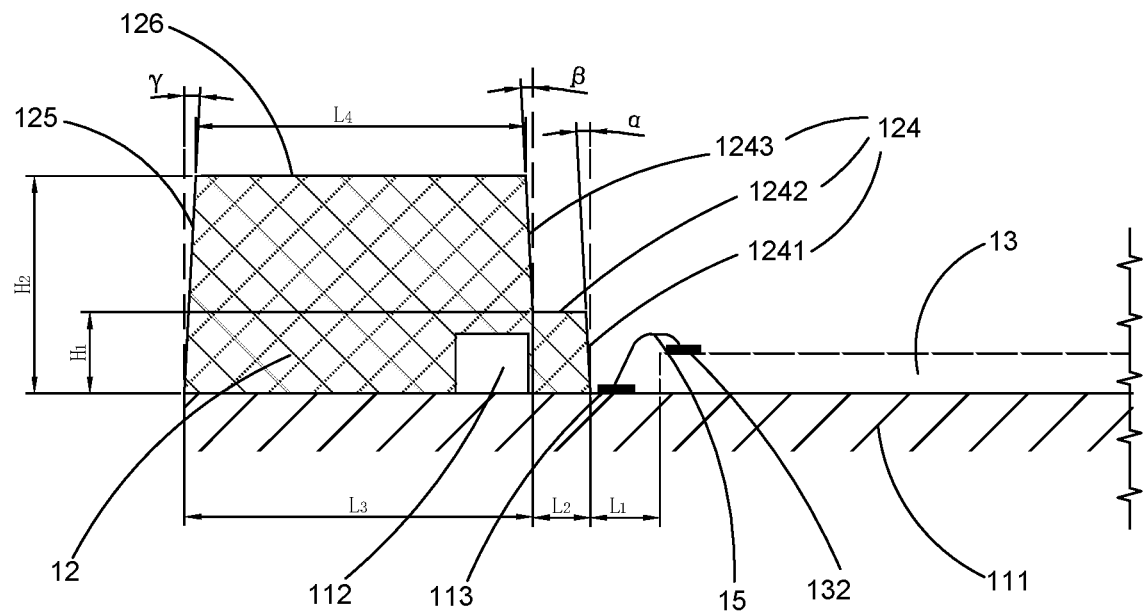
FIG. 26 is a partially enlarged sectional view of the molded circuit board assembly illustrating an inclination angle thereof for convenient demoulding of the molded circuit board assembly manufactured by the molding process according to a first example of the above second embodiment of the present invention.

As shown in FIG. 26 of the drawings, α is 3°, β is 3°, and γ is 3°. The L1 numerical value is 0.25 mm. The L2 numerical value is 0.21 mm. The L3 numerical value is 1.25 mm. The L4 numerical value is 1.18 mm. The H1 numerical value is 0.29 mm. The H2 numerical value is 0.78 mm. The first inclination angle α, the second inclination angle γ and the third inclination angle β have predetermined minimum numerical values respectively.

Figure 27:
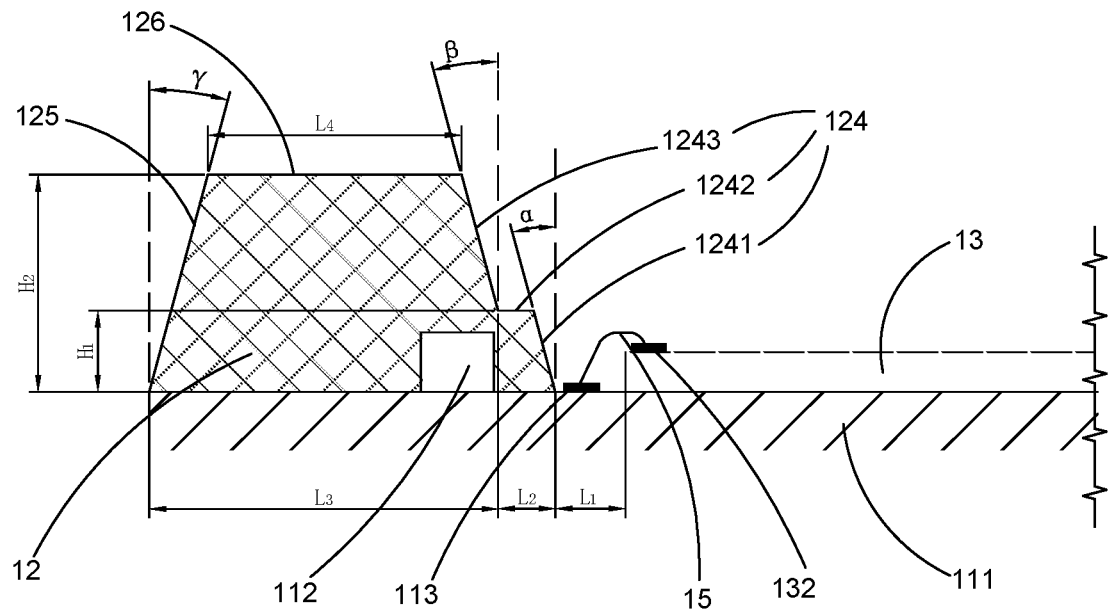
FIG. 27 is a partially enlarged sectional view of the molded circuit board assembly illustrating an inclination angle thereof for convenient for demoulding of the molded circuit board assembly manufactured by the molding process according to a second example of the above second embodiment of the present invention.

As shown in FIG. 27 of the drawings, α is 15°, β is 15°, and γ is 15°. The L1 numerical value is 0.25 mm. The L2 numerical value is 0.21 mm. The L3 numerical value is 1.25 mm. The L4 numerical value is 0.91 mm. The H1 numerical value is 0.29 mm. The H2 numerical value is 0.78 mm.

Figure 28:
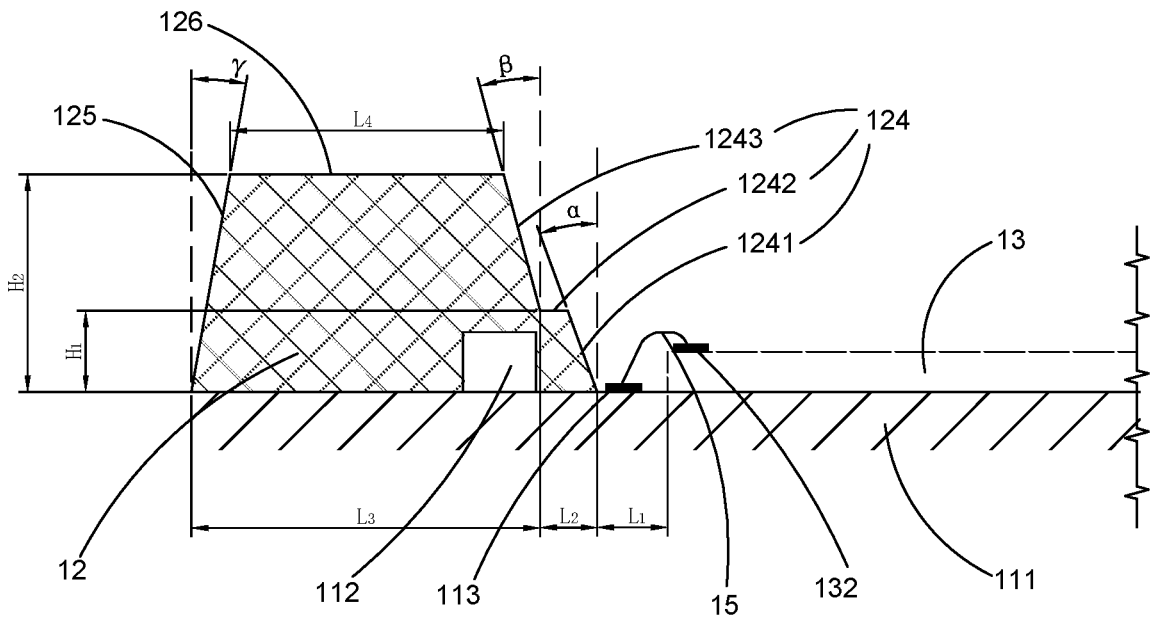
FIG. 28 is a partially enlarged sectional view of the molded circuit board assembly illustrating an inclination angle thereof for convenient for demoulding of the molded circuit board assembly manufactured by the molding process according to a third example of the above second embodiment of the present invention.

As shown in FIG. 28 of the drawings, α is 20°, β is 15°, and γ is 10°. The L1 numerical value is 0.25 mm. The L2 numerical value is 0.21 mm. The L3 numerical value is 1.25 mm. The L4 numerical value is 0.98 mm. The H1 numerical value is 0.29 mm. The H2 numerical value is 0.78 mm.

Figure 29:
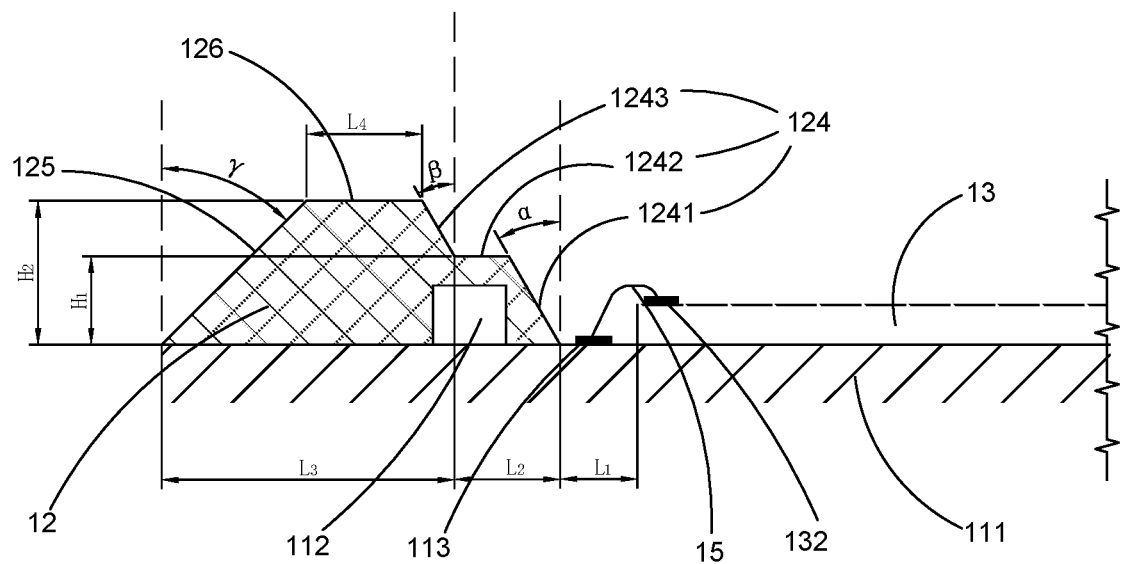
FIG. 29 is a partially enlarged sectional view of the molded circuit board assembly illustrating an inclination angle thereof for convenient for demoulding of the molded circuit board assembly manufactured by the molding process according to a fourth example of the above second embodiment of the present invention.

As shown in FIG. 29 of the drawings, α is 30°, β is 30°, and γ is 45°. The L1 numerical value is 0.28 mm. The L2 numerical value is 0.38 mm. The L3 numerical value is 1.05 mm. The L4 numerical value is 0.41 mm. The H1 numerical value is 0.32 mm. The H2 numerical value is 0.52 mm. The first inclination angle α, the second inclination angle γ and the third inclination angle β according to the embodiment have predetermined maximum values respectively.

It is understandable that the numerical values of above parameters L1, L2, L3, L4, H1, and H2 are exemplary only and not intended to be limiting the scope of the present invention. Practically, the numerical values thereof can be changed with the specification requirements of the camera module 100 and the molded circuit board assembly 10.

According to this embodiment of the present invention, it is possible to illustrate from the above-exemplified data that the appropriate range of the first inclination angle α is 3° to 30°, and the appropriate range of the second inclination angle γ is 3° to 45°, and the appropriate range of the third inclination angle β is 3° to 30°.

Referring to FIG. 30 to FIG. 36C of the drawings, a camera module 100 according to a third preferred embodiment of the present invention is illustrated. The camera module 100' can be applied to various electronic devices, such as smart phone, wearable device, computer equipment, television, vehicle, camera, monitoring device, and etc., wherein the electronic devices disclosed above are exemplary only and not intended to be limiting the scope of the present invention. The camera module 100' is cooperated with an electronic device to perform image acquisition and reproduction of a target object.

More specifically, a molded photosensitive assembly 10' of the camera module 100' and a manufacturing equipment 200' for the camera module 100' are illustrated according to the third preferred embodiment of the present invention. The molded photosensitive assembly 10' comprises a circuit board 11', a molded base 12' and a photosensitive element 13'. The molded base 12' of the present invention is integrally packaged and molded on the circuit board 11' and the photosensitive element 13' by the manufacturing equipment 200', wherein the molded base 12' is capable of replacing the independent holder or support of a conventional camera module, and it is unnecessary to adhere such holder or support to the circuit board by glue through a conventional adhering process.

The camera module 100' further comprises a lens 30'. The molded base 12' comprises an annular molding body 121' and has a light window 122' in a central portion thereof to provide a light path for the lens 30' and the photosensitive element 13'. The photosensitive element 13' is operatively connected to the circuit board 11'. For example, the photosensitive element 13' is electrically connected to the circuit board 11' by lead wires through a COB (Chip On Board) process, and the photosensitive element 13' is positioned on a top side of the circuit board 11'. The photosensitive element 13' and the lens 30' are respectively assembled on two sides of the molded base 12' and are optically aligned in such a manner that the light passing through the lens 30' is able to reach the photosensitive element 13' via the light window 122', so that the camera module 100 is able to produce an optical image through a photoelectric conversion process.

Figure 31A:
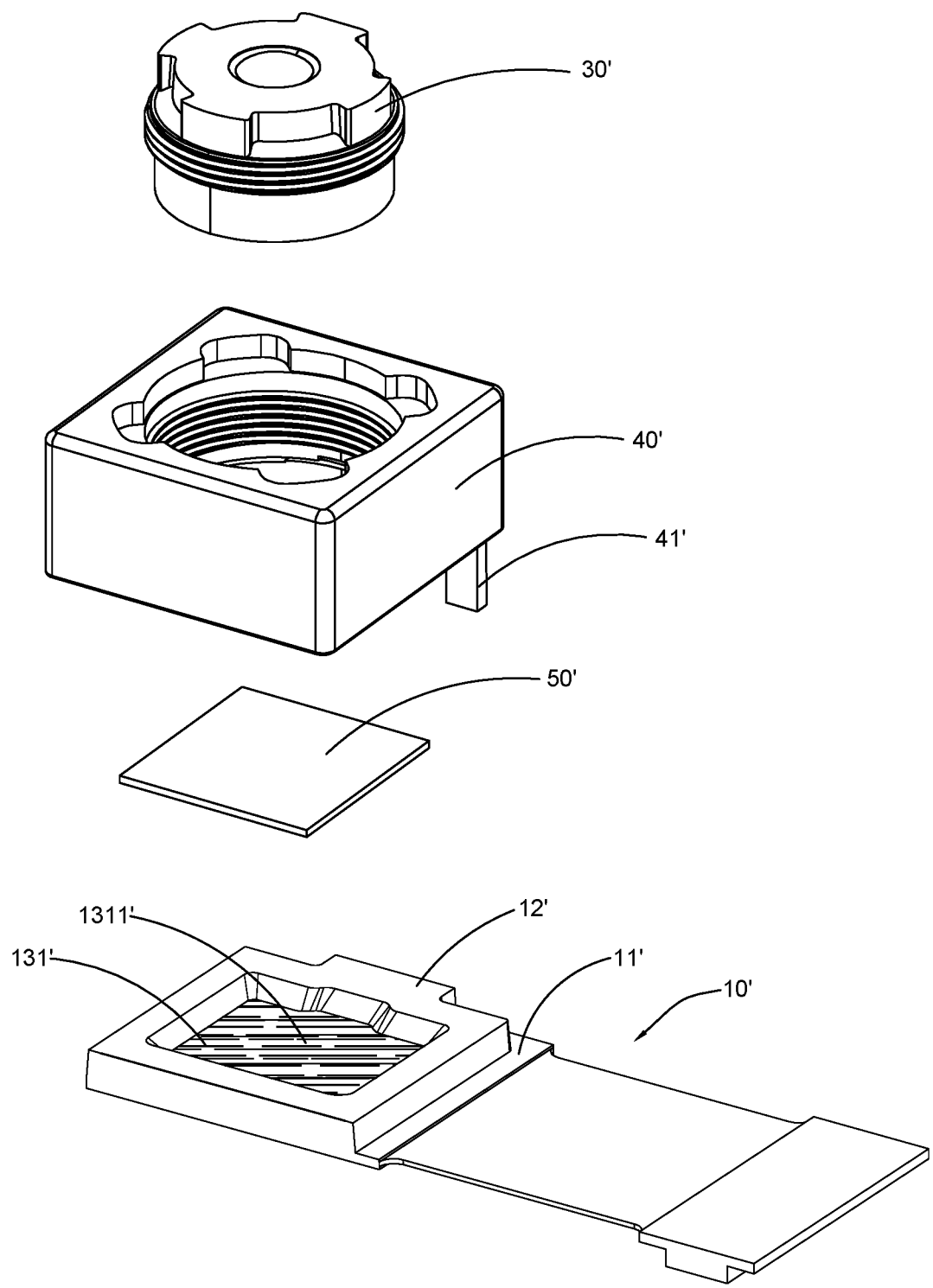
FIG. 31A is an exploded perspective view of the camera module according to the above third preferred embodiment of the present invention.
Figure 31B:
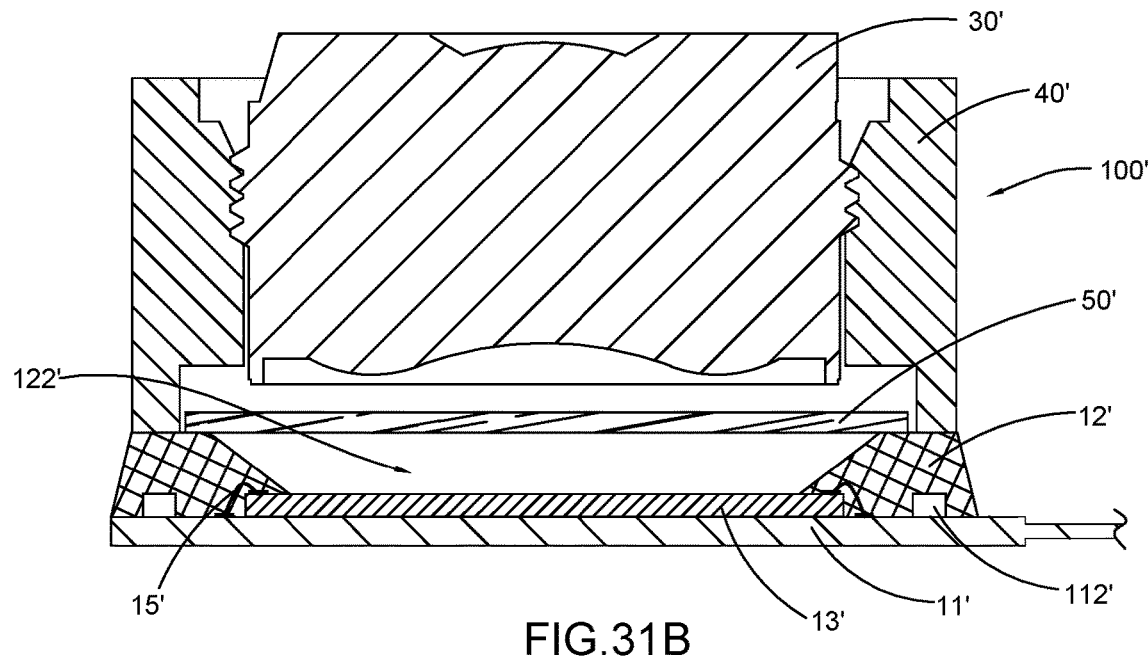
FIG. 31B is a cross-sectional view of the camera module along an axial direction according to the above third preferred embodiment of the present invention.
Figure 32:
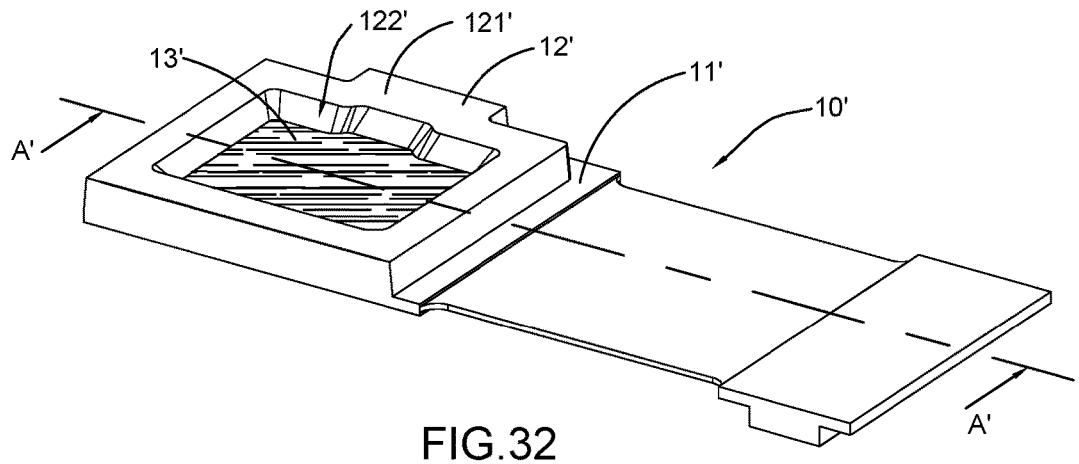
FIG. 32 is a perspective view of the molded photosensitive assembly according to the above third preferred embodiment of the present invention.

As shown in FIG. 31A and FIG. 31B of the drawings, the camera module 100' which is embodied as an automatic-focus camera module further comprises a lens actuator 40' such as a voice coil motor, a piezoelectric motor and etc., wherein the lens 30' is mounted to the lens actuator 40'. The molded base 12' supports the lens actuator 40'. An optical filter 50' which is an infrared cut-off filter is provided on a top side of the molded base 12' to filter lights which passes through the lens. The automatic-focus camera module in this embodiment of the present invention as shown in the drawings and described above is exemplary only and not intended to be limiting the scope of the present invention. In other embodiments of the present invention, the lens 30' could be mounted on the molded photosensitive assembly 10' without the lens actuator 40'. In other words, the camera module 100' is a fixed focus camera module, one skilled in the art will understand that the type of the camera module is not intended to be limiting and the camera module 100' can be a fixed focus camera module or an automatic-focus camera module.

The circuit board 11' comprises a base board 111' and a plurality of electronic components 112'. The plurality of electronic components 112' is formed on the base board 111' using a technology such as the surface mount technology. The electronic components 112' include but are not limited to resistors, capacitors, and other device drivers. In this embodiment of the invention, the molded base 12' is integrally coated on the electronic components 112' to further prevent objects such as dusts and debris of a conventional camera module from adhering to the electronic components 112' to further pollute the photosensitive element 13' that affects the imaging results. It is understandable that, in an alternative mode of the embodiment, the electronic components 112' are buried in the base board 111' that, in other words, the electronic components 112' are not exposed to outside. The base board 111' of the circuit board 11' can be a rigid PCB, a flexible PCB, a rigid-flex PCB or a ceramic substrate. It is worth mentioning that in this preferred embodiment of the present invention, since the molded base 12' is integrally molded on the electronic components 112', the electronic components 112' is able to be not buried in the base board 111'. The base board 111' is used to form conductive lines, so that the finally obtained molded photosensitive assembly 10' has a smaller thickness.

In this third preferred embodiment of the present invention, the photosensitive element 13' is overlapped on a flat overlapping region of the circuit board 11' which is on an inner side of the electronic components 112'. The molded base 12' is integrally formed on the circuit board 11' and the photosensitive element 13' by a molding process. In other words, the molded base 12' is integrally combined with the circuit board 11' and the photosensitive element 13'. The photosensitive element 13' has a top surface 13'1. The top surface 131' has a photosensitive area portion 1311' in the center thereof and a non-photosensitive area portion 1312' positioned around the photosensitive area portion 1311'. The molded base 12' is integrally molded at least one portion of the non-photosensitive area portion 1312' and the circuit board 11'.

Figure 30:
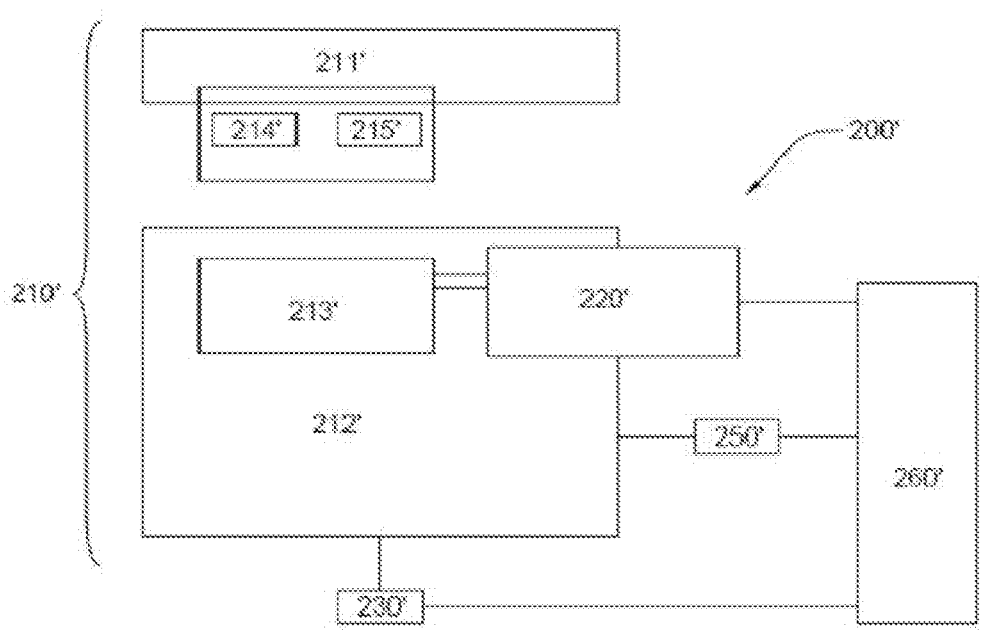
FIG. 30 is a schematic diagram of a molded photosensitive assembly of a camera module according to a third preferred embodiment of the present invention.

Furthermore, as shown in FIG. 30 of the drawing, the manufacturing equipment 200' for the molded photosensitive assembly 10' of the camera module 100' comprises a molding mould 210', a molding material feeding mechanism 220', a mould fixing unit 230', a temperature control unit 250' and a controller 260'. The molding material feeding mechanism 220' supplies a molding material 14' to a base forming guide groove 215' of the molding mould 210'. The mould fixing unit 230' is operated to control an opened-mould position and a closed-mould position of the molding mould 210'. The temperature control unit 250' is operated to heat or cool the molding material 14'. The controller 260' automatically controls operations of the molding material feeding mechanism 220', the mould fixing unit 230' and the temperature control unit 250' in the molding process.

The molding mould 210' comprises a first mould 211' and a second mould 212'. The first mould 211' and the second mould 212' are able to be operated between an opened-mould position and to a closed-mold position under control of the mould fixing unit 230'. In other words, the mould fixing unit 230' enables to separate the first mould 211' and the second mould 212' to open the molding mould 210' and to close the first mould 211' and the second mould 212' to define a molding chamber 213' between the first mould 211' and the second mould 212'. When the molding mould 210' is in the closed-mould position, the circuit board 11' is placed and fixed within the molding chamber 213' and the liquid molding material 14' enters into the molding chamber 213' and is integrally molded on the circuit board 11' and to form the molded base 12' which is integrally molded on the circuit board 11' and the photosensitive element 13' after solidifications.

More specifically, the molding mould 210' further comprises a light window forming block 214' and has the base forming guide groove 215' formed around the light window forming block 214'. When the first mould 211' and the second mould 212' are in the closed-mould position, the light window forming block 214' and the base forming guide groove 215' are extended inside of the molding chamber 213' and the liquid molding material 14' is filled into the base forming guide groove 215', as the position corresponding to the light window forming block 214' cannot be filled with the liquid molding material 14'. Accordingly, the liquid molding material 14' forms the annular molding body 121' of the molded base 12' at the position of the base forming guide groove 215' and the light window 122' of the molded base 12' is formed at the position of the light window forming block 214' after solidification. The material of the molding material 14' is selected from the nylon, LCP (Liquid Crystal Polymer), PP (Polypropylene), epoxy resin, and the like. One skilled in the art will understand that the material of the molding material 14' described above are exemplary only and not intended to be limiting the scope of the present invention.

The first mould 211' and the second mould 212' can be two moulds which have a relative movement. For example, one of the two moulds is arranged stationary and the other of the two moulds is arranged in moveable manner. Alternatively, both of the two moulds are arranged in moveable manner, the present invention in this aspect described above is exemplary only and not intended to be limiting the scope of the present invention. In the embodiment of the present invention, the first mould 211' is specifically embodied as a stationary upper mould and the second mould 212' is specifically embodied as a moveable lower mould with respect to the upper mould. The stationary upper mould 211' and the moveable lower mould 212' are provided coaxially so that the lower mould 212' can be operated to move axially towards or away from the upper mould 211'. For example, the moveable lower mould 212' can slide upwardly along a plurality of positioning shafts to the closed-mould position to form the closed molding chamber 213' between the stationary upper mould 211' and the moveable lower mould 212'.

The second mould 212' which is embodied as the lower mould has a circuit board positioning groove 2121'. The circuit board positioning groove 2121' has a groove shape or is formed by a plurality of positioning posts for mounting and holding the circuit board 11' in position inside the closed molding chamber 213'. The light window forming block 214' and the base forming guide groove 215' can be formed in the first mould 211' which is embodied as the upper mould. When the first mould 211' and the second mould 212' are in the closed-mould position, the molding chamber 213' is defined therebetween, and the liquid molding material 14' is filled into the base forming guide groove 215' on a top side of the circuit board 11', so that the molded base 12' can be formed on the circuit board 11' and the non-photosensitive area portion 1312' on the top side of the photosensitive element 13'.

It is understandable that, alternatively, the circuit board positioning groove 2121' can also be provided in the first mould 211' which is embodied as the upper mould adapted for mounting and holding the circuit board 11' in position. The light window forming block 214' and the base forming guide groove 215' can be formed in the second mould 212'. When the first mould 211' and the second mould 212' are in the closed-mould position, the molding chamber 213' is formed therebetween. The circuit board 11' in the upper mound is arranged toward an obverse side and the liquid molding material 14' is filled into the base forming guide groove 215' which is on a bottom side of the inverted circuit board 11', so that the molded base 12' is formed on the bottom side of the inverted circuit board 11'.

More specifically, when the first mould 211' and the second mould 212' are in the closed-mould position and perform the molding step, the light window forming block 214' is overlapped on the photosensitive area portion 1311' of the top surface 131' of the photosensitive element 13' and is firmly contacted with the photosensitive area portion 1311' of the top surface 131' of the photosensitive element 13', so that the liquid molding material 14' is prevented from entering the photosensitive area portion 1311' of the top surface 131' of the photosensitive element 13', so that the light window 122' of the molded base 12' is formed on the position of the light window forming block 214'.

It is understandable that, a molding surface of the first mould 211' forming the base forming guide groove 215' can be configured as a flat surface and in the same plane. Thus, when the molded base 12' is formed after solidification, a top surface of the molded base 12' is able to be made absolutely flat, so that the molded base 12' provides a flat mounting condition for the lens 30' or other supporting components of the lens 30', thereby reducing a tilt error of the assembled camera module 100'.

It is worth mentioning that the base forming guide groove 215' and the light window forming block 214' can be provided on the first mould 211' in a replaceable manner. In other words, the first mould 211' further comprises a detachable molding configuration, which is formed with the base forming guide groove 215' and the light window forming block 214'. Thus, different shapes and sizes of the base forming guide groove 215' and the light window forming block 214' are designed according to different shapes and sizes of the molded photosensitive assembly 10' such as with different diameters and thickness of the molded base. Thus, by replacing different molding configuration, the manufacturing equipment is adapted to be applied on different specification requirements for different molded photosensitive assemblies 10'. It is understandable that the second mould 212' can correspondingly comprise a detachable fixed block to provide different shapes and sizes of the circuit board positioning groove 2121' so as to facilitate the replacement of different shapes and sizes of the circuit board 11'.

It is understandable that the molding material 14' is a thermal fusible material such as a thermoplastic material. A melting and heating device turns the solid-state heat fusible material into the liquid molding material 14' by heating and melting. During the molding process, the hot and melted molding material 14' is solidified by a cooling process. The molding material 14' can also be a thermosetting material. The thermosetting material is heated and melted to turn into the liquid molding material 14' by the melting and heating device. During the molding process, the thermosetting molding material 14' is solidified by a further heating process, and the molding material 14' cannot be melted again after solidification, thereby forming the molded base 12'.

It is understandable that in the molding process of the present invention, the molding material 14' can be in the form of a block, a pellet, or a powder, which becomes liquid in the molding mould 210' after heating and is then cured to form the molded base 12' after solidification.

It is understandable that, according to the third embodiment, a molding process of the circuit board 11' is illustrated, wherein, in the application of the manufacturing equipment 200', a plurality of separated circuit boards 11' can be molded at the same time. Alternatively, a joint board array operation mentioned in the following embodiment is also adapted.

Figure 36A:
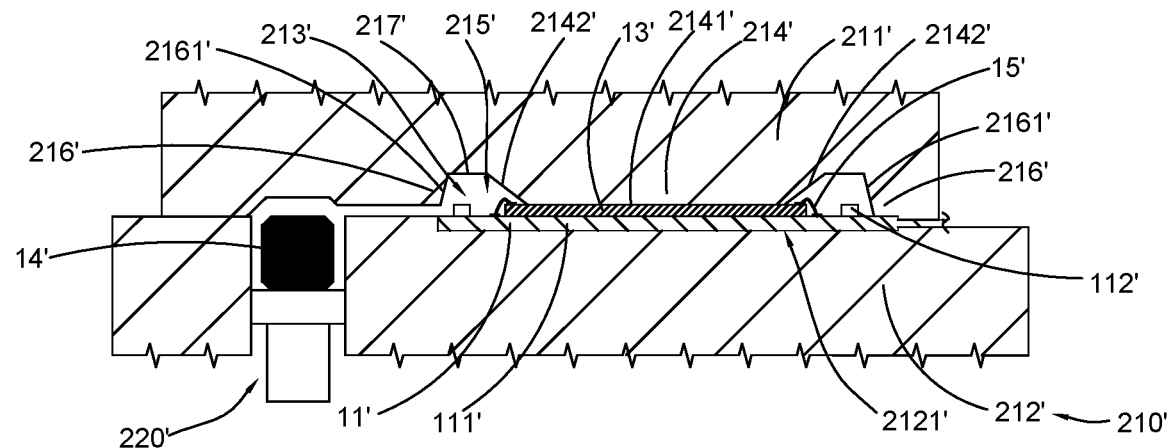
FIG. 36A is a cross-sectional view of the molded photosensitive assembly, along an A'-A' line of the FIG. 32, according to the above preferred embodiment of the present invention, illustrating that a liquid molding material is pushed into a base forming guide groove by a molding mould.
Figure 36B:
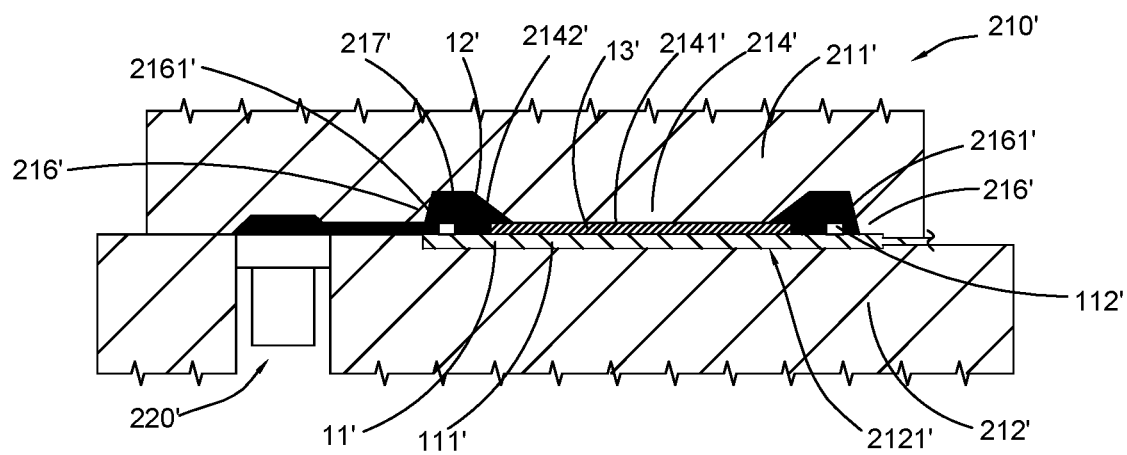
FIG. 36B is a cross-sectional view of the molded photosensitive assembly, along the A'-A' line of the FIG. 32, according to the above preferred embodiment of the present invention, illustrating that the molding mould of a manufacturing equipment performs the molding process to form a molded base.
Figure 36C:
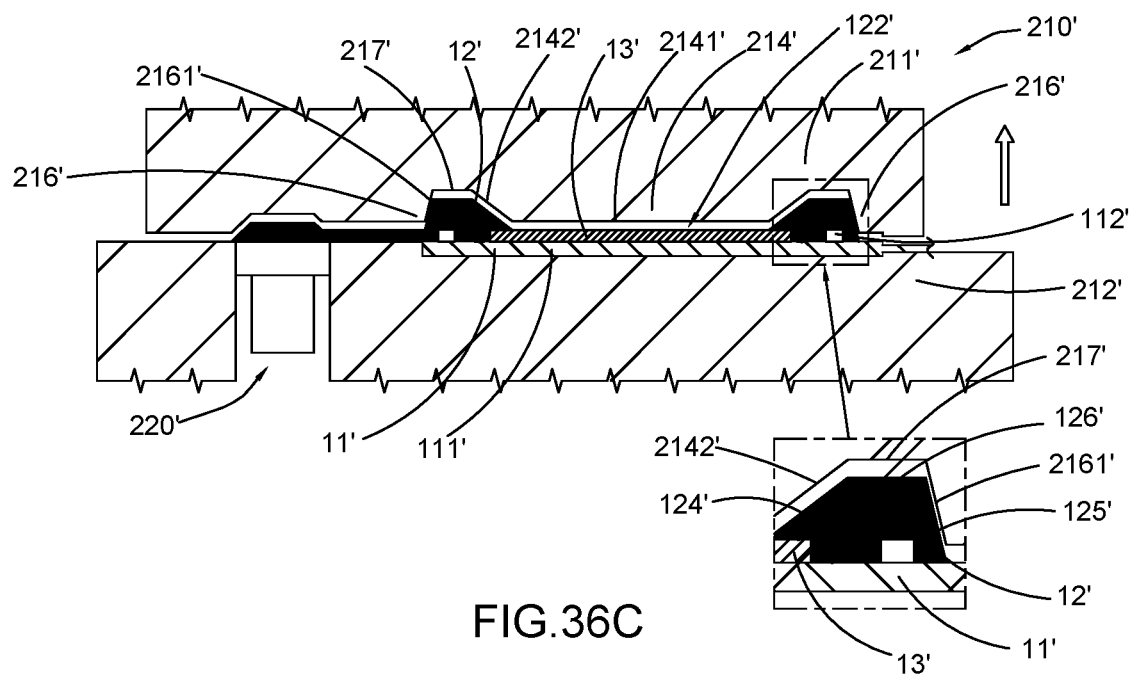
FIG. 36C is a cross-sectional view illustrating a demoulding process of the molded photosensitive assembly according to the above third preferred embodiment of the present invention.

Referring to FIG. 36A to FIG. 36C of the drawings, a manufacturing process of the molded photosensitive assembly 10' of the camera module 100' according to the preferred embodiment of the present invention is illustrated. As shown in FIG. 36A of the drawings, the molding mould 210' is in the closed-mould position, the circuit board 11' which is about to be molded and the solid molding material 14' are placed in position therein. The solid molding material 14' is heated and melted into a liquid state or into a semi-solid state, which is pressured to fill into the base forming guide groove 215' until reaching around the light window forming block 214'.

As shown in FIG. 36B of the drawings, when the base forming guide groove 215' is filled with the liquid molding material 14', the liquid molding material 14' is solidified to form the molded base 12' which is integrally formed on the circuit board 11' and the photosensitive element 13'. Take the molding material 14' being embodied as a thermosetting material as an example, in the embodiment of the present invention, the heated and melted liquid molding material 14' is solidified after being heated.

As shown in FIG. 36C of the drawings, after the molding material 14' is cured to form the molded base 12', a demoulding process is performed. In the demoulding process, the mould fixing unit 230' moves the first mould 211' and the second mould 212' away from each other to the opened-mould position, thus the light window forming block 214' is departed from the molded base 12' and the light window 122' is formed in the molded base 12'.

In the prior art, as shown in FIG. 1B of the drawings, it is generally a non-practical concept for mass production because a bottom of the square-shaped molding block 4 has a sharp edge. During the demoulding process, the sharp edge produces a large friction with the inner surface of an encapsulation portion 1 that results in damaging the inner surface of the encapsulation portion 1. However, according to the present invention, the light window forming block 214' of the present invention is configured that the molded base 12' will not be damaged during the demoulding process.

More specifically, according to the above embodiment of the present invention, as shown in FIG. 36A to FIG. 36C of the drawings, the light window forming block 214' has a trapezoid cross section. In other words, the light window forming block 214' has a pyramidal cross section with a transversal size gradually reduced along a longitudinal axis, and the light window forming block 214' is a solid body or a hollow body covered on the photosensitive element 13' in order to facilitate the subsequent molding process.

In the embodiment of the present invention, the light window forming block 214' is a solid structure. The light window forming block 214' has a press-fit surface 2141' on its bottom side and a peripheral molding surface linearly extended along the circumferential direction, functioning as a base inner side surface forming surface 2142'. The included angle between the base inner side surface forming surface 2142' and a vertical (longitudinal) line is defined as a first included angle, which is an acute angle, while the conventional included angle as shown in FIGS. 1B and 1C is 0 degree. More specifically, the angular range of the first included angle is preferably 10° to 80°, and more preferably 30° to 55°.

Figure 33:
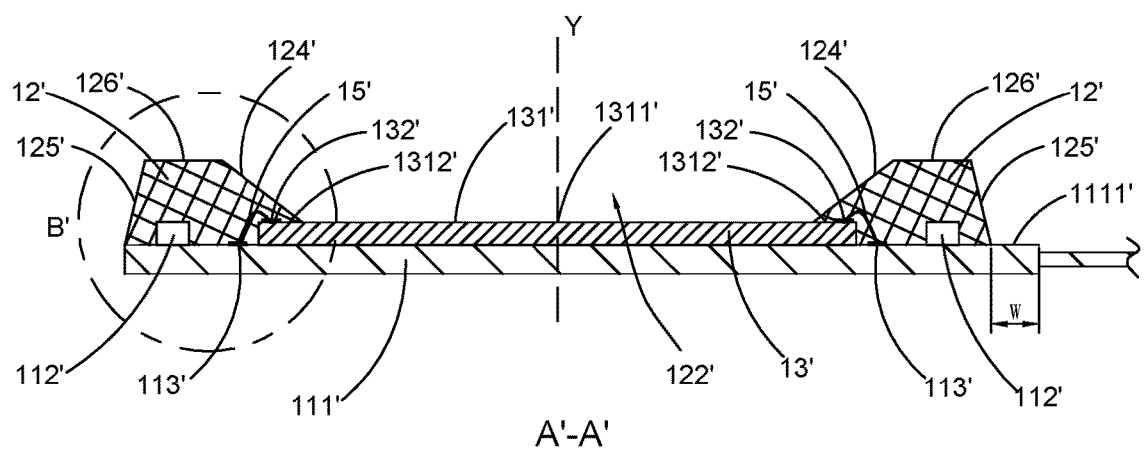
FIG. 33 is a cross-sectional view of the molding mould of the camera module, along an A'-A' line of FIG. 32, according to the above third preferred embodiment of the present invention.
Figure 34:
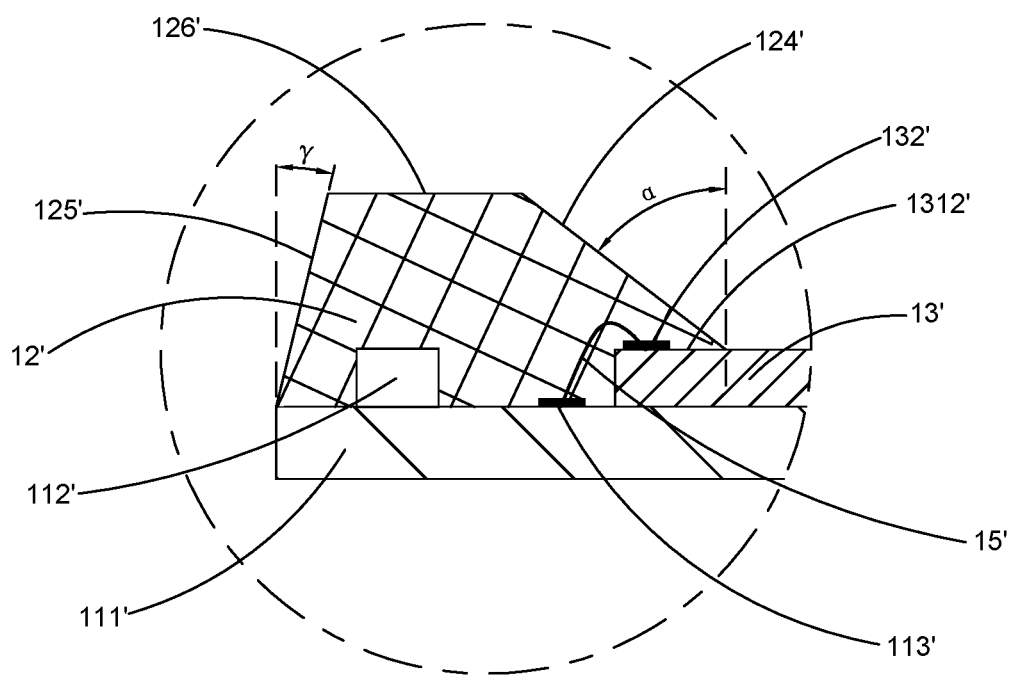
FIG. 34 is a partially enlarged sectional view illustrating an inclination angle, which is convenient for demoulding of the camera module according to the above third preferred embodiment of the present invention.

Accordingly, as shown in FIG. 33 and FIG. 34 of the drawings, the annular molding body 121' of the molded base 12' of the molded photosensitive assembly 10' of the camera module 100' has a linearly extended inner side surface 124'. A first inclination angle α is defined between the inner side surface 124' and a longitudinal line direction of the optical axis Y of the photosensitive element 13' of the molded photosensitive assembly 10', wherein the first inclination angle α is the same as the first included angle correspondingly, which angular range is preferably 10° to 80°, and more preferably 30° to 55°.

The first inclination angle α is not supposed to be as large as possible. As shown in FIG. 34 of the drawings, the photosensitive element 13' is electrically connected to the circuit board 11' by a set electrical connection means. More specifically, each of the electrical connection means comprises a photosensitive element connecting pad 132' provided on the non-photosensitive area portion 1312' of the photosensitive element 13', a circuit board connecting pad 113' provided on the base board 111' of the circuit board 11' and a lead wire 15' extended and electrically connected between the photosensitive element connecting pad 132' and the circuit board connecting pad 113', so that the photosensitive element 13' and the circuit board 11' are electrically conducted and connected. The lead wires 15' are illustratively but not limited to gold wire, silver wire, copper wire, aluminum wire, and the like. The shapes of the photosensitive element connecting pad 132' and the circuit board connecting pad 113' are illustratively but not limited to squares, spheres, and the like. The base inner side surface forming surface 2142' of the light window forming block 214' should not have any contact with the lead wires 15'. i.e. must not extend to exceed a highest point of each of the lead wires 15' in the molding process as shown in FIG. 36A. The maximum value of the first inclination angle α differs depending on the manner of the wire bonding process, which will be further specifically analyzed in the following specific examples. Therefore, the light window forming block 214' will not crush the lead wires 15' to cause breakage of the lead wires 15' when the light window forming block 214' is in contact with the photosensitive element 13' in the molding process as shown in FIG. 36A.

As shown in FIG. 36A of the drawings, the light window forming block 214' has a trapezoidal cross section that gradually reduces its transverse size from the bottom to the top thereof. Correspondingly, the light window 122' formed in the molded base 12' has a trapezoidal cross section that gradually increases its transverse size from the bottom to the top thereof. The angular range of the first inclination angle α is preferably from 10° to 80°, and more preferably is 30° to 55°, so as to facilitate the demoulding process without damaging the lead wires 15'. In addition, the light window 122' of the molded base 12' having a trapezoidal cross section can save molding material while ensuring desired strength of the molded base 12'.

Figure 35:
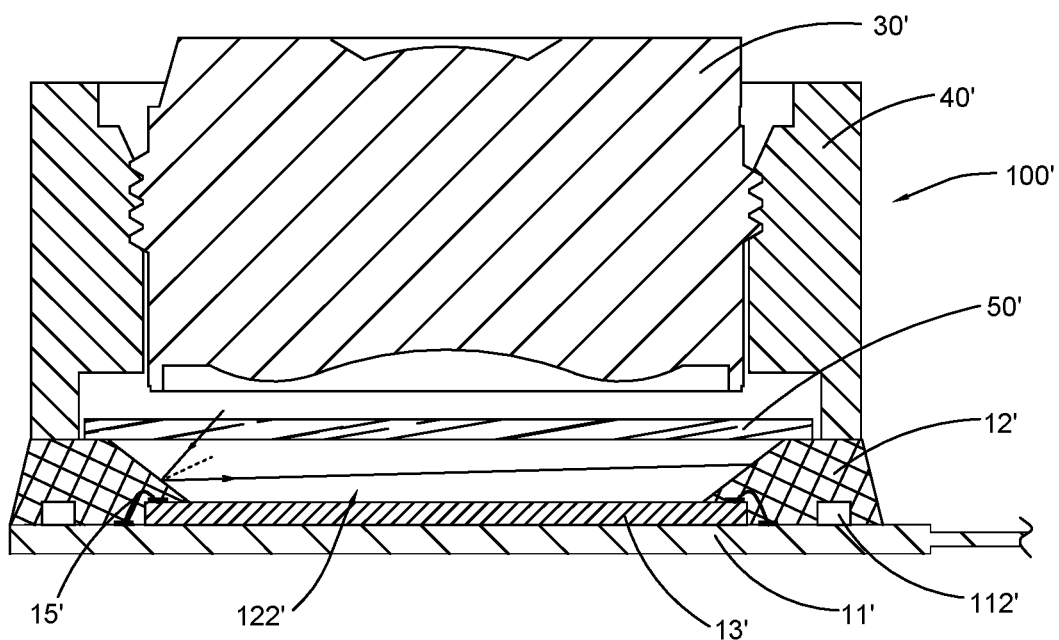
FIG. 35 is a cross-sectional view illustrating the avoiding stray lights of the camera module according to the above third preferred embodiment of the present invention.

It is worth mentioning that it is also possible to effectively avoid the stray light by selecting the right angular range of the first inclination angle α according to the present invention. As shown in FIG. 1E of the drawings according to the conventional packaged camera module, the incident light through a lens has a portion reaching a photosensitive chip for light-receiving process while other portion of the incident light, such as the light beam as shown in FIG. 1E, is projected onto the longitudinal inner walls of the encapsulation portion 1, which is easily reflected by the inner wall of the encapsulation portion 1 to reach the photosensitive chip 3 for photoelectric conversion process of the photosensitive chip 3, thereby adversely affecting imaging quality of the conventional camera module with reflected stray light. However, according to this preferred embodiment of the present invention, as shown in FIG. 35 of the drawings, incident light through the lens 30' has a major portion reaches the photosensitive element 13'. Other portion of the incident light, such as the light beam as shown in FIG. 35 in the same direction and angle of the light beam in FIG. 1E, is projected onto the inner side surface 124' of the molded base 12' and is reflected out by the inner side surface 124' of the molded base 12' to the other side of the inner side surface 124', wherein the reflected light is distant from the photosensitive element 13' without reaching the photosensitive element 13' to prevent any photoelectric conversion process therefor by the photosensitive element 13', thereby reducing the influence of reflected stray light on the imaging quality of the camera module 100'.

It is worth mentioning that, in this preferred embodiment of the present invention, the material surface of the molded base 12' has a reflectivity of less than 5% in the wavelength range of 435-660 nm. In other words, most of the incident light projecting on the surface of the molded base 12' cannot be reflected to form the interference stray light reaching the photosensitive element 13', thereby remarkably reducing the influence of reflected stray light according to the present invention.

In addition, as shown in FIGS. 33 and 34 of the drawings, the molded base 12' has the inner side surface 124' extended along an inner circumferential direction thereof, an outer side surface 125' extended along an outer circumferential direction thereof, and an annular top side surface 126'. The inner side surface 124' is extended outwardly and integrally from the top surface 131' of the photosensitive element 13'. The outer side surface 125' is extended inwardly and integrally from the base board 111' of the circuit board 11'.

As shown in FIGS. 36A to 36C, the first mould 211' of the molding mould 210' is further provided with one or more dividing blocks 216' for forming the outer side surface 125' of the molded base 12' during the molding process. More specifically, the dividing blocks 216' has a base outer side surface forming surface 2161' to determine a position and shape of the outer side surface 125' of the molded base 12' which is formed by the molding material 14' after solidification in the molding process. A top surface forming surface 217' is formed between the dividing blocks 216' and the light window forming block 214' to determine a position and shape of the top side surface 126' of the molded base 12' which is formed by the molding material 14' after solidification in the molding process.

In the prior art, as shown in FIGS. 1A to 1E, the outer surface of the encapsulation portion 1 is also perpendicular to the circuit board. In other words, a base outer surface forming surface of a partition block of the conventional mould is vertically oriented so that during the demoulding process, the base outer surface forming surface of the partition block of the conventional mould is always rubbed against the encapsulation portion 1, so that the demoulding process is inconvenient to operate, especially in mass production, and the outer side surface of the encapsulation portion 1 is easily damaged that results in great amount of defective products.

Figure 46:
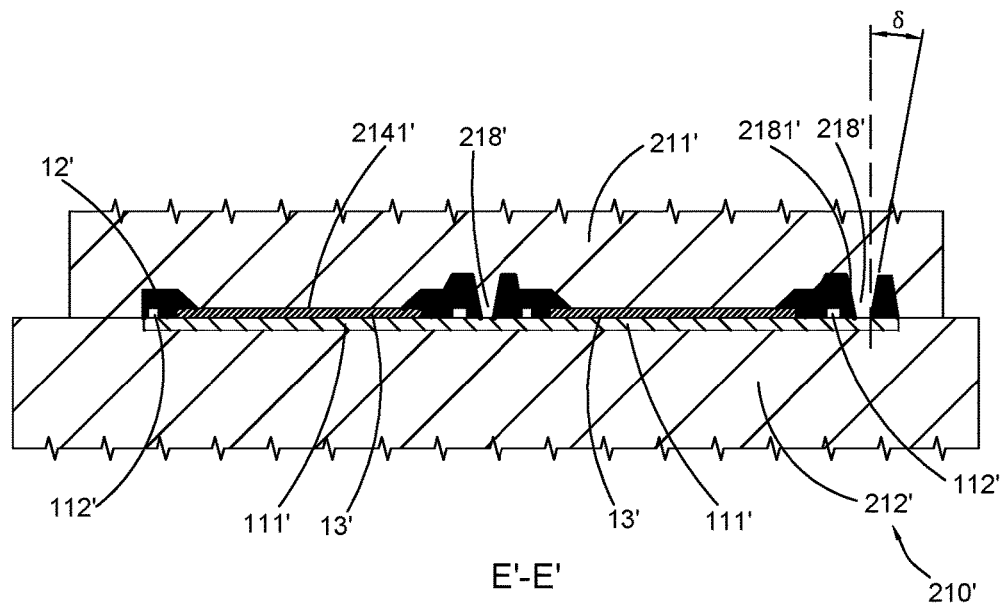
FIG. 46 is a cross-sectional view of the molded photosensitive assembly, along an E'-E' line of the FIG. 41, according to the above fourth preferred embodiment of the present invention, illustrating that the molding mould performs the molding process to form an integral piece of molded base array.

However, according to the preferred embodiment of the present invention, the base outer side surface forming surface 2161' further has a second included angle with respect to a longitudinal direction. Correspondingly, a second inclination angle γ is defined between the outer side surface 125' of the molded base 12' and the optical axis Y direction, having the same angle of the second included angle, as shown in FIG. 46. In other words, when the molded base 12' is horizontally arranged, the outer side surface 125' of the molded base 12' defines the second inclination angle γ with respect to the vertical (longitudinal) line. For ease of demoulding, the second inclination angle γ is an acute angle and the second inclination angle γ cannot be too large as the top side surface 126' of the molded base 12' is needed to have a sufficient size to facilitate the subsequent installment of the lens 30' or the lens actuator 40'. In other words, if the second inclination angle γ is too large and the inner side surface 124' and the outer side surface 125' of the molded base 12' are both inclinedly extended upwardly, the size of the top side surface 126' will be too small to securely install the lens 30' or the lens actuator 40'. In addition, in this embodiment, the bottom portion of the lens actuator 40' has a mating surface which fits to the top side surface 126' of the molded base 12'. When the top side surface 126' of the molded base 12' has a too small dimension, for example, less than the mating surface, it is inconvenient for the alignment of the lens actuator 40' that, when the lens actuator 40' is mounted on the top side surface 126' of the molded base 12', the lens actuator 40' may be shaken and not stable, and the lens actuator 40' is unable to prevent crashing or be anticollision. Accordingly, according to a preferred embodiment of the present invention, the numerical maximum of the second inclination angle γ is preferably not more than 45°. In addition, with a numerical minimum of the second inclination angle γ, the demoulding operation of the molding process can be facilitated and the manufacturing of the molding mould 210' can also be facilitated. Therefore, the numerical minimum of the second inclination angle γ is preferably not smaller than 3°. Therefore, the angular range of the second inclination angle γ in the embodiment of the present invention is suitably 3° to 45°, more preferably 3° to 15°. It is worth mentioning that, as shown in FIG. 33 of the drawings, a press-fit distance W is formed on an outer edge of the base board 111' of the circuit board 11' and the outer side surface 125' of the formed molded base 12', so that it facilitates the demoulding and to press-fit the base board 111' of the circuit board 11'. In other words, in the molding process, the dividing blocks 216' are suitable to press-fit on the region of the base board 111' of the circuit board 11', the press-fit distance W is a distance from a position which is the outer side surface 125' of the molded base 12' extended from the base board 111' of the circuit board 11' to the outer edge of the base board 111' of the circuit board 11'. For example, the press-fit distance W has a range of 0.1 to 10 mm, preferably 0.1 to 0.6 mm. In a specific example, the press-fit distance W is 0.5 mm.

It is understandable that because of the first inclination angle α and the second inclination angle γ and, in other words, as the inner side surface 124' and the outer side surface 125' of the molded base 12' having inclinations, during the demould process, the friction between molded base 12' and the first mould 211' is reduced and the molded base 12' is much easier to be drafted out, such that the molded base 12' has a better molding state. More specifically, as shown in FIG. 36C of the drawings, when the molded base 12' is cured and formed in the molding process and, in the demoulding process, the light window forming block 214' and the dividing blocks 216' begin to move vertically and upwardly, the base inner side surface forming surface 2142' of the light window forming block 214' and the base outer side surface forming surface 2161' of the dividing blocks 216' are respectively separated with the inner side surface 124' of the molded base 12' and the outer side surface 125' of the molded base 12', so that the base inner side surface forming surface 2142' of the light window forming block 214' and the base outer side surface forming surface 2161' of the dividing blocks 216' are not respectively in friction contact with the inner side surface 124' of the molded base 12' and the outer side surface 125' of the molded base 12', thereby avoiding damages to the inner side surface 124' and the outer side surface 125' of the molded base 12' and at the same time facilitating a smooth drafting of the molded base 12'.

At the same time, the shape of the base forming guide groove 215' formed by the molding mould 210' is at an appropriate gradient without a right-angled corner in such a manner that the fluid form molding material 14' entering into the base forming guide groove 215' has a better liquidity. Furthermore, the first inclination angle α and the second inclination angle γ are acute angles, unlike the prior art right-angle configuration, so that the angle of the top surface 131' of the photosensitive element 13' of the molded photosensitive assembly 10' and the inner side surface 124' of the molded base 12' becomes a relatively rounded obtuse angle. The light window forming block 214' and the dividing blocks 216' do not form sharp edges and corners to scratch the inner side surface 124' and the outer side surface 125' of the molded base 12'. Furthermore, the angular range of the first inclination angle α enables the molded base 12' to prevent the stray light from adversely affecting the image quality of the camera module 100'.

Figure 37:
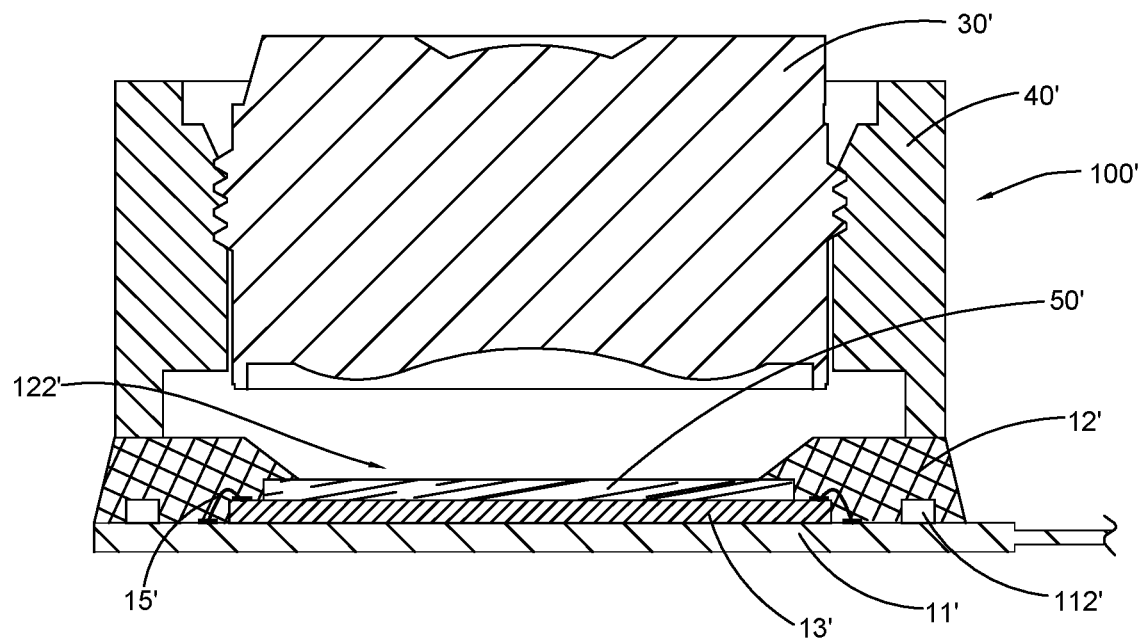
FIG. 37 is a cross-sectional view of a molded photosensitive assembly according to an alternative mode of the above third preferred embodiment of the present invention.
Figure 38:
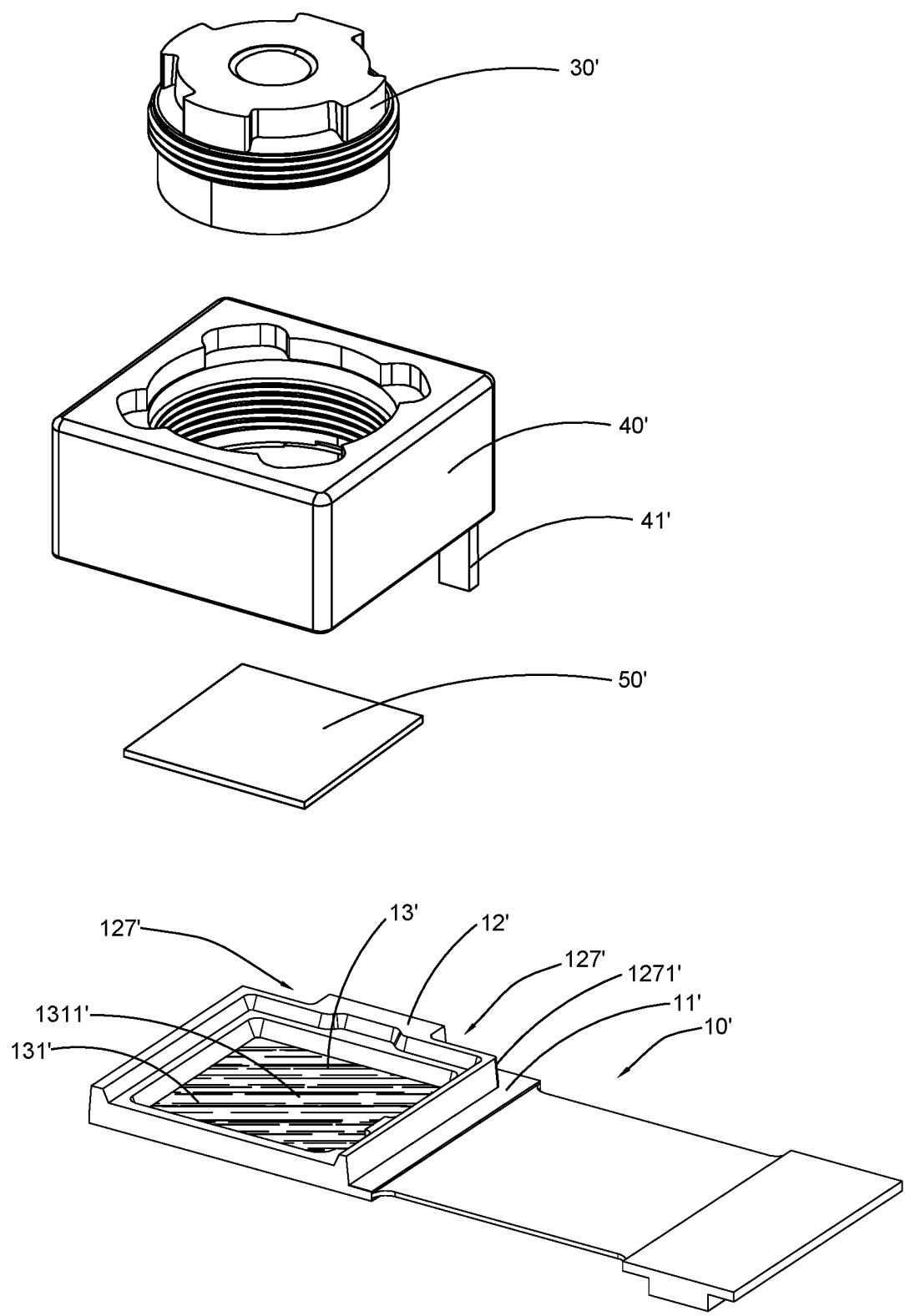
FIG. 38 is an exploded perspective view of a molded photosensitive assembly according to a fourth preferred embodiment of the present invention.
Figure 39:
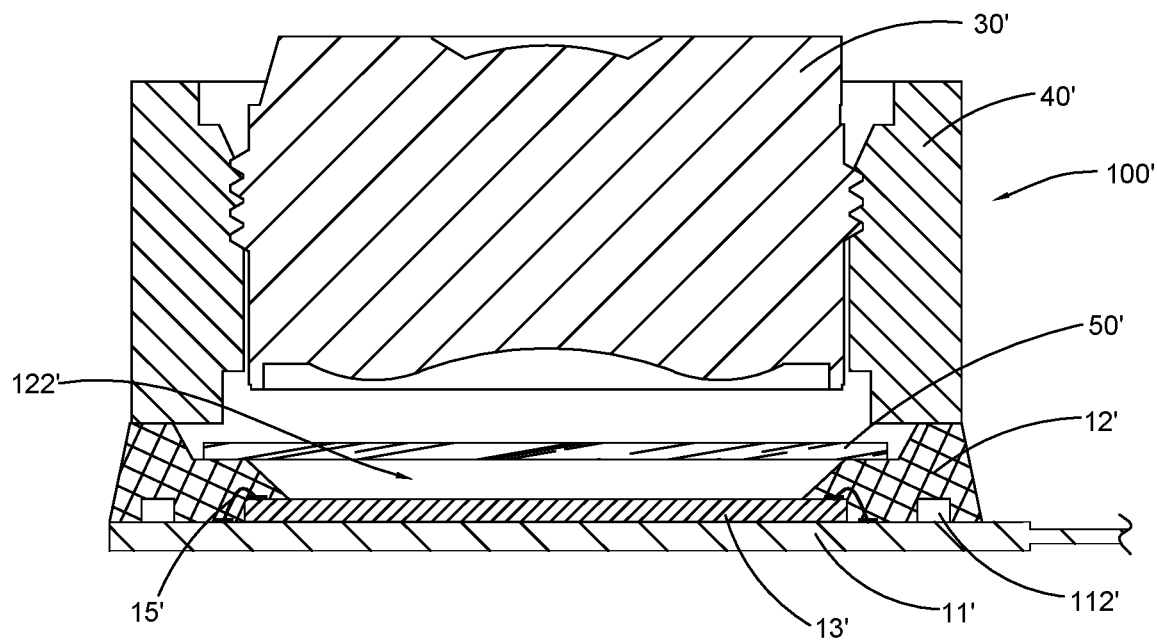
FIG. 39 is a cross-sectional view of the camera module along an axial direction according to the above fourth preferred embodiment of the present invention.

As shown in FIG. 37 of the drawings, according to another alternative mode of the present invention, an optical filter 50' is overlapped on the photosensitive element 13', and then the molded base 12' is integrally molded on the circuit board 11' and extended to the periphery edges of the optical filter 50' and the photosensitive element 13' so that the optical filter 50', the photosensitive element 13' and the molded base 12' of the circuit board 11' are integrally combined together by the molding process of the present invention.

Referring to FIG. 38 to FIG. 49 of the drawings, the molded photosensitive assembly 10' of the camera module 100' and the manufacturing process thereof according to a fourth preferred embodiment of the present invention are illustrated. In this embodiment of the present invention, an integral piece of molded photosensitive assembly array 1000' can be manufactured by a joint board array operation, and the molded photosensitive assembly 10' is obtained by cutting the integral piece of molded photosensitive assembly array 1000'.

Accordingly, more specifically, the molding chamber 213' is formed when the molding mould 210' is in the closed-mould position, and a plurality of the light window forming blocks 214 and one or more integral base array forming guide grooves 2150' are provided. In other words, a plurality of the base forming guide grooves 215 communicated with each other is provided and these base forming guide grooves 215' form an overall guiding groove.

Before the molding process, an integral piece of circuit board array 1100' is manufactured in advance. The integral piece of circuit board array 1100' comprises a plurality of circuit boards 11' integrally connected with each other, and each of the circuit boards 11' is electrically connected to the photosensitive element 13' by lead wires.

When the integral piece of circuit board array 1100' with a plurality of the photosensitive elements 13' is put into the molding chamber 213' and the molding mould 210' is in the closed-mould position, the solid molding material 14' is heated to melt and is pressured to enter each of the integral base array forming guide grooves 2150', thereby the liquid molding material 14' is filled around each of the light window forming blocks 214'. Finally, during a solidifying process, the liquid molding material 14' in the integral base array forming guide groove 2150' is solidified and hardened to form the molded bases 12' each of which is integrally molded on each of the circuit boards 11 of the integral piece of circuit board array 1100' and the photosensitive element 13'. These molded bases 12' form an overall integral piece of molded base array 1200'.

Figure 44:
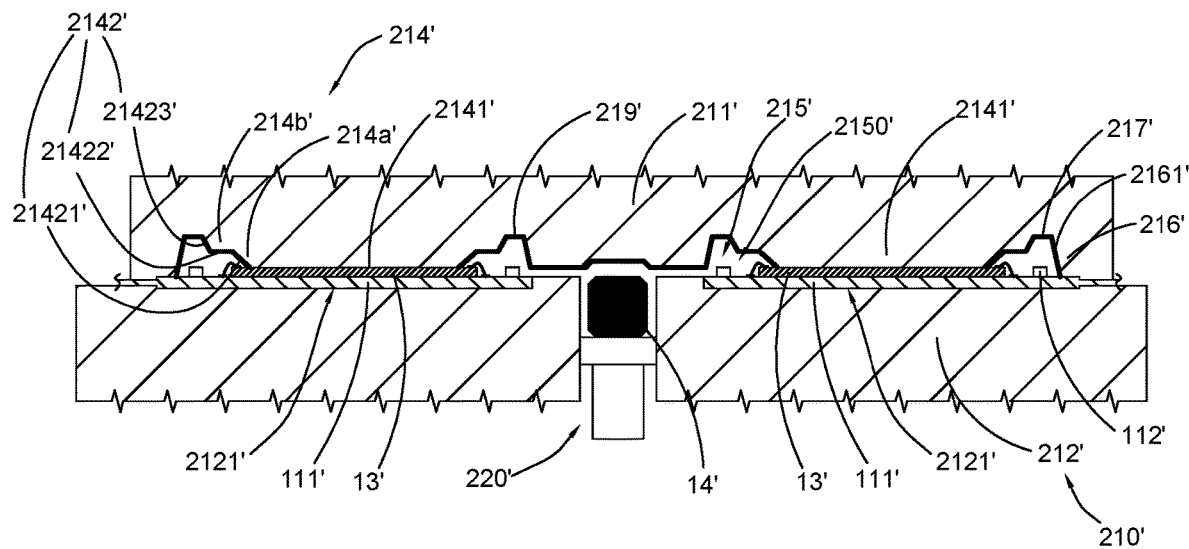
FIG. 44 is a cross-sectional view of the molded photosensitive assembly, along a C'-C' line of the FIG. 41, according to the above fourth preferred embodiment of the present invention, illustrating that a liquid molding material is pushed into a base forming guide groove by a molding mould.

The molding surface of the first mould 211' contacted with the circuit board 11' and the photosensitive element 13' is also provided with an elastic film layer 219', as shown in FIG. 44, so that the molding surface of the first mould 211' is firmly contacted with the circuit board 11' and the photosensitive element 13' that is convenient for demoulding.

It is worth mentioning that when each of the separated molded photosensitive assemblies 10' is manufactured by cutting the integral piece of molded photosensitive assembly array 1000' to manufacture the auto-focus camera module, the molding mould 210' further comprises a plurality of lens actuator pin groove forming blocks 218'. Each of the lens actuator pin groove forming blocks 218' is extended in the respective integral base array forming guide groove 2150', so that in the molding process, the liquid molding material 14' is not filled in the positions corresponding to the lens actuator pin groove forming blocks 218', and thus after a solidifying step, a plurality of the light windows 122' and a plurality of the lens actuator pin grooves 127' are formed in the integral piece of molded base array 1200' of the integral piece of molded photosensitive assembly array 1000', wherein the molded base 12' of each of the separated molded photosensitive assembly 10' obtained by cutting is provided with the lens actuator pin grooves 127'. Therefore, during the camera module 100' is being manufactured, a lens actuator pin 41' of the lens actuator 40' is electrically connected to the circuit board 11' of the molded photosensitive assembly 10' by welding or by attaching through a conducting resin.

It is understandable that, in comparison with the manufacturing process of the separated molded photosensitive assembly 10' in the above first embodiment of the present invention, in the joint board array operation, two adjacent base forming guide groove 215' forming two molded bases 12' are jointed together while the plurality of the light window forming blocks 214' are spaced with each other, so that the molding material 14' eventually forms the integral piece of molded base array 1200' with an overall configuration.

In the step of manufacturing the separated molded photosensitive assembly 10', the integral piece of molded photosensitive assembly array 1000' is cut into a plurality of molded photosensitive assemblies 10' to manufacture a plurality of independent single camera modules respectively. Alternatively, separate two or more molded photosensitive assemblies 10' which are combined with each other from the integral piece of molded photosensitive assembly array 1000' can be separated and manufactured by cutting so as to manufacture a split type camera module array. In other words, each of the camera modules of the camera module array respectively has an individual molded photosensitive assembly 10', wherein two or more molded photosensitive assemblies 10' are respectively and electrically connected to a controlling mainboard of the same electric device. Thus, the camera module array manufactured by two or more molded photosensitive assemblies 10' transmits the images captured by the camera modules to the controlling mainboard for graphic information processing.

Figure 50:
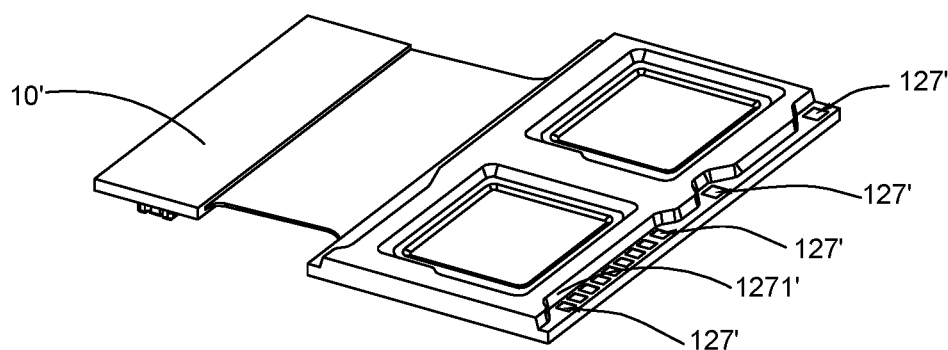
FIG. 50 is a cross-sectional view of a molded photosensitive assembly according to an alternative mode of the above fourth preferred embodiment of the present invention.

As shown in FIG. 50 of the drawings, the molding process of the joint board array operation also can be used to make a molded photosensitive assembly 10' with two or more light window 122', wherein the molded photosensitive assembly 10' can be used to manufacture a camera module array sharing a same base board. In other words, taking the molded photosensitive assembly 10' of an array of double camera modules as an example, for each of the circuit boards 11 of the integral piece of circuit board array 1100' in the molding process, one base board 111' is correspondingly provided with two light window forming blocks 214'. The light window forming blocks 214' are spaced with each other and two base forming guide grooves which are communicated with each other are disposed around the light window forming blocks 214'. Therefore, after the molding process, the circuit board 11' together form an integral molded base which shares one base board 111' and has two light windows 122', wherein two photosensitive elements 13' and two lenses 30' are correspondingly mounted thereon respectively. Furthermore, the base board 111' of the circuit board 11' can be electrically connected to a controlling board of an electric device, and thus camera module array manufactured in this embodiment transmits the images captured by the camera modules to the controlling mainboard for graphic information processing.

Figure 51:
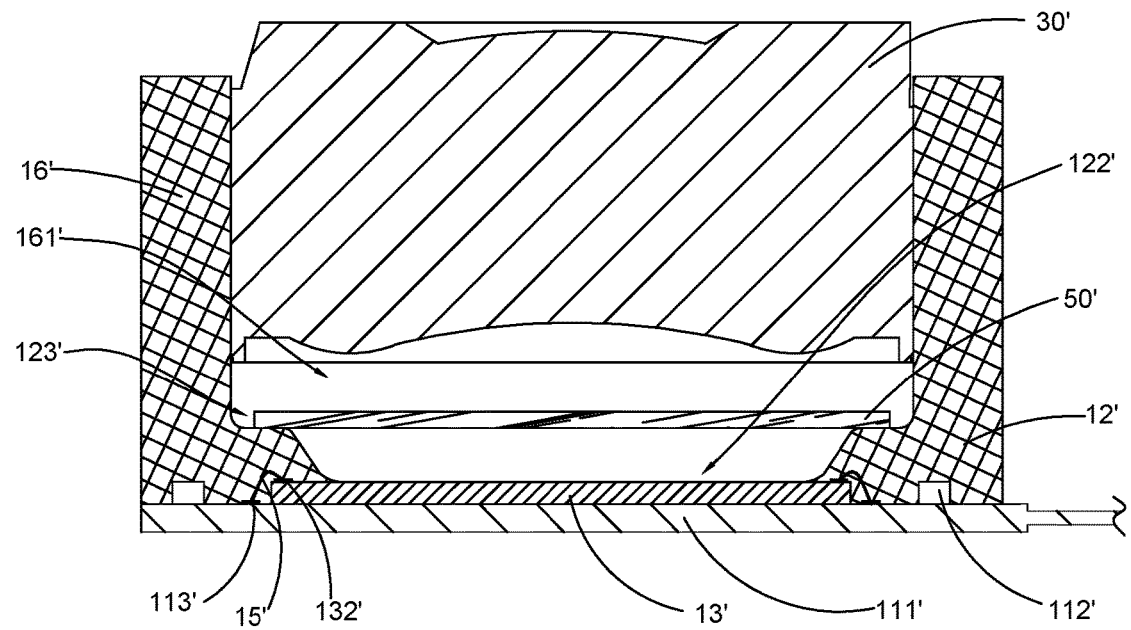
FIG. 51 is a cross-sectional view of a molded photosensitive assembly according to an alternative mode of the above fourth preferred embodiment of the present invention.

As shown in FIG. 51 of the drawings, according to an alternative mode of the above preferred embodiments of the present invention, the molded base 12' is integrally extended upwardly to form a lens mounting portion 16'. The lens mounting portion 16 has a through hole 161 for mounting the lens 30'. It is worth mentioning that the light window forming block 214' and the dividing blocks 216' also may have an arc-shaped chamfering transition in each of the angular positions so as to form an arc-shaped corner edge between the lens mounting portion 16' and the molded base 12' as well as an arc-shaped inner bottom edge of the molded base 12 to further prevent damage to the formed molded base 12' during demoulding.

Figure 52:
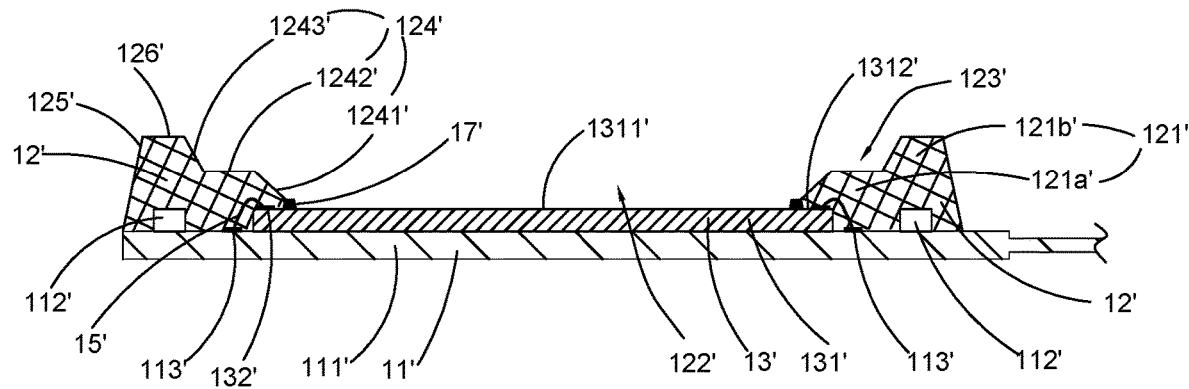
FIG. 52 is a cross-sectional view of a molded photosensitive assembly according to an alternative mode of the above fourth preferred embodiment of the present invention.

As shown in FIG. 52 of the drawings, according to another alternative mode of the present invention, before the molding process, the photosensitive element 13' is provided with an annular blocking element 17'. The blocking element 17' is elastic and attached or coated on the non-photosensitive area portion 1312' of the top surface 131' of the photosensitive element 13'. Accordingly, in the molding process, the light window forming block 214' is press-fit onto the blocking element 17' to prevent the molding material 14' from entering the photosensitive area portion 1311' of the photosensitive element 13', and the press-fit surface 2141' of the light window forming block 214' is separated with the photosensitive element 13', so that the press-fit surface 2141' of the light window forming block 214' will not damage the photosensitive area portion 1311' of the photosensitive element 13'. In some embodiments, the blocking element 17' has a square ring shape and is implemented as an adhesive step form. In other words, the non-photosensitive area portion 1312' of the top surface 131' of the photosensitive element 13' is coated or painted in the non-photosensitive area portion 1312' of the top surface 131' of the photosensitive element 13' by adhesive element which will be cured to form the blocking element 17'.

Figure 53:
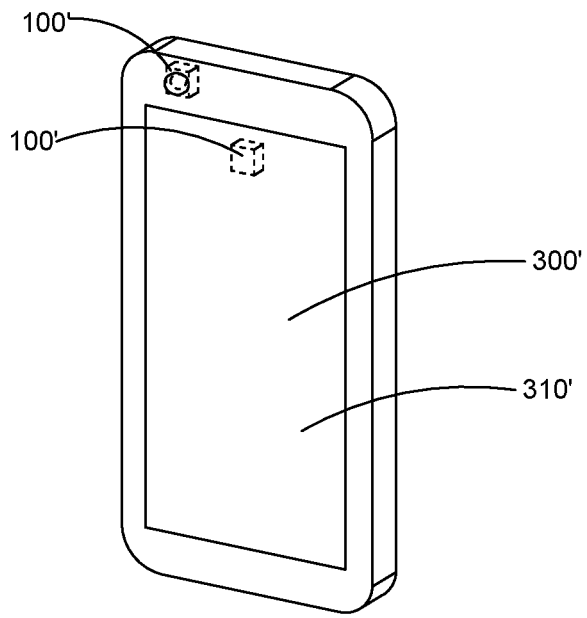
FIG. 53 is a schematic view of the above camera module applied on a mobile phone according to the above embodiments of the present invention.

Referring to FIG. 39 to FIG. 43 of the drawings, the camera module 100', according to a fourth preferred embodiment of the present invention is further illustrated. The camera module 100' comprises the molded photosensitive assembly 10'. The molded photosensitive assembly 10' comprises the circuit board 11', the molded base 12' and the photosensitive element 13'. The camera module 100' further comprises the lens 30'. The molded base 12' comprises the annular molding body 121' and has the light window 122' formed in a central portion thereof to provide a light path for the lens 30' and the photosensitive element 13'. The photosensitive element 13' is operatively connected to the circuit board 11'. For example, the photosensitive element 13' is electrically connected to the circuit board 11' by the lead wires 15' in a COB process, and the photosensitive element 13' is positioned on a top side of the circuit board 11'. The photosensitive element 13' and the lens 30' are respectively assembled on two sides of the molded base 12' and are optically aligned in such a manner that the light passing through the lens 30' is able to reach the photosensitive element 13' via the light window 122', so that the camera module 100' is able to provide an optical image through a photoelectric conversion action. As shown in FIG. 53 of the drawings, the camera module 100' applied on an intelligent electronic device 300' is illustrated. For example, the camera module 100' is applied on a mobile phone and is arranged along a thickness direction of the body 310' of mobile phone. In addition, one or more camera modules 100' can be assembled in the front and the back of the mobile phone.

Figure 40:
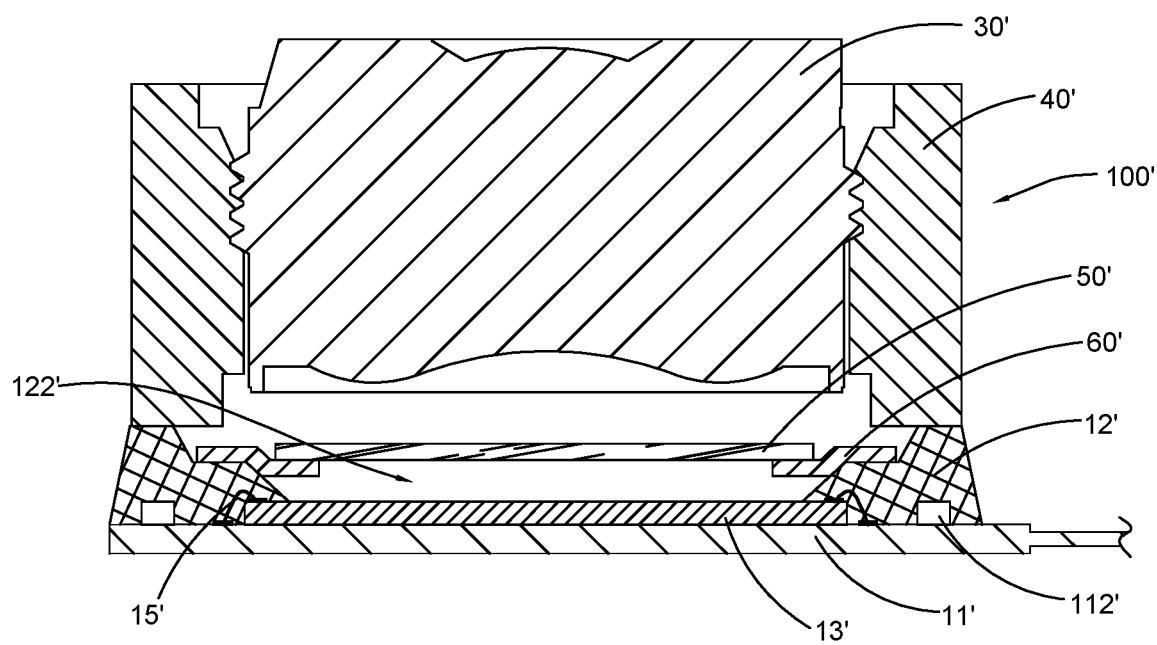
FIG. 40 is a cross-sectional view of the camera module according to an alternative mode of the above fourth preferred embodiment of the present invention.
Figure 41:
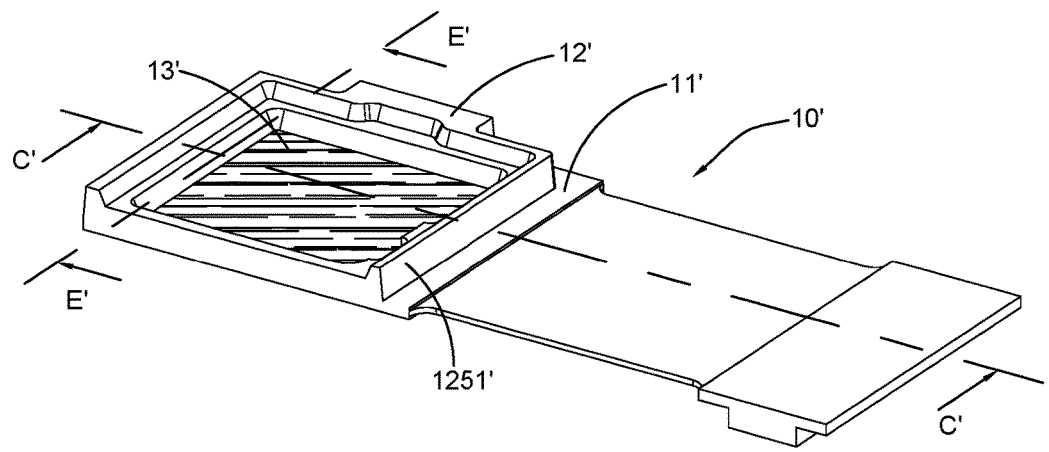
FIG. 41 is a perspective view of a molded photosensitive assembly of the camera module assembled according to the above fourth preferred embodiment of the present invention.

The difference between the first embodiment and this fourth embodiment of the present invention is that a top groove 123' is formed on a top side of the molded base 12' for mounting the optical filter 50'. Alternatively, as shown in FIGS. 40 and 42 of the drawings, the top groove 123' is used to support an additional optical filter holder 60' for mounting the optical filter 50'.

Accordingly, the circuit board 11' comprises a base board 111' and a plurality of electronic components 112'. The plurality of electronic components 112' is formed on the base board 111' using a technology such as the surface mount technology. The photosensitive element 13' has a top surface 131'. The top surface 131' has a photosensitive area portion 1311' in the center and a non-photosensitive area portion 1312' around the photosensitive area portion 1311'. The molded base 12' is integrally molded on the circuit board 11' and at least one portion of the non-photosensitive area portion 1312', and the molded base 12' is also molded to encapsulate the electronic components 112'.

The molded base 12' has an inner side surface 124', an outer side surface 125' and a top side surface 126'. In other words, the inner side surface 124' is formed along the inner circumferential direction of the molded base 12' and the outer side surface 125' is formed along the outer circumferential direction of the molded base 12' while the annular top side surface 126' defines a shape of the annular molding body 121'.

Figure 42:
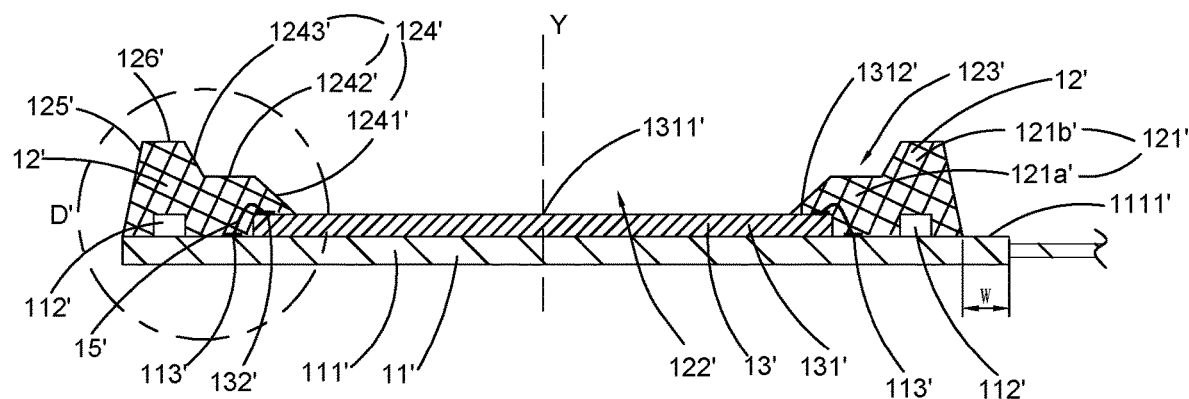
FIG. 42 is a cross-sectional view of the molding mould of the camera module, along a C'-C' line of FIG. 41, according to the above fourth preferred embodiment of the present invention.

In this embodiment, as shown in FIG. 42, the inner side surface 124' of the molded base 12' is not a linearly extended flat inner surface, but a curved extending inner surface. More specifically, the inner side surface 124' further has a first portion inner side surface 1241', a second portion inner side surface 1242' and a third portion inner side surface 1243' integrally extended. As shown in the drawings, taking the arrangement which is in a vertical (longitudinal) direction of the camera module 100' as an example, the first portion inner side surface 1241' is integrally and inclinedly extended from the non-photosensitive area portion 1312' of the photosensitive element 13', the second portion inner side surface 1242' is basically extended from the first portion inner side surface 1241' along a horizontal (transversal) direction, the third portion inner side surface 1243' is integrally and inclinedly extended from the second portion inner side surface 1242'. The annular molding body 121' of the molded base 12' is correspondingly formed with a base station portion 121a' on a bottom side, and a step portion 121b' which is integrally extended from the base station portion 121a'. The step portion 121b' forms an overall integral annular step, or the step portion 121b' is multi-section type such as three-section type and one side of the molded base 12' has no step protrusion. The step portion 121b' has a relative smaller width than the base station portion 121a'. The inner surface of the base station portion 121a' is the first portion inner side surface 1241' of the inner side surface 124' of the molded base 12', the inner surface of the stair portion 121b' is the third portion inner side surface 1243' of the inner side surface 124' of the molded base 12' and the top surface of the stair portion 121b' is the top side surface 126' of the molded base 12'.

It is understandable that the first portion inner side surface 1241' and a longitudinal line direction of the optical axis Y of the camera module 100' define a first inclination angle α. In other words, when the camera module 100' is aligned along the vertical direction, the first portion inner side surface 1241' and the vertical line define the first inclination angle α. The extending direction of the second portion inner side surface 1242' is substantially perpendicular to a longitudinal line direction of the optical axis Y of the camera module 100'. The third portion inner side surface 1243' and the longitudinal line direction of the optical axis Y of the camera module 100' define a third inclination angle β. That is, when the camera module 100' is aligned in the vertical (longitudinal) direction, the third portion inner side surface 1243' and the vertical (longitudinal) line define the third inclination angle β.

Figure 49:
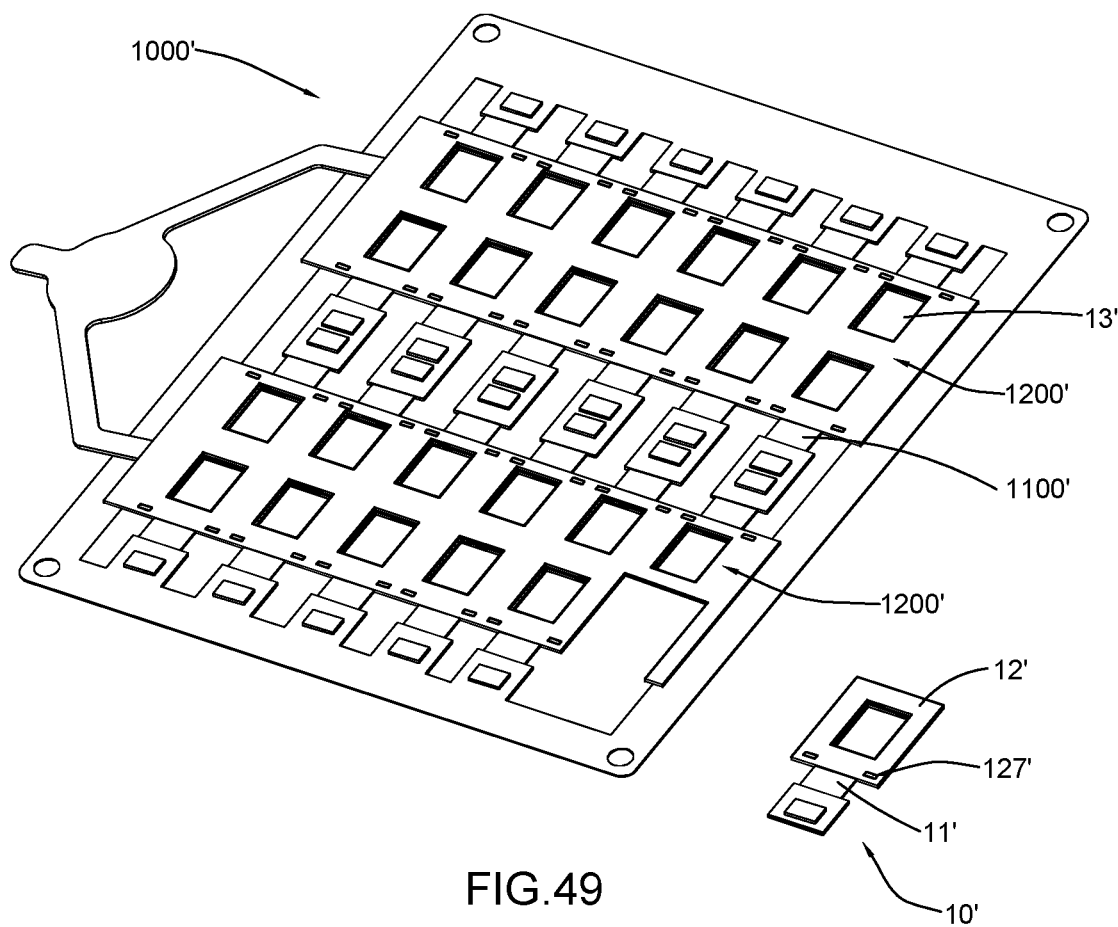
FIG. 49 is a schematic view of a separated molded photosensitive assembly being cut down from the integral piece of molded photosensitive assembly array in the molding process according to the above fourth preferred embodiment of the present invention.

The outer side surface 125' of the molded base 12' which is extended from the 1111 of the base board 111' of the circuit board 11' has one or more outer peripheral surfaces 1251'. In the fourth preferred embodiment of the present invention, as the integrally connected integral piece of molded photosensitive assembly array 1000' is manufactured and is cut into individual molded photosensitive assemblies 10', some outer peripheral surfaces 1251' of the outer side surface 125' of the molded base 12' of the molded photosensitive assembly 10' are formed by cutting, so that the outer peripheral surfaces 1251' can be vertical and flat surfaces. While at least one of the outer peripheral surfaces 1251' is defined by the base outer side surface forming surface 2161' of the dividing blocks 216' of the molding mould 210' in the molding process. As shown in FIG. 49 of the drawings, the front outer peripheral surface 1251' of the molded photosensitive assembly 10' obtained by cutting is formed by the base outer side surface forming surface 2161' of the dividing blocks 216' of the molding mould 210'. The front outer peripheral surfaces 1251' and the longitudinal line direction of the optical axis Y of the camera module 100' define the second inclination angle γ. In other words, when the camera module 100' is aligned in the vertical (longitudinal) direction, the front outer peripheral surfaces 1251' and the vertical (longitudinal) line define the second inclination angle γ. In addition, the molded base 12' is also formed with one or more lens actuator pin grooves 127'. Each of the lens actuator pin grooves 127' has a pin groove wall 1271'. The pin groove wall 1271' and the longitudinal line direction of the optical axis Y of the camera module 100' define a fourth inclination angle δ, as shown in FIG. 46. In other words, when the camera module 100' is aligned in the vertical (longitudinal) direction, the pin groove wall 1271' and the vertical (longitudinal) line define the fourth inclination angle δ.

It is worth mentioning that, similar to the above embodiment of the present invention, as shown in FIG. 42 of the drawings, a press-fit distance W is formed on an outer edge of the base board 111' of the circuit board 11' and the outer side surface 125' of the formed molded base 12', so as to facilitate demoulding and to press-fit the base board 111' of the circuit board 11'. The press-fit distance W has a range of 0.1 to 10 mm, preferably 0.1 to 0.6 mm. For example, the press-fit distance W is 0.5 mm.

According to the embodiment of the present invention, the angular range of the first angle α is 10° to 80°, while in other embodiments, the angular range of the first angle α can be 10° to 30°, 30° to 45° or 45° to 55°, or 55° to 80°. The angular range of the second angle γ is 3° to 45°, while in other embodiments, the angular range of the second angle γ can be 3° to 15°, 15° to 30° or 30° to 45°. The angular range of the third angle β is 3° to 30°, while in other embodiments, the angular range of the third angle β can be 3° to 15°, 15° to 20° or 20° to 30'°. The angular range of the fourth angle δ is 3° to 45°, while in other embodiments, the angular range of the third angle β can be 3° to 15°, 15° to 30° or 30° to 45°.

The light window forming block 214' and the dividing blocks 216' are formed in a frustum-pyramidal shape, and edges and corners of the light window forming block 214' and the dividing blocks 216' are linearly transitioned or curvedly transitioned in an arc shape. However, the extending angles ranges of the surfaces are substantially within the above-mentioned specific range.

Correspondingly, the first mould 211' of the molding mould 210' is configured with an overall integral molding surface to form the molded base 12' with above structure. More specifically, as shown in FIG. 44 of the drawings, the light window forming block 214' comprises a press head portion 214a' in a bottom side and a groove forming portion 214b' on a top side. The press head portion 214a' and the groove forming portion 214b' together form the light window 122' of the molded base 12'. The groove forming portion 214b' forms the top groove 123' on the top side of the molded base 12'.

It is understandable that the light window forming block 214' comprises a press-fit surface 2141' on a bottom side and a base inner side surface forming surface 2142' along an outer circumferential direction. Furthermore, in this embodiment, the base inner side surface forming surface 2142' of the light window forming block 214' comprises a first portion forming surface 21421', a second portion forming surface 21422' and a third portion forming surface 21423' integrally extended. The first portion forming surface 21421', the second portion forming surface 21422' and the third portion forming surface 21423' are respectively and correspondingly provided for forming the first portion inner side surface 1241', the second portion inner side surface 1242' and the third portion inner side surface 1243' respectively, which are integrally extended in an inner side of the molded base 12'.

According to the embodiment of the present invention, as shown in the drawings, the camera module 100' is vertically (longitudinal) aligned, the longitudinal direction of the optical axis Y of the photosensitive element 13' of the camera module 100' is parallel to the vertical (longitudinal) line. Correspondingly, the first portion forming surface 21421' and the vertical line have the first inclination angle α in the range of 10° to 80°. The third portion forming surface 21423' and the vertical (longitudinal) line define the third inclination angle β in the range of 3° to 30'°.

Correspondingly, the bottom side surface of the press head portion 214a' forms the press-fit surface 2141' of the light window forming block 214'. The outer side surface of the press head portion 214a' forms the first portion forming surface 21421' of the light window forming block 214'. The bottom side surface of the groove forming portion 214b' forms the second portion forming surface 21422' of the light window forming block 214'. The outer side surface of the groove forming portion 214b' forms the third portion forming surface 21423' of the base forming guide groove 215'. The press head portion 214a' and the groove forming portion 214b' are configured to have a frustum-pyramidal shape. The press head portion 214a' and the groove forming portion 214b' have trapezoid cross sections, thereby preventing damages to the elastic film layer 219'. More specifically, taking the groove forming portion 214b' as an example, unlike the molding block in the prior art as shown in FIGS. 1A to 1E having sharp edges and corners, the film layer 219' will not be pierced on the position in the demoulding process according to the present invention, where the second portion forming surface 21422' is connected to the third portion forming surface 21423'. While the second portion forming surface 21422' on the bottom side of the groove forming portion 214b' and the third portion forming surface 21423' on the outer peripheral side of the groove forming portion 214b' define an obtuse angle that facilitates the demoulding of the groove forming portion 214b'.

Figure 43:
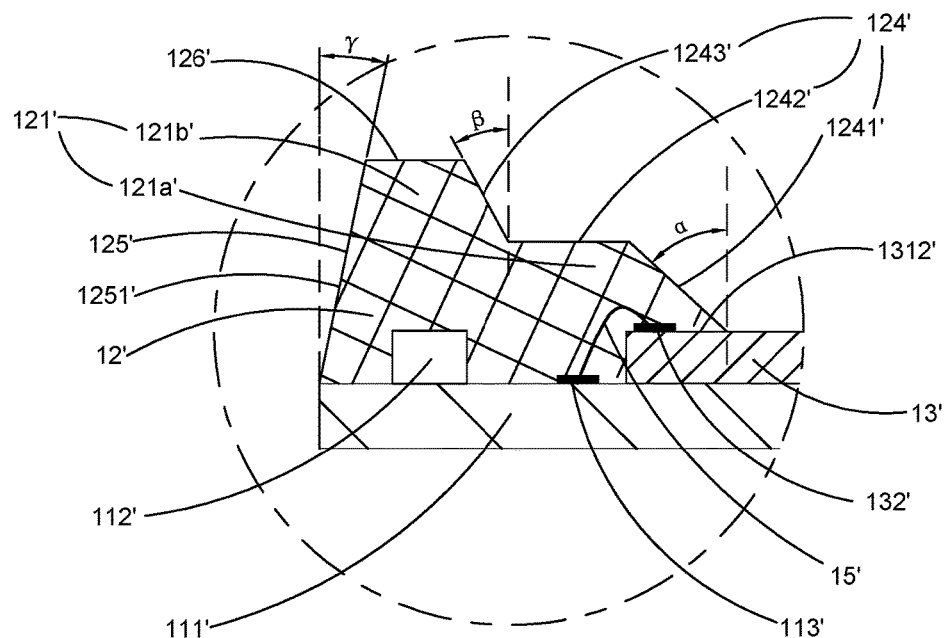
FIG. 43 is a partially enlarged sectional view illustrating an inclination angle, which is convenient for demoulding of the camera module according to the above fourth preferred embodiment of the present invention.
Figure 45:
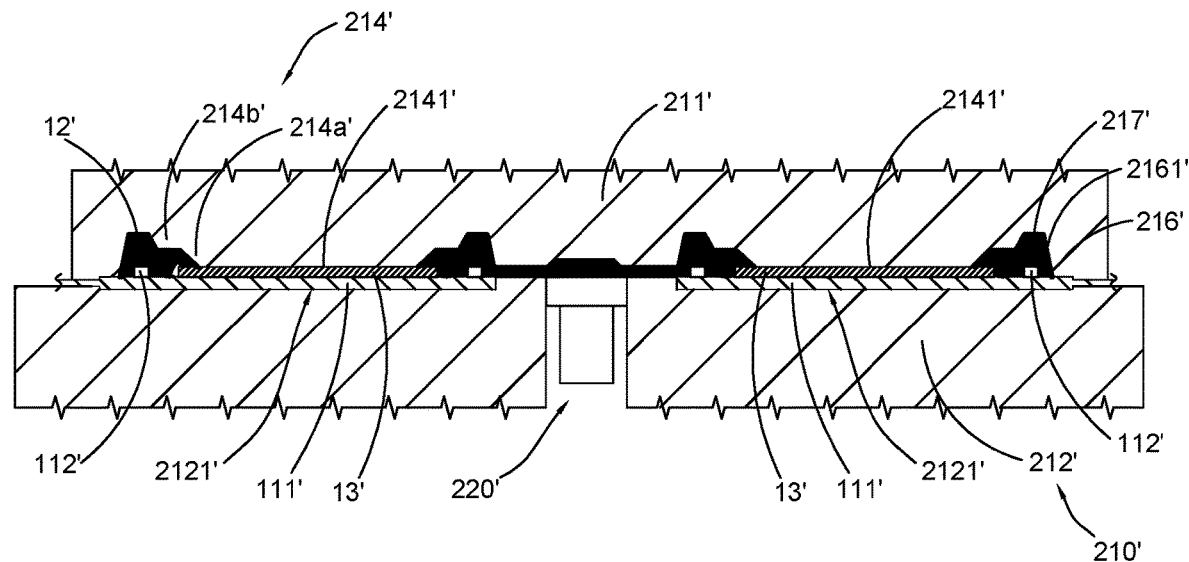
FIG. 45 is a cross-sectional view of the molded photosensitive assembly, along the C'-C' line of the FIG. 41, according to the above fourth preferred embodiment of the present invention, illustrating that a liquid molding material is pushed into the base forming guide groove by the molding mould.

As shown in FIGS. 43 to 45, the outer side surface 125' of the molded photosensitive assembly 10' has at least one outer peripheral surface 1251' and the dividing blocks 216' has a base outer side surface forming surface 2161'. The base outer side surface forming surface 2161' and the vertical (longitudinal) line define the second inclination angle γ with a range of 3° to 45°.

As shown in FIG. 46, the molding mould 210' further comprises a plurality of the lens actuator pin groove forming blocks 218', each having a pin groove side surface forming surface 2181. The pin groove side surface forming surface 2181' and the vertical (longitudinal) line define the fourth inclination angle δ with a range of 3° to 30'°.

Correspondingly, like the above preferred embodiments, the above structure of the first mould 211' of the molding mould 210' and the molded base 12' according to the fourth preferred embodiment also have the following advantages.

Figure 47:
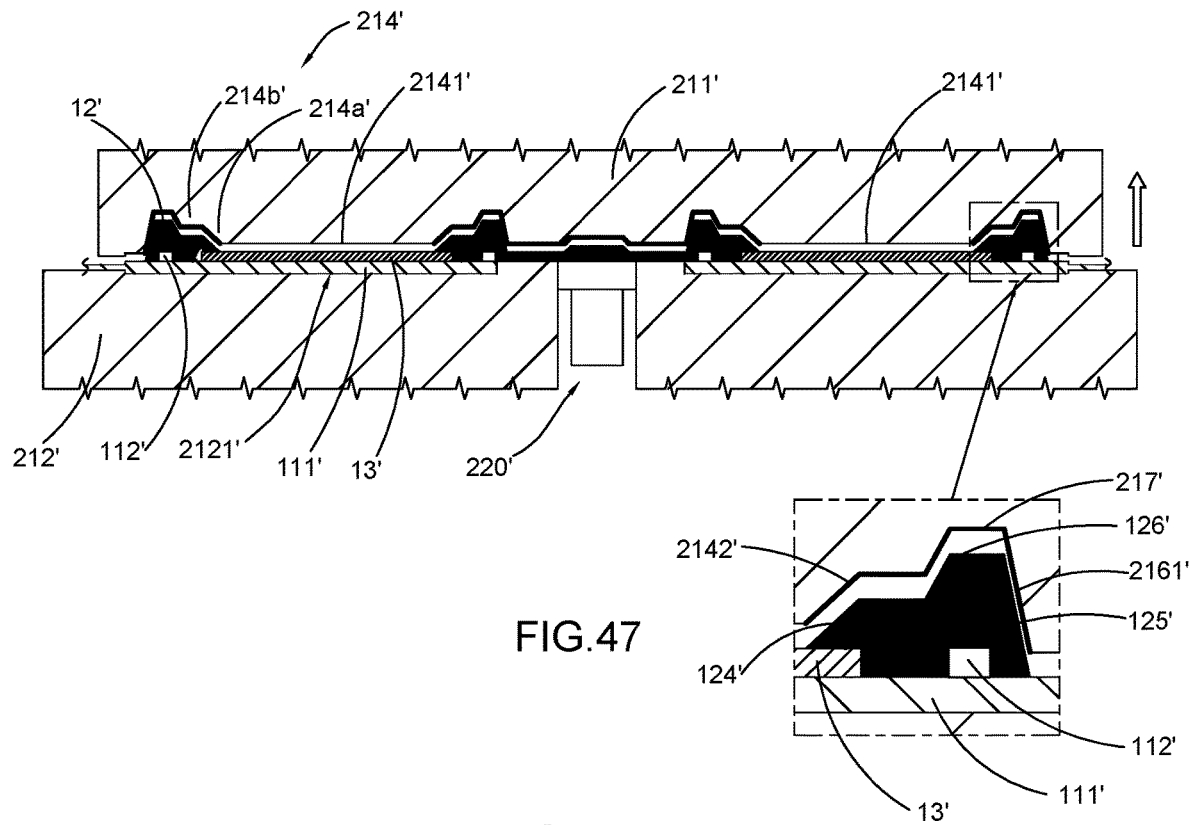
FIG. 47 is a schematic view illustrating a demoulding process of the molded photosensitive assembly according to the above fourth preferred embodiment of the present invention.
Figure 48:
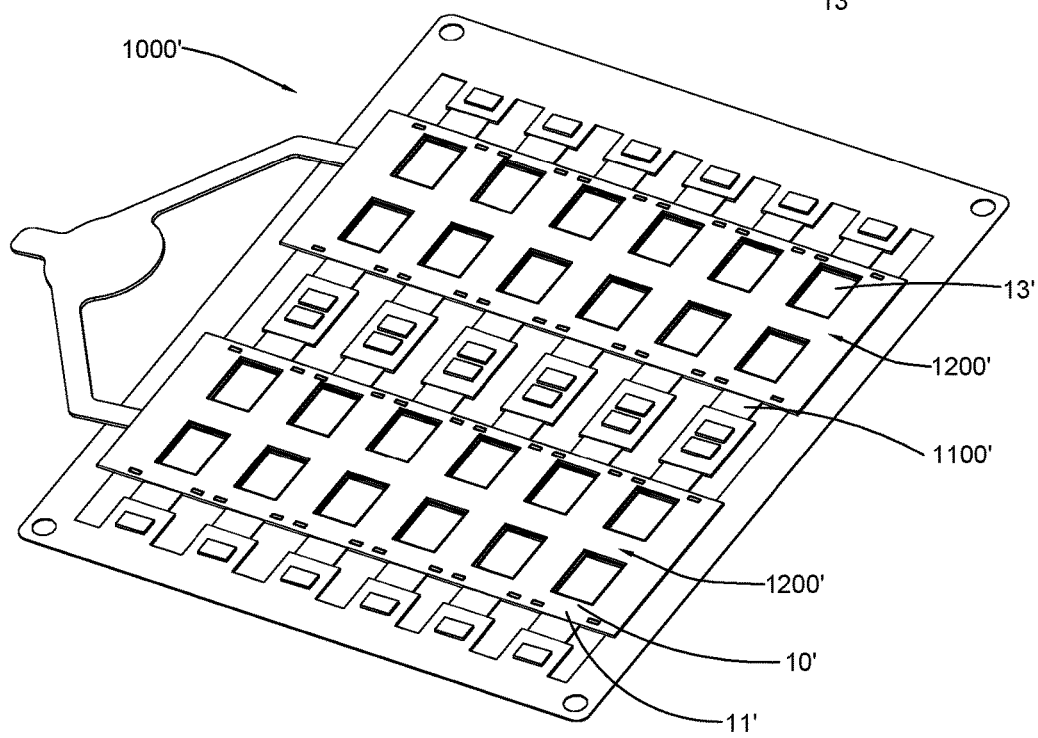
FIG. 48 is a perspective view of an integral piece of molded photosensitive assembly array manufactured by the molding process according to the above fourth preferred embodiment of the present invention.

Firstly, it is convenient for demoulding the dividing blocks 216' and the light window forming block 214' of the first mould 211'. In other words, as the first inclination angle α, the second inclination angle γ, the third inclination angle β and the fourth inclination angle δ which are acute angles are provided to facilitate demoulding, the light window forming block 214' and the dividing blocks 216' which have reduced frictions with the molded base 12' and the molded base 12' are easy to be removed so as to obtain a better molded state. As shown in FIG. 47 of the drawings, as along as the light window forming block 214' and the dividing blocks 216' are departed from the molded base 12' and have upward and downward relative displacements, friction is avoided between the light window forming block 214' and the dividing blocks 216' with the molded base 12'. In other words, the first portion forming surface 21421', the second portion forming surface 21422' and the third portion forming surface 21423' of the light window forming block 214' are respectively separated with the first portion inner side surface 1241', the second portion inner side surface 1242' and the third portion inner side surface 1243' of the molded base 12'. The base outer side surface forming surface 2161' of the dividing blocks 216' and the outer side surface 125' of the molded base 12' are separated, and the light window forming block 214' and the dividing blocks 216' are capable of being easily drafted from the molded base 12', thereby reducing the adverse influence to the molding condition and effect of the molded base 12'.

Secondly, the shape of the integral base array forming guide groove 2150' formed by the molding mould 210' has no right-angled corners and has an appropriate gradient such that the liquid molding material 14' has a better liquidity entering the base forming guide groove 215'. In other words, as the molding material 14' is generally in a liquid state during the molding process and is needed to flow in the molding chamber 213', the size of flowing area influences the filling effect of the molding material 14'. The structure of the integral base array forming guide groove 2150' according to the embodiment of the present invention increases the flowing rate of the molding material 14', so that the molded base 12' is molded in a shorter time and is benefit for the molding of the molded base 12'.

Thirdly, the first inclination angle α, the second inclination angle γ, the third inclination angle β and the fourth inclination angle δ are acute angles, other than the right angle configuration in the prior art. The light window forming block 214' and the dividing blocks 216' do not formed any sharp edges and corners that would damage the inner side surface 124' and the outer side surface 125' of the molded base 12'.

Fourthly, as the first inclination angle α, the second inclination angle γ, the third inclination angle β and the fourth inclination angle δ which are acute angles are provided, the inner side surface 124' of the molded base 12', at least one portion of the outer side surface 125' and the pin groove wall 1271' are in slant shape, so that the size of the molded base 12' is relatively smaller and the overall molding material 14' needed to be filled is decreased.

Fifthly, the acute angle range of the first inclination angle α and the third inclination angle β are capable of avoiding the stray light affecting the imaging quality of the camera module 100'. More specifically, it reduces the possibility of stray light reaching the photosensitive element photosensitive element 13'. That is, when the incident stray light in the camera module 100' is projected on the curved extending inner side surface 124' of the molded base 12', the aslant first portion inner side surface 1241', the third portion inner side surface 1243' and the second portion inner side surface 1242' which is extended along the horizontal (transversal) direction reflect the incident stray light away from the photosensitive element 13', preventing the incident stray light from easily reaching the photosensitive element 13' to affect the image quality of the camera module 100'.

In addition, the ranges of the first inclination angle α, the second inclination angle γ, and the third inclination angle β enable that the molded base 12' having a better supporting function. For example, the top side surface 126' has an enough size facilitating the mounting of the lens 30' and the lens actuator 40' thereto, and it is ensured that the second portion inner side surface 1242' has a sufficient size to facilitate mounting of the optical filter 50' or the optical filter holder 60'. In other words, the first inclination angle α, the second inclination angle γ, and the third inclination angle β are not preferred to be too large to avoid the length of the top side surface 126' being too small in order to provide a secure mounting position for the lens 30' or the lens actuator 40'. In addition, the first inclination angle α needs to be considered that the light window forming block 214' cannot be pressed against the lead wires 15', which may cause the lead wires 15' to break.

Referring to FIG. 54 to FIG. 60 of the drawings, seven examples of the range of the first inclination angle α, the second inclination angle γ, and the third inclination angle β according to the fourth preferred embodiment of the present invention are illustrated. In the seven examples, the first portion inner side surface 1241' of the molded base 12' and the vertical (longitudinal) line define the first inclination angle α, at least one outer peripheral surfaces 1251' of the outer side surface 125' along the outer peripheral direction of the molded base 12' and the vertical (longitudinal) line define the second inclination angle γ, the third portion inner side surface 1243' of the inner side surface 124' of the molded base 12' and the vertical (longitudinal) line define the third inclination angle β. A parameter l1 denotes a distance between the connecting position of the first portion inner side surface 1241' of the molded base 12' and the photosensitive element 13', and the connecting position of the first portion inner side surface 1241' and the second portion inner side surface 1242'. A parameter l2 denotes a distance between the connecting position of the first portion inner side surface 1241' and the second portion inner side surface 1242', and the connecting position of the top side surface 126' and the third portion inner side surface 1243'. The top side surface 126' of the molded base 12' has a length l3. A parameter h1 denotes a distance between the top side surface 126' of the molded base 12', and the top surface of the base board 111' of the circuit board 11'. A parameter h2 denotes a distance between the second portion inner side surface 1242' and the top surface of the base board 111' of the circuit board 11'. A parameter h3 denotes a distance between the highest point of the lead wire 15' and the photosensitive element 13'.

Figure 54:
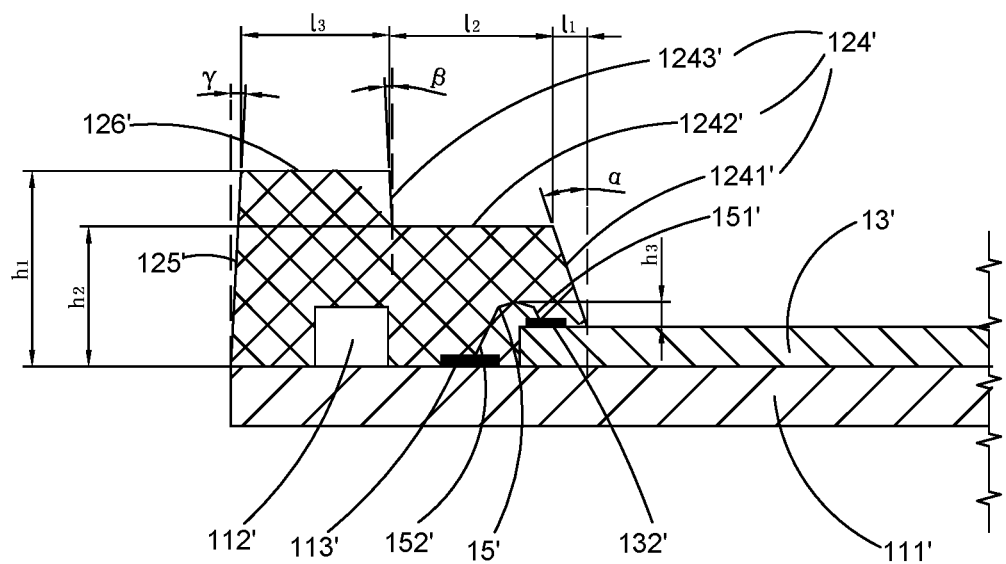
FIG. 54 is a partially enlarged sectional view of the molded photosensitive assembly, illustrating an inclination angle thereof for convenient for demoulding of the molded photosensitive assembly manufactured by the molding process according to a first example of the above fourth preferred embodiment of the present invention.
Figure 55:
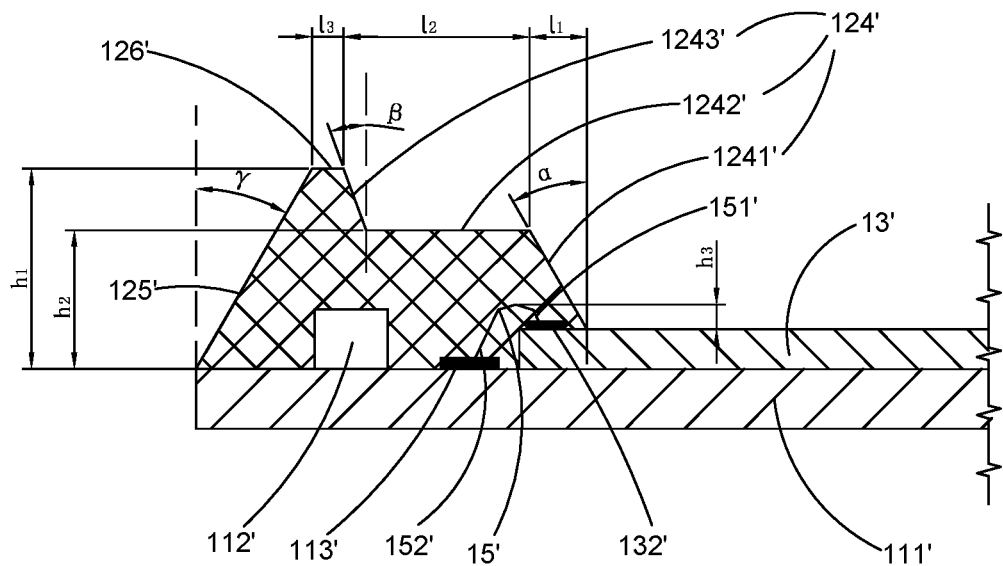
FIG. 55 is a partially enlarged sectional view of the molded photosensitive assembly, illustrating an inclination angle thereof for convenient for demoulding of the molded photosensitive assembly manufactured by the molding process according to a second example of the above fourth preferred embodiment of the present invention.
Figure 56:
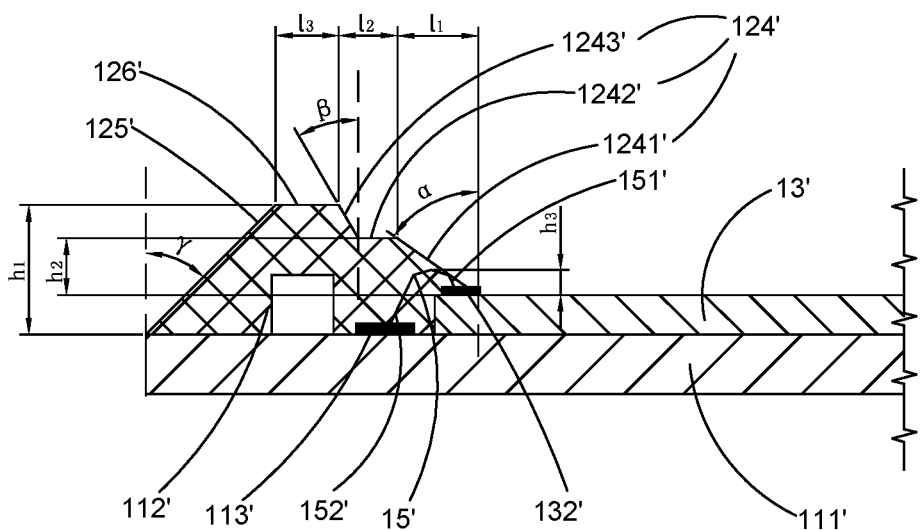
FIG. 56 is a partially enlarged schematic view of the molded photosensitive assembly, illustrating an inclination angle thereof for convenient for demoulding of the molded photosensitive assembly manufactured by the molding process according to a third example of the above fourth preferred embodiment of the present invention.

As shown in FIG. 54 to FIG. 56 of the drawings, according to three examples, the wire bonding direction of the photosensitive element 13' and the circuit board 11' is from the photosensitive element 13' to the circuit board 11'. In other words, the photosensitive element 13' is provided with one or more photosensitive element connecting pads 132', wherein the wire bonding tool firstly forms a first end 151' of each of the lead wires 15' connected to the photosensitive element connecting pad 132' at the top end of the respective photosensitive element connecting pad 132' and then lifts up a preset position and then moves toward the respective circuit board connecting pad 113', and finally descends to form a second end 152' of each of the lead wires 15' connected to the respective circuit board connecting pad 113' at the top end of the respective circuit board connecting pad 113'. Accordingly, each of the lead wires 15' is curvedly extended and the top end of each of the lead wires 15' is required not to be crushed by the first portion forming surface 21421' of the light window forming block 214' during the molding process, so that the size of the first inclination angle α has a maximum limit.

As shown in FIG. 57 to FIG. 60 of the drawings, in the four examples, the wire bonding direction of the photosensitive element 13' and the circuit board 11' is from the circuit board 11' to the photosensitive element 13'. In other words, the circuit board 11' is provided with one or more the circuit board connecting pads 113', wherein the wire bonding tool firstly forms the second end 152' of each of the lead wires 15' connected to the respective circuit board connecting pad 113' at the top end of the respective circuit board connecting pad 113' and then lifts up to a preset position and then moves toward the respective circuit board connecting pad 113' to form the opposite first end 151' of the lead wire 15' which is connected to the respective photosensitive element connecting pad 132' at the top end of the respective photosensitive element connecting pad 132', so that each of the lead wires 15' is curvedly extended and the top end thereof is required not to be crushed by the first portion forming surface 21421' of the light window forming block 214' during the molding process, so that the size of the first inclination angle α has a maximum limit. In addition, the second inclination angle γ and the third inclination angle β may not be too large such that the second portion inner side surface 1242' and the top side surface 126' have enough sizes. In other words, the ranges of the second inclination angle γ and the third inclination angle β are preferred to have restrictive relations with the above parameters l1, l2, l3, h1, h2 and h3.

As shown in FIG. 54 of the drawings, for example, α is 10°, β is 3°, and γ is 3°. The l1 numerical value is 0.23 mm. The l2 numerical value is 1.09 mm. The l3 numerical value is 0.99 mm. The h1 numerical value is 1.30' mm. The h2 numerical value is 0.93 mm. The h3 numerical value is 0.17 mm. The first inclination angle α, the second inclination angle γ and the third inclination angle β have predetermined minimum numerical values.

As shown in FIG. 55 of the drawings, for example, α is 30°, β is 20°, and γ is 30°. The l1 numerical value is 0.38 mm. The l2 numerical value is 1.25 mm. The l3 numerical value is 0.21 mm. The h1 numerical value is 1.34 mm. The h2 numerical value is 0.93 mm. The h3 numerical value is 0.17 mm.

As shown in FIG. 56 of the drawings, for example, α is 55°, β is 30°, and γ is 45°. The l1 numerical value is 0.54 mm. The l2 numerical value is 0.39 mm. The l3 numerical value is 0.42 mm. The h1 numerical value is 0.86 mm. The h2 numerical value is 0.38 mm. The h3 numerical value is 0.17 mm. When the wire bonding direction of the photosensitive element 13' and the circuit board 11' is from the photosensitive element 13' to the circuit board 11', the first inclination angle α is preferred to have a maximum value of 55°.

Figure 57:
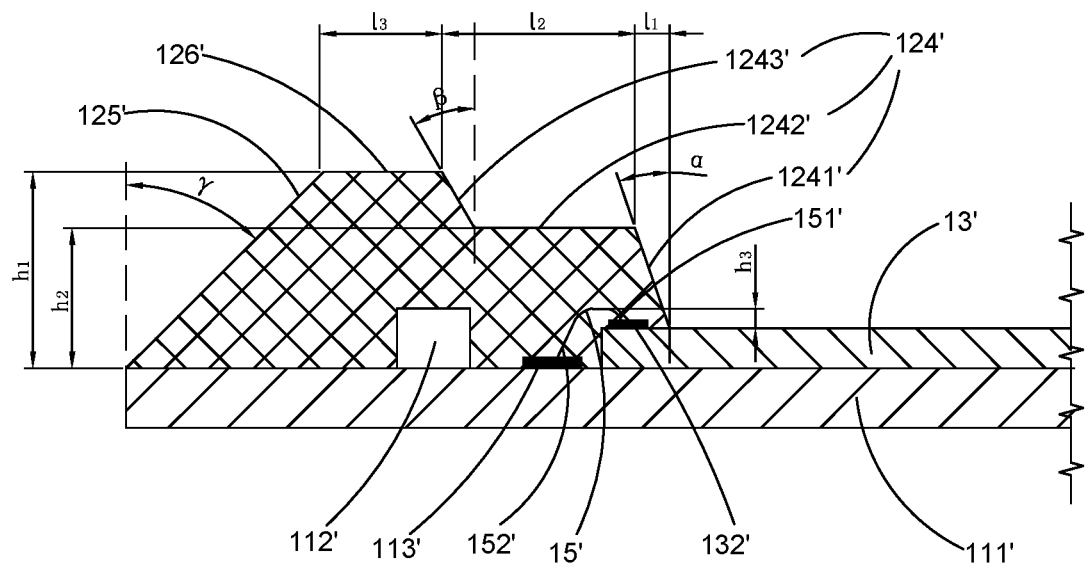
FIG. 57 is a partially enlarged sectional view of the molded photosensitive assembly, illustrating an inclination angle thereof for convenient for demoulding of the molded photosensitive assembly manufactured by the molding process according to a fourth example of the above fourth preferred embodiment of the present invention.

More specifically, as shown in FIG. 57 of the drawings, for example, α is 10°, β is 30°, and γ is 45°. The l1 numerical value is 0.23 mm. The l2 numerical value is 1.28 mm. The l3 numerical value is 0.82 mm. The h1 numerical value is 1.30' mm. The h2 numerical value is 0.93 mm. The h3 numerical value is 0.13 mm. The first inclination angle α of 10° is a predetermined minimum value. The second inclination angle γ of 45° and the third inclination angle β of 30° are appropriate maximum values.

Figure 58:
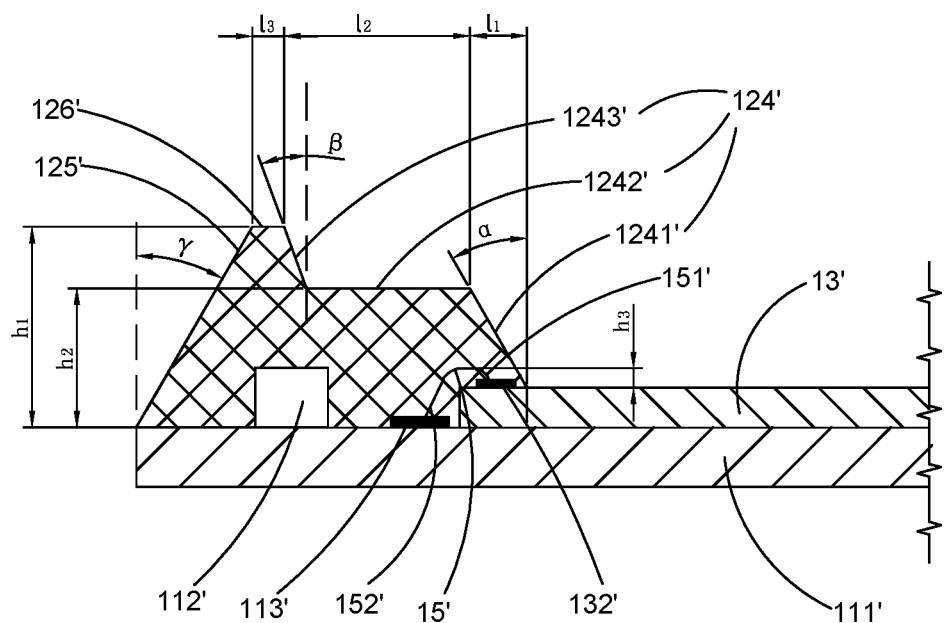
FIG. 58 is a partially enlarged sectional view of the molded photosensitive assembly, illustrating an inclination angle thereof for convenient for demoulding of the molded photosensitive assembly manufactured by the molding process according to a fifth example of the above fourth preferred embodiment of the present invention.

As shown in FIG. 58 of the drawings, for example, α is 30°, β is 20°, and γ is 30°. The l1 numerical value is 0.38 mm. The l2 numerical value is 1.24 mm. The l3 numerical value is 0.21 mm. The h1 numerical value is 1.34 mm. The h2 numerical value is 0.93 mm. The h3 numerical value is 0.13 mm.

Figure 59:
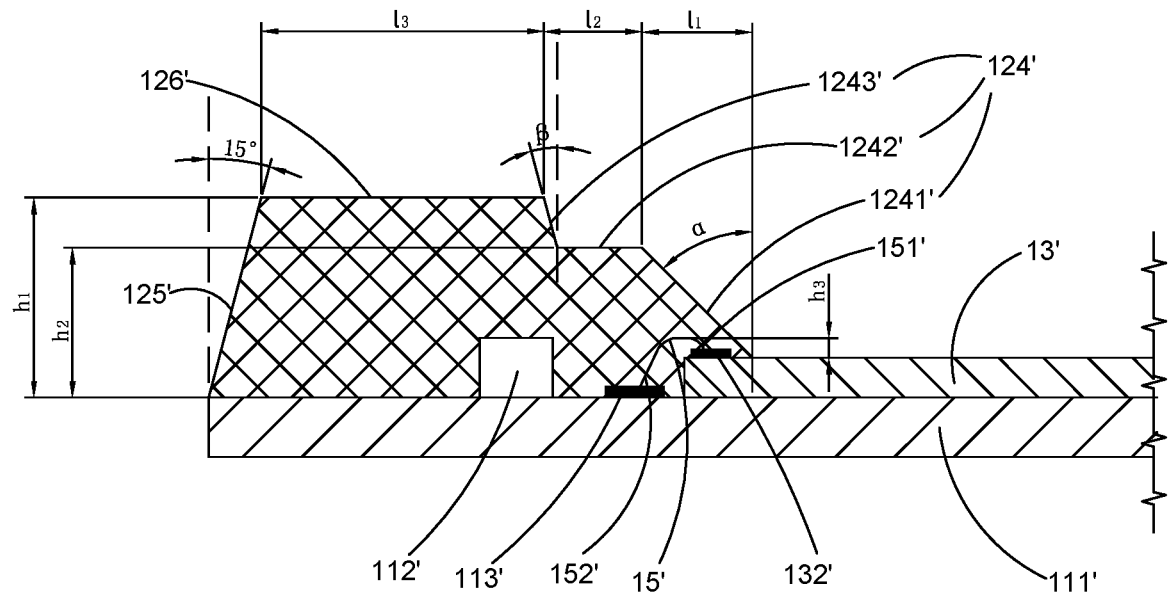
FIG. 59 is a partially enlarged sectional view of the molded photosensitive assembly, illustrating an inclination angle thereof for convenient for demoulding of the molded photosensitive assembly manufactured by the molding process according to a sixth example of the above fourth preferred embodiment of the present invention.

As shown in FIG. 59 of the drawings, for example, α is 45°, β is 15°, and γ is 15°. The l1 numerical value is 0.73 mm. The l2 numerical value is 0.65 mm. The l3 numerical value is 1.88 mm. The h1 numerical value is 1.33 mm. The h2 numerical value is 1.00 mm. The h3 numerical value is 0.13 mm.

Figure 60:
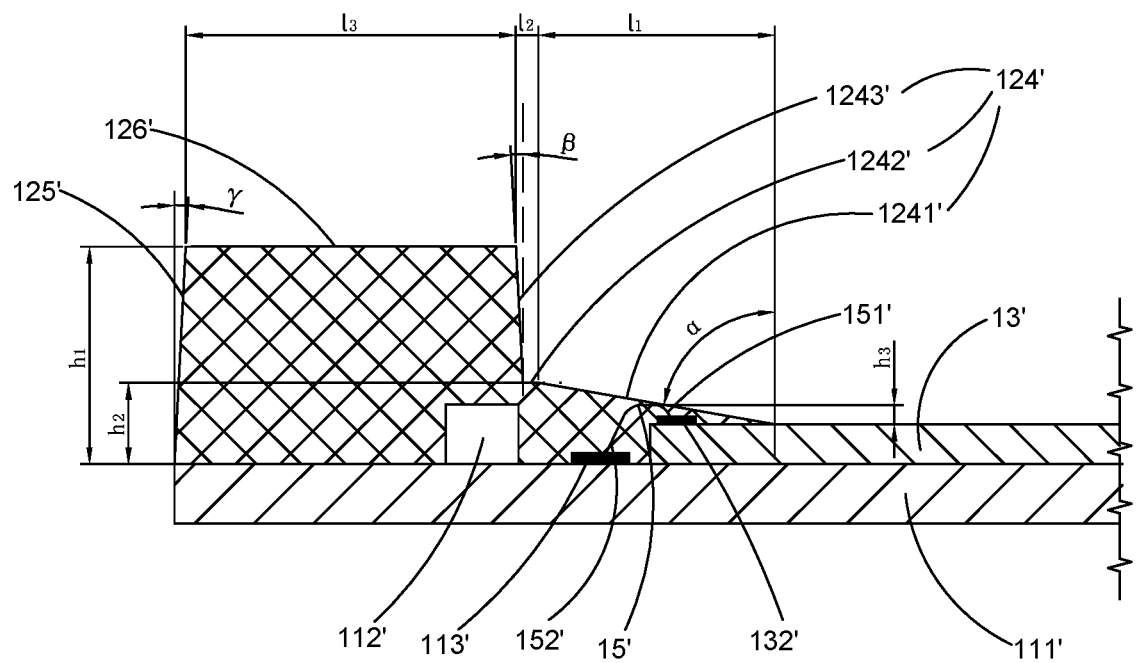
FIG. 60 is a partially enlarged sectional view of the molded photosensitive assembly, illustrating an inclination angle thereof for convenient for demoulding of the molded photosensitive assembly manufactured by the molding process according to a seventh example of the above fourth preferred embodiment of the present invention.

As shown in FIG. 60 of the drawings, for example, α is 80°, β is 3°, and γ is 3°. The l1 numerical value is 1.57 mm. The l2 numerical value is 0.15' mm. The l3 numerical value is 2.19 mm. The h1 numerical value is 1.45 mm. The h2 numerical value is 0.54 mm. The h3 numerical value is 0.13 mm. When the wire bonding direction of the photosensitive element 13' and the circuit board 11' is from the circuit board 11' to the photosensitive element 13', as the lead wire 15' is preferred not to be lift up like as shown FIG. 54 to FIG. 56 of the drawings, the highest point of each of the lead wires 15' is reduced and the first inclination angle α has a maximum value of 80°. In addition, in the embodiment of the present invention, the second inclination angle γ and the third inclination angle β are suitable minimum values.

It is understandable that the numerical values of above parameters l1, l2, l3, h1, h2 and h3 are exemplary only and not intended to be limiting the scope of the present invention. In the practice, the numerical values thereof are changed with the specification requirements of the camera module 100' and the molded photosensitive assembly 10'.

According to this embodiment of the present invention, it is possible to illustrate from the above-exemplified data that an appropriate range of the first inclination angle α is 10° to 80°, and an appropriate range of the second inclination angle γ is 3° to 45°, and the appropriate range of the third inclination angle β is 3° to 30°.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A manufacturing method of a molded photosensitive assembly of a camera module, comprising the steps of:
   (a) attaching a ring shape blocking element implemented as a glue stair on a non-photosensitive area portion of a photosensitive element to encircle a photosensitive area portion of said photosensitive element provided on a circuit board which has one or more electronic elements provided thereon and is electrically connected to said non-photosensitive area portion of said photosensitive element through one or more connecting elements;

(b) placing said circuit board with said photosensitive element provided thereon and said blocking element attached on said photosensitive element in a molding mould;

(c) press-fitting a light window forming block of one of a first mould and a second mould of said molding mould onto said blocking element when said molding mould is in a closed-mould position to prevent a press-fit surface of said light window block from contacting with said photosensitive element;

(d) filling a liquid state molding material into a base forming guiding groove formed within said molding mould in said closed-mould position and then to reach around said light window forming block while said blocking element preventing said molding material from entering said photosensitive area portion of said photosensitive element;

(e) solidifying said liquid state molding material to cure to form a molded base integrally packaged and molded on said circuit board and at least a portion of said non-photosensitive area portion of said photosensitive element to form said molded photosensitive assembly, wherein said molded base of said molded photosensitive assembly has at least one light window formed at a position of said light window forming block of said molding mould to communicate with said photosensitive area portion of said photosensitive element to define a light path of said molded photosensitive assembly; and (f) separating said first mould and said second mould for demoulding to obtain said molded photosensitive assembly.

2. The manufacturing method, as recited in claim 1, wherein the step (a) further comprises a step of mounting said blocking element, which is an elastic element, on said non-photosensitive area portion of a top surface of said photosensitive element in such a manner that, during the steps (d) and (e), said light window block of one of said first and second moulds is press-fitting onto said blocking element instead of said top surface of said photosensitive element to prevent said liquid state molding material from entering said photosensitive area portion of said photosensitive element and prevent said press-fit surface of said light window block from contacting with said photosensitive element.

3. The manufacturing method, as recited in claim 2, wherein said molded base has an annular inner side surface defining said light window, an annular outer side surface and an annular top side surface, wherein at least one portion of said inner side surface is integrally and inclinedly extended upwardly and outwardly from said blocking element provided on photosensitive element for avoiding reflected stray light reaching said photosensitive area portion of said photosensitive element, wherein said outer side surface is integrally and inclinedly extended upwardly and inwardly from said circuit board, wherein said top side surface is transversally extended between said inner side surface and said outer side surface, wherein said electronic components and said connecting elements are embedded and encapsulated in said molded base, wherein said inner side surface of said molded base and an optical axis direction of said camera module define a first inclination angle $\alpha$ therebetween, wherein a range of said first inclination angle $\alpha$ is 10° to 80°, wherein said outer side surface of said molded base and said optical axis direction of said camera module define a second inclination angle $\gamma$ therebetween, wherein a range of said second inclination angle $\gamma$ is 3° to 45°.

4. The manufacturing method, as recited in claim 3, wherein in the step (e), said inner side surface comprises a first portion of said inner side surface, a second portion of said inner side surface, and a third portion of said inner side surface which are integrally extended to form said inner side surface, wherein said first portion of said inner side surface is integrally and inclinedly extended from said non-photosensitive area portion of said photosensitive element, wherein said second portion of said inner side surface is extended from said first portion of said inner side surface along a transversal direction, wherein said third portion of said inner side surface is integrally and inclinedly extended from said second portion of said inner side surface, such that said molded base is correspondingly formed with a base station portion on a bottom side thereof and a step portion integrally extended from said base station portion, wherein said step portion has a size larger than said base station portion, wherein an inner surface of said base station portion forms said first portion of said inner side surface of said inner side surface of said molded base, wherein an inner surface of said step portion forms said third portion of said inner side surface of said inner side surface of said molded base, wherein a top surface forms said top side surface of said molded base, wherein said third portion of said inner side surface of said molded base and said optical axis direction of said camera module define a third inclination angle $\beta$ therebetween, wherein a range of said third inclination angle $\beta$ is 3° to 30, wherein said second portion of said inner side surface and said third portion of said inner side surface form said top groove and said optical filter is mounted on said second portion of said inner side surface in position while surrounding by said third portion of said inner side surface.

5. The manufacturing method, as recited in claim 4, wherein said range of said first inclination angle $\alpha$ is selected from the angular group consisting of 10° to 30°, 30° to 45°, 45° to 55° and 55° to 80°, said range of said second inclination angle $\gamma$ is selected from the angular group consisting of 3° to 15°, 15° to 30° and 30° to 45°, and said range of said third inclination angle $\beta$ is selected from the angular group consisting of 3° to 15°, 15° to 20° and 20° to 30°.

6. The manufacturing method, as recited in claim 3, wherein said range of said first inclination angle $\alpha$ is selected from the angular group consisting of 10° to 30°, 30° to 45°, 45° to 55° and 55° to 80° and said range of said second inclination angle $\gamma$ is selected from the angular group consisting of 3° to 15°, 15° to 30° and 30° to 45.

7. The manufacturing method, as recited in claim 1, wherein the step (a) further comprises a step of coating said blocking element, which is an elastic element, on said non-photosensitive area portion of a top surface of said photosensitive element in such a manner that, in the steps (d) and (e), said light window forming block of one of said first and second moulds is press-fitting onto said blocking element to prevent said liquid state molding material from entering said photosensitive area portion of said photosensitive element and prevent a press-fit surface of said light window forming block from contacting with said photosensitive element.

8. The manufacturing method, as recited in claim 7, wherein said molded base has an annular inner side surface defining said light window, an annular outer side surface and an annular top side surface, wherein at least one portion of said inner side surface is integrally and inclinedly extended upwardly and outwardly from said blocking element provided on photosensitive element for avoiding reflected stray light reaching said photosensitive area portion of said photosensitive element, wherein said outer side surface is integrally and inclinedly extended upwardly and inwardly from said circuit board, wherein said top side surface is transversally extended between said inner side surface and said outer side surface, wherein said electronic components and said connecting elements are embedded and encapsulated in said molded base, wherein said inner side surface of said molded base and an optical axis direction of said camera module define a first inclination angle α therebetween, wherein a range of said first inclination angle α is 10° to 80°, wherein said outer side surface of said molded base and said optical axis direction of said camera module define a second inclination angle γ therebetween, wherein a range of said second inclination angle γ is 3° to 45°.

9. The manufacturing method, as recited in claim 8, wherein in the step (e), said inner side surface comprises a first portion of said inner side surface, a second portion of said inner side surface, and a third portion of said inner side surface which are integrally extended to form said inner side surface, wherein said first portion of said inner side surface is integrally and inclinedly extended from said non-photosensitive area portion of said photosensitive element, wherein said second portion of said inner side surface is extended from said first portion of said inner side surface along a transversal direction, wherein said third portion of said inner side surface is integrally and inclinedly extended from said second portion of said inner side surface, such that said molded base is correspondingly formed with a base station portion on a bottom side thereof and a step portion integrally extended from said base station portion, wherein said step portion has a size larger than said base station portion, wherein an inner surface of said base station portion forms said first portion of said inner side surface of said inner side surface of said molded base, wherein an inner surface of said step portion forms said third portion of said inner side surface of said inner side surface of said molded base, wherein a top surface forms said top side surface of said molded base, wherein said third portion of said inner side surface of said molded base and said optical axis direction of said camera module define a third inclination angle β therebetween, wherein a range of said third inclination angle β is 3° to 30, wherein said second portion of said inner side surface and said third portion of said inner side surface form said top groove and said optical filter is mounted on said second portion of said inner side surface in position while surrounding by said third portion of said inner side surface.

10. The manufacturing method, as recited in claim 9, wherein said range of said first inclination angle α is selected from the angular group consisting of 10° to 30°, 30° to 45°, 45° to 55° and 55° to 80°, said range of said second inclination angle γ is selected from the angular group consisting of 3° to 15°, 15° to 30° and 30° to 45°, and said range of said third inclination angle β is selected from the angular group consisting of 3° to 15°, 15° to 20° and 20° to 30°.

11. The manufacturing method, as recited in claim 10, wherein said circuit board comprises a base board, wherein at an outer side of at least one outer peripheral surface of said outer side surface of said molded base, said base board of said circuit board has a press-fit distance W which is adapted to press-fit for at least one dividing block of a molding mould in said molding process, wherein a numerical value range of said press-fit distance W is 0.1 to 0.6 mm, wherein a material surface reflectivity of said molded base is less than 5% in a wavelength range of 435-660 nm.

12. The manufacturing method, as recited in claim 8, wherein said range of said first inclination angle α is selected from the angular group consisting of 10° to 30°, 30° to 45°, 45° to 55° and 55° to 80° and said range of said second inclination angle γ is selected from the angular group consisting of 3° to 15°, 15° to 30° and 30° to 45.

13. The manufacturing method, as recited in claim 12, wherein said circuit board comprises a base board, wherein at an outer side of at least one outer peripheral surface of said outer side surface of said molded base, said base board of said circuit board has a press-fit distance W which is adapted to press-fit for at least one dividing block of a molding mould in said molding process, wherein a numerical value range of said press-fit distance W is 0.1 to 0.6 mm, wherein a material surface reflectivity of said molded base is less than 5% in a wavelength range of 435-660 nm.

14. The manufacturing method, as recited in claim 1, wherein said circuit board comprises a base board, wherein at an outer side of at least one outer peripheral surface of said outer side surface of said molded base, said base board of said circuit board has a press-fit distance W which is adapted to press-fit for at least one dividing block of a molding mould in said molding process, wherein a numerical value range of said press-fit distance W is 0.1 to 0.6 mm.

15. A manufacturing method of a molded photosensitive assembly of a camera module, comprising the steps of:
(a) attaching an annular blocking element on a non-photosensitive area portion of a photosensitive element to encircle a photosensitive area portion of said photosensitive element provided on a circuit board which has one or more electronic elements provided thereon and is electrically connected to said non-photosensitive area portion of said photosensitive element through one or more connecting elements;
(b) placing said circuit board with said photosensitive element provided thereon and said blocking element attached on said photosensitive element in a molding mould;
(c) press-fitting a light window forming block of one of a first mould and a second mould of said molding mould onto said blocking element when said molding mould is in a closed-mould position to prevent a press-fit surface of said light window block from contacting with said photosensitive element;
(d) filling a liquid state molding material into a base forming guiding groove formed within said molding mould in said closed-mould position and then to reach around said light window forming block while said blocking element preventing said molding material from entering said photosensitive area portion of said photosensitive element;
(e) solidifying said liquid state molding material to cure to form a molded base integrally packaged and molded on said circuit board and at least a portion of said non-photosensitive area portion of said photosensitive element to form said molded photosensitive assembly, wherein said molded base of said molded photosensitive assembly has at least one light window formed at a position of said light window forming block of said molding mould to communicate with said photosensitive area portion of said photosensitive element to define a light path of said molded photosensitive assembly;

(f) separating said first mould and said second mould for demoulding to obtain said molded photosensitive assembly; and (g) mounting at least an optical filter in a top groove formed on a top side of said molded base to be overlappedly supported above said photosensitive element and aligned along said light path.

16. The manufacturing method, as recited in claim 15, wherein said molded base has an annular inner side surface defining said light window, an annular outer side surface and an annular top side surface, wherein at least one portion of said inner side surface is integrally and inclinedly extended upwardly and outwardly from said blocking element provided on photosensitive element for avoiding reflected stray light reaching said photosensitive area portion of said photosensitive element, wherein said outer side surface is integrally and inclinedly extended upwardly and inwardly from said circuit board, wherein said top side surface is transversally extended between said inner side surface and said outer side surface, wherein said electronic components and said connecting elements are embedded and encapsulated in said molded base, wherein said inner side surface of said molded base and an optical axis direction of said camera module define a first inclination angle $\alpha$ therebetween, wherein a range of said first inclination angle $\alpha$ is 10° to 80°, wherein said outer side surface of said molded base and said optical axis direction of said camera module define a second inclination angle $\gamma$ therebetween, wherein a range of said second inclination angle $\gamma$ is 3° to 45°.

17. The manufacturing method, as recited in claim 16, wherein in the step (e), said inner side surface comprises a first portion of said inner side surface, a second portion of said inner side surface, and a third portion of said inner side surface which are integrally extended to form said inner side surface, wherein said first portion of said inner side surface is integrally and inclinedly extended from said non-photosensitive area portion of said photosensitive element, wherein said second portion of said inner side surface is extended from said first portion of said inner side surface along a transversal direction, wherein said third portion of said inner side surface is integrally and inclinedly extended from said second portion of said inner side surface, such that said molded base is correspondingly formed with a base station portion on a bottom side thereof and a step portion integrally extended from said base station portion, wherein said step portion has a size larger than said base station portion, wherein an inner surface of said base station portion forms said first portion of said inner side surface of said inner side surface of said molded base, wherein an inner surface of said step portion forms said third portion of said inner side surface of said inner side surface of said molded base, wherein a top surface forms said top side surface of said molded base, wherein said third portion of said inner side surface of said molded base and said optical axis direction of said camera module define a third inclination angle $\beta$ therebetween, wherein a range of said third inclination angle $\beta$ is 3° to 30, wherein said second portion of said inner side surface and said third portion of said inner side surface form said top groove and said optical filter is mounted on said second portion of said inner side surface in position while surrounding by said third portion of said inner side surface.

18. The manufacturing method, as recited in claim 17, wherein said range of said first inclination angle $\alpha$ is selected from the angular group consisting of 10° to 30°, 30° to 45°, 45° to 55° and 55° to 80°, said range of said second inclination angle $\gamma$ is selected from the angular group consisting of 3° to 15°, 15° to 30° and 30° to 45°, and said range of said third inclination angle $\beta$ is selected from the angular group consisting of 3° to 15°, 15° to 20° and 20° to 30°.

19. The manufacturing method, as recited in claim 18, wherein said circuit board comprises a base board, wherein at an outer side of at least one outer peripheral surface of said outer side surface of said molded base, said base board of said circuit board has a press-fit distance W which is adapted to press-fit for at least one dividing block of a molding mould in said molding process, wherein a numerical value range of said press-fit distance W is 0.1 to 0.6 mm.

20. The manufacturing method, as recited in claim 16, wherein said range of said first inclination angle $\alpha$ is selected from the angular group consisting of 10° to 30°, 30° to 45°, 45° to 55° and 55° to 80° and said range of said second inclination angle $\gamma$ is selected from the angular group consisting of 3° to 15°, 15° to 30° and 30° to 45.

* * * * *